(12) United States Patent
Matsushita et al.

(10) Patent No.: US 9,609,747 B2
(45) Date of Patent: Mar. 28, 2017

(54) WIRING BOARD

(71) Applicant: FUJIFILM Corporation, Tokyo (JP)

(72) Inventors: Yasuaki Matsushita, Ashigara-kami-gun (JP); Tokihiko Matsumura, Ashigara-kami-gun (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 14/661,665

(22) Filed: Mar. 18, 2015

(65) Prior Publication Data

US 2015/0195908 A1 Jul. 9, 2015

Related U.S. Application Data

(63) Continuation of application No. PCT/JP2013/072265, filed on Aug. 21, 2013.

(30) Foreign Application Priority Data

Sep. 19, 2012 (JP) .................................. 2012-206271
Mar. 29, 2013 (JP) .................................. 2013-073980

(51) Int. Cl.
*H05K 1/03* (2006.01)
*H05K 3/24* (2006.01)
*H05K 1/09* (2006.01)

(52) U.S. Cl.
CPC ............ *H05K 1/0353* (2013.01); *H05K 1/092* (2013.01); *H05K 3/247* (2013.01); *H05K 2201/0769* (2013.01)

(58) Field of Classification Search
USPC ........................................................ 174/251
See application file for complete search history.

(56) References Cited

U.S. PATENT DOCUMENTS 5,846,598 A * 12/1998 Semkow .................. C23C 18/36
257/E21.174
7,355,128 B2 * 4/2008 Oda ........................ H05K 1/117
174/261

(Continued)

FOREIGN PATENT DOCUMENTS

JP H5-331355 A 12/1993
JP 2009-188360 A 8/2009

(Continued)

OTHER PUBLICATIONS

International Search Report; PCT/JP2013/072265; Nov. 26, 2013.

(Continued)

*Primary Examiner* — Timothy Thompson
*Assistant Examiner* — Krystal Robinson
(74) *Attorney, Agent, or Firm* — Studebaker & Brackett PC

(57) ABSTRACT

A wiring board includes: an insulating substrate; and a wiring layer including a first metal layer disposed on the insulating substrate and a second metal layer disposed so as to cover a surface of the first metal layer, the surface not being in contact with the insulating substrate, wherein the thickness of the second metal layer is 1/10 of the total thickness of the wiring layer, the wiring layer contains a migration inhibitor, and the mass Y of the migration inhibitor contained in the second metal layer is greater than the mass X of the migration inhibitor contained in the first metal layer.

15 Claims, 3 Drawing Sheets

(56) References Cited

U.S. PATENT DOCUMENTS

2011/0076522 A1* 3/2011 Hanazono ............ H01M 8/006
                                                    429/7
2012/0184071 A1* 7/2012 Kon ................. H01L 21/02118
                                                    438/127

FOREIGN PATENT DOCUMENTS

| JP | 2009188360 A | * | 8/2009 |
| JP | 2010-087148 A |   | 4/2010 |
| JP | 2010087148 A | * | 4/2010 |
| JP | 2012-099236 A |   | 5/2012 |

OTHER PUBLICATIONS

An Office Action issued by the Korean Patent Office on Feb. 22, 2016, which corresponds to Korean Patent Application No. 10-2015-7006871 and is related to U.S. Appl. No. 14/661,665; with partial English language translation.

Notification of Transmittal of Translation of the International Preliminary Report on Patentability and Translation of Written Opinion of the International Searching Authority; PCT/JP2013/072265; issued on Apr. 2, 2015.

An Office Action; "Notification of Reasons for Refusal," issued by the Japanese Patent Office on Jun. 2, 2015, which corresponds to Japanese Patent Application No. 2013-073980 and is related to U.S. Appl. No. 14/661,665; with English language partial translation.

An Office Action; "Notification of Reasons for Refusal," issued by the Japanese Patent Office on Oct. 6, 2015, which corresponds to Japanese Patent Application No. 2013-073980 and is related to U.S. Appl. No. 14/661,665; with English language partial translation.

An Office Action issued by the Taiwanese Patent Office on Nov. 3, 2016, which corresponds to Taiwanese Patent Application No. 102130955 and is related to U.S. Appl. No. 14/661,665; with partial English language translation.

The First Office Action issued by the Chinese Patent Office on Nov. 30, 2016, which corresponds to Chinese Patent Application No. 201380048687.X and is related to U.S. Appl. No. 14/661,665; with English language translation.

* cited by examiner

WIRING BOARD

CROSS-REFERENCE TO RELATED APPLICATIONS

This application is a Continuation of PCT International Application No. PCT/JP2013/072265 filed on Aug. 21, 2013, which claims priority under 35 U.S.C. §119(a) to Japanese Application No. 2012-206271 filed on Sep. 19, 2012 and Japanese Application No. 2013-073980 filed on Mar. 29, 2013. Each of the above application(s) is hereby expressly incorporated by reference, in its entirety, into the present application.

BACKGROUND OF THE INVENTION

The present invention relates to a wiring board. Particularly, the present invention relates to a wiring board having a wiring layer which contains a migration inhibitor and in which the migration inhibitor is unevenly distributed such that a large amount thereof is distributed in the vicinity of the exposed surface of the wiring layer.

Conventionally, a wiring board in which metal wiring is disposed on the surface of an insulating substrate has been widely used in electronic members, semiconductor devices, and the like. As the metal constituting the metal wiring, silver and copper having high conductivity are generally used, but these metals have a problem in that ion migration easily occurs.

As a method of preventing the ion migration of the metals, a method of introducing a specific migration inhibitor into the metal wiring has been proposed (JP 2012-99236 A).

SUMMARY OF THE INVENTION

In recent years, with the miniaturization of semiconductor integrated circuits and chip components, the microfabrication of metal wiring has progressed. Therefore, the width and the space of the metal wiring in a wiring board have become narrow, and the disconnection or continuity of a circuit due to ion migration has occurred more easily. Under such circumstances, it is required to further improve the insulation reliability between the metal wiring in the wiring board.

In addition, from the view point of improving the performance of various circuits and components, it is also required to further improve the conductive characteristics of the metal wiring.

In the case of fabricating metal wiring using a composition containing the specific migration inhibitor as disclosed in JP 2012-99236 A, when a large amount of migration inhibitor is contained in the metal wiring so as to uniformly disperse the migration inhibitor in thin metal wires and improve the insulation reliability between the metal wiring, a large number of domains of the migration inhibitor is formed in the metal wiring, and, as a result, the conductive characteristics of the metal wiring deteriorate.

In contrast, when the content of the migration inhibitor in the metal wiring is decreased in consideration of the conductive characteristics of the metal wiring, the conductive characteristics of the metal wiring is improved, but the insulation reliability between the metal wiring is deteriorated.

As such, in the prior art, the conductive characteristics of a wiring layer and ion migration inhibiting function of the wiring layer (in other words, insulation reliability between wiring layers) are in the relationship of trade-off in many cases, and thus technologies for achieving both at higher levels have been required.

In view of the above circumstances, an object of the present invention is to provide a wiring board including a wiring layer which is excellent in conductive characteristics and an ion migration inhibiting function.

The present inventors carried out extensive studies. As a result, they have found that the above problems can be solved by controlling the distribution of migration inhibitor in the wiring layer.

That is, the present inventors have found that the above problems can be solved by the following configurations.

(1) A wiring board, comprising:
an insulating substrate; and
a wiring layer including a first metal layer disposed on the insulating substrate and a second metal layer disposed so as to cover a surface of the first metal layer, the surface not being in contact with the insulating substrate,
wherein the thickness of the second metal layer is $\frac{1}{10}$ of the total thickness of the wiring layer,
the wiring layer contains a migration inhibitor, and
the mass Y of the migration inhibitor contained in the second metal layer is greater than the mass X of the migration inhibitor contained in the first metal layer.

(2) The wiring board according to (1), wherein the migration inhibitor contains at least one selected from the group consisting of compounds represented by General Formulae (1A) to (3A) described later, compounds represented by General Formulae (6A) to (8A) described later, a bismuth compound, a zirconium compound, a magnesium compound, an antimony oxide, compounds represented by General Formulae (1) to (5) described later, a compound represented by General Formula (22) described later, a compound represented by General Formula (23) described later, and a compound having a group represented by General Formula (24) described later and a group represented by General Formula (25) described later.

(3) The wiring board according to (2), wherein the compound represented by the General Formula (1) is at least one selected from the group consisting of compounds represented by General Formulae (6) to (21) described later:

(4) The wiring board according to any one of (1) to (3), wherein the metal in the wiring layer is selected from the group consisting of gold, silver, copper, and aluminum.

(5) The wiring board according to any one of (1) to (4), wherein a first thin wire-shaped metal layer of which side faces are exposed is disposed on the insulating substrate, and a second metal layer is disposed so as to cover a surface of the first thin wire-shaped metal layer, the surface not being in contact with the insulating substrate and including the side faces.

(6) A wiring board with insulating layer, comprising:
the wiring board according to any one of (1) to (5); and
an insulating layer disposed on the wiring layer of the wiring board.

(7) The wiring board according to any one of (1) to (5), wherein the wiring board is used in a printed wiring board.

According to the present invention, it is possible to provide a wiring board including a wiring layer which is excellent in conductive characteristics and an ion migration inhibiting function.

DETAILED DESCRIPTION OF THE INVENTION

Hereinafter, preferred embodiments of the wiring board of the present invention will be described.

First, characteristic points of the present invention, compared to those of the prior art, will be described in detail.

In the present invention, a migration inhibitor is unevenly distributed such that a larger amount of migration inhibitor is distributed in the vicinity of the exposed surface (surface not in contact with an insulating substrate) of a wiring layer, thereby enabling both the conductive characteristics and ion migration inhibiting function of the wiring layer, which are generally in the relationship of trade-off, to be achieved at higher levels. More specifically, by distributing a large amount of migration inhibitor in the vicinity of the exposed surface of the wiring layer, it is possible to efficiently suppress the diffusion of metal ions which are deposited on the outside of the exposed surface from the vicinity of the exposed surface. In addition, by distributing a large amount of migration inhibitor in the vicinity of the outer surface of the wiring layer, it is possible to reduce the content of impurities other than metals in the wiring layer, and as a result, it is possible to form conduction paths in the wiring layer and to achieve excellent conductive characteristics.

Next, a first embodiment of the wiring board of the present invention will be described in detail with reference to the accompanying drawing.

Figure 1:
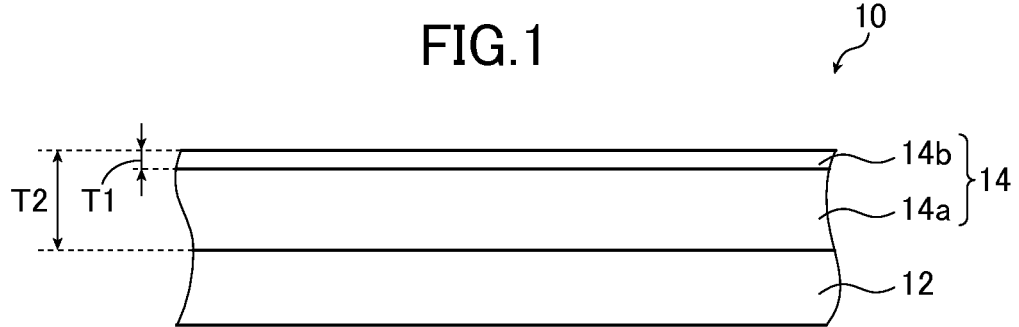
FIG. 1 is a schematic cross-sectional view showing a first embodiment of the wiring board of the present invention.

FIG. 1 is a schematic cross-sectional view showing the first embodiment of the wiring board. A wiring board 10 includes an insulating substrate 12 and a wiring layer 14 disposed over the entire surface of the insulating substrate 12. The wiring layer 14 has a first metal layer 14a and a second metal layer 14b.

Hereinafter, each of the members (insulating substrate 12 and wiring layer 14) will be described in detail.

[Insulating Substrate]

The kind of the insulating substrate 12 is not particularly limited as long as the insulating substrate 12 has insulating properties and can support a wiring layer. For example, an organic substrate, a ceramic substrate, a glass substrate, or the like can be used as the insulating substrate 12.

In addition, the insulating substrate 12 may have a laminated structure composed of at least two substrates selected from the group consisting of an organic substrate, a ceramic substrate, and a glass substrate.

As the raw material of the organic substrate, resins are exemplified. For example, a thermosetting resin, a thermoplastic resin, or a mixture thereof is preferably used. Examples of the thermosetting resin include a phenolic resin, a urea resin, a melamine resin, an alkyd resin, an acrylic resin, an unsaturated polyester resin, a diallyl phthalate resin, an epoxy resin, a silicone resin, a furan resin, a ketone resin, a xylene resin, a benzocyclobutene resin, and the like. Examples of the thermoplastic resin include a polyimide resin, a polyphenylene oxide resin, a polyphenylene sulfide resin, an aramid resin, a liquid crystal polymer, and the like.

In addition, as the raw material of the organic substrate, a glass woven fabric, a glass non-woven fabric, an aramid woven fabric, an aramid non-woven fabric, an aromatic polyamide woven fabric, a material in which each of these fabrics is impregnated with each of the above-mentioned resins, or the like can also be used.

[Wiring Layer]

The wiring layer 14 is a layer disposed on the insulating substrate 12, and serves as a conductor portion.

The wiring layer 14 (in other words, the first metal layer 14a or the second metal layer 14b) is mainly formed of a metal. The kind of the metal is not particularly limited, and an optimal metal is suitably selected depending on the intended use. Among metals, from the viewpoint of function as wiring, silver, copper, gold, aluminum, nickel, alloys of these, and the like are exemplified.

In FIG. 1, the wiring layer 14 includes the first metal layer 14a and the second metal layer 14b disposed on the first metal layer 14a. The second metal layer 14b covers the surface of the first metal layer 14a which is not in contact with the insulating substrate 12.

The thickness T1 of the second metal layer 14b corresponds to $1/10$ of the total thickness T2 of the wiring layer 14. In other words, the second metal layer 14b in the wiring layer 14 corresponds to the region from the exposed surface of the wiring layer 14 to a depth position corresponding to $1/10$ of the total thickness of the wiring layer 14.

In the method of defining the portion of the second metal layer 14b in the wiring layer 14, the vertical section of the wiring layer 14 in the direction perpendicular to the surface of the insulating substrate 12 is observed by an electron microscope (SEM or TEM), and the region from the outer surface of the wiring layer 14 (surface not in contact with the insulating substrate 12) to a depth position corresponding to $1/10$ of the total thickness of the wiring layer 14 is defined as the second metal layer 14b.

Here, the total thickness of the wiring layer 14 is obtained by measuring the total thicknesses of the wiring layer 14 at five or more arbitrary points and calculating an arithmetic mean of the measured total thicknesses.

The wiring layer 14 contains the migration inhibitor to be described later. Here, the mass Y of the migration inhibitor contained in the second metal layer 14b is greater than the mass X of the migration inhibitor contained in the first metal layer 14a. That is, the relationship of mass Y>mass X (relationship of mass X/mass Y of less than 1) is satisfied. If the above relationship is satisfied, the ion migration from the wiring layer 14 is suppressed, and in addition, the conductive characteristics of the wiring layer 14 are also excellent. In terms of balance between the ion migration inhibiting function and the conductive characteristics being more excellent, the ratio (X/Y) of the mass X of the migration inhibitor contained in the first metal layer 14a to the mass Y of the migration inhibitor contained in the second metal layer 14b is preferably less than 0.30, more preferably equal to or less than 0.25, and still more preferably equal to or less than 0.20. When the fluorine atom-containing migration inhibitor to be described later is used, the ratio (X/Y) is most preferably equal to or less than 0.1.

The lower limit of the ratio (X/Y) is not particularly limited, but it is most preferably 0 and practically, may be equal to or greater than 0.001.

The method of measuring the ratio (X/Y) is not particularly limited. For example, the vertical section of the wiring layer 14 in the direction perpendicular to the surface of the insulating substrate 12 is observed by an electron microscope (SEM or TEM), the element analysis of the components contained in the region corresponding to the first metal layer 14a and the region corresponding to the second metal layer 14b is performed, and the amounts of elements derived from the migration inhibitor are compared, thereby determining the ratio (X/Y).

The kind of the migration inhibitor to be used will be described in detail later.

The content of the migration inhibitor contained in the entire wiring layer 14 is not particularly limited, but from the viewpoint of the conductive characteristics of the wiring layer 14, it is preferably 0.01 mass % to 10 mass %, and more preferably 0.1 mass % to 5 mass %, based on the total mass of the wiring layer 14.

The content of the migration inhibitor contained in the second metal layer 14b is not particularly limited as long as the above ratio (X/Y) is satisfied, but from the viewpoint of the conductive characteristics of the wiring layer 14, it is preferably 0.1 mass % to 10 mass %, and more preferably 0.3 mass % to 5.0 mass %, based on the total mass of the wiring layer 14.

The thickness T2 of the wiring layer 14 is preferably 0.001 µm to 100 µm, more preferably 0.01 µm to 30 µm, and still more preferably 0.01 µm to 20 µm, from the view point of the high integration of the wiring board.

The wiring layer 14 may contain components other than the metal and the migration inhibitor within a range that does not impair the effects of the present invention. For example, the wiring layer 14 may contain a binder resin (epoxy resin, acrylic resin, polyvinyl pyrrolidone, or the like).

The method of forming the wiring layer 14 is not particularly limited, but as will be described in detail later, a method of forming the wiring layer 14 using a composition (conductive paste) containing metal particles and/or a migration inhibitor is preferable.

In FIG. 1, the wiring layer 14 is only provided on one surface of the insulating substrate 12, but the wiring layer 14 may be provided on both surfaces of the insulating substrate 12. In other words, the wiring board 10 may be a single-sided substrate or a double-sided substrate. In the case where the wiring layers 14 are provided on both surfaces of the insulating layer 12, a through-hole may be provided in the insulating substrate 12 and the through-hole may be filled with a metal (for example, silver or a silver alloy) so that the wiring layers 14 provided on both surfaces of the insulating substrate 12 are conducted to each other.

(Migration Inhibitor)

The migration inhibitor (anti-migration agent) is a compound that inhibits the migration of metal ions deposited from the wiring layer 14, and is contained in the above-mentioned wiring layer 14.

The kind of the migration inhibitor is not particularly limited, and compounds known as migration inhibitors can be used in the present invention. Among them, in terms of the effects of the present invention being more excellent, an inorganic ion adsorbent, an organic antioxidant, an organic ion adsorbent, or the like is preferable. Hereinafter, each of the compounds will be described in detail.

The inorganic ion adsorbent refers to an inorganic compound which can adsorb metal ions. Preferable examples of the inorganic ion adsorbent include a bismuth compound, a zirconium compound, an antimony oxide compound, a magnesium compound, and the like.

Examples of the bismuth compound include bismuth oxide, bismuth titanate, bismuth nitrate, bismuth salicylate, bismuth carbonate, and the like. Among these, bismuth oxide is particularly preferable.

Examples of the zirconium compound include zirconium phosphate, zirconium tungstate, zirconium molybdate, zirconium selenate, zirconium tellurate, and the like. Among these, zirconium phosphate is particularly preferable.

Examples of the antimony oxide compound include antimony pentoxide, antimony trioxide, phosphorus antimonic acid, zirconium antimonate, titanium antimonate, and the like. Among these, antimony pentoxide is particularly preferable.

Examples of the magnesium compound include magnesium phosphate, magnesium carbonate, magnesium oxide, and the like.

As the inorganic ion adsorbent, two kinds of compounds may be used in combination. Among the combinations, a combination of a bismuth compound and at least one of a zirconium compound and an antimony oxide compound is preferable.

The mass ratio (A:B) of the bismuth compound (A) and at least one (B) of the zirconium compound and the antimony oxide compound is preferably 1:0.2 to 1:5, and more preferably 1:0.5 to 1:2.

The organic antioxidant refers to an organic compound which can prevent the oxidation of metal. The kind of the organic antioxidant is not particularly limited, but the organic antioxidant is preferably an organic compound having an oxidation-reduction potential of 0.5 V to 2.0 V (preferably 0.6 V to 1.5 V).

As a preferred embodiment of the organic antioxidant, at least one compound selected from the group consisting of compounds represented by General Formula (1A), General Formula (2A), and General Formula (3A) is exemplified.

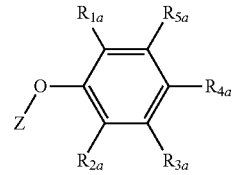

General Formula (1A)

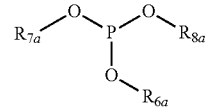

General Formula (2A)

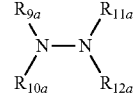

General Formula (3A)

In the General Formula (1A), each of $R_{1a}$ to $R_{5a}$ independently represents a hydrogen atom, a hydroxyl group, an aliphatic hydrocarbon group which may have an oxygen atom, an aromatic hydrocarbon group which may have an oxygen atom, or a group composed of any combination of these. Among them, in terms of ion migration inhibiting function being more excellent, a hydrogen atom, an alkyl group, an alkoxy group, an aryloxy group, and a group composed of any combination of these are preferable.

The number of carbon atoms contained in the aliphatic hydrocarbon group, the aromatic hydrocarbon group, or the group composed of the combination thereof is not particularly limited, but is preferably 1 to 40, and more preferably 4 to 20, in terms of ion migration inhibiting function being more excellent.

In the General Formula (1A), Z represents a hydrogen atom, an acyl group, or an $R_ZOC(=O)$ group. $R_Z$ represents an aliphatic hydrocarbon group or an aromatic hydrocarbon group. Among them, in terms of ion migration inhibiting function being more excellent, Z is preferably a hydrogen atom.

The number of carbon atoms contained in the acyl group or the $R_ZOC(=O)$ group is not particularly limited, but is preferably 2 to 12, and more preferably 2 to 8, in terms of ion migration inhibiting function being more excellent.

Further, in the General Formula (1A), the total number of carbon atoms contained in all the groups of $R_{1a}$ to $R_{5a}$ is 4 or more. In other words, at least one of $R_{1a}$ to $R_{5a}$ is a group containing carbon atoms (the above-mentioned aliphatic hydrocarbon group, aromatic hydrocarbon group, or the group composed of the combination thereof).

When the total number of carbon atoms is within the above range, the ion migration of metal is further suppressed, and thus the insulation reliability between the wiring layers is further improved. In addition, in terms of the effect being more excellent, the total number thereof is preferably 8 or more, and more preferably 10 or more. The upper limit of the total number thereof is not particularly limited, but, in terms of synthesis being easier and dispersibility in the wiring layer being more excellent, the total number thereof is preferably 50 or less, and more preferably 40 or less.

Moreover, in the compound, when only one of $R_{1a}$ to $R_{5a}$ is a group containing carbon atoms (for example, the aliphatic hydrocarbon group, the aromatic hydrocarbon group, or the like), the number of carbon atoms in the group may be 4 or more.

Furthermore, in the compound, when two or more of $R_{1a}$ to $R_{5a}$ are groups containing carbon atoms (for example, an alkyl group, an alkoxy group, and the like), the total number of carbon atoms contained in all the groups may be 4 or more. For example, when $R_{1a}$ and $R_{2a}$ are alkyl groups and $R_{1a}$ to $R_{5a}$ are hydrogen atoms, the sum of the number of carbon atoms contained in the alkyl group $R_{1a}$ and the number of carbon atoms contained in the alkyl group $R_{2a}$ may be 4 or more.

In addition, $R_{1a}$ to $R_{5a}$ may be bonded to each other to form a ring. The kind of the formed ring is not particularly limited, but, for example, a 5- to 6-membered ring structure can be exemplified.

If necessary, $R_{1a}$ to $R_{5a}$ may further contain a known substituent. Examples of the substituent include a halogen atom, an alkyl group, an alkenyl group, an aryl group, a cyano group, a hydroxyl group, a nitro group, a carboxyl group, an alkoxy group, an aryloxy group, a silyloxy group, a heterocycloxy group, an acyloxy group, a carbamoyloxy group, an alkoxycarbonyloxy group, an aryloxycarbonyloxy group, an amino group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, and a silyl group.

In the General Formula (2A), each of $R_{6a}$ to $R_{8a}$ independently represents an aliphatic hydrocarbon group, an aromatic hydrocarbon group, or a group composed of the combination thereof.

The number of carbon atoms contained in the aliphatic hydrocarbon group, the aromatic hydrocarbon group, or the group composed of the combination thereof is not particularly limited, but is preferably 1 to 40, and more preferably 2 to 20, in terms of ion migration inhibiting function being more excellent.

In the General Formula (2A), the total number of carbon atoms contained in all the groups of $R_{6a}$ to $R_{8a}$ is 6 or more. When the total number of carbon atoms is within the above range, the ion migration of metal is further suppressed. In terms of the effect being more excellent, the total number thereof is preferably 8 or more, and more preferably 10 or more. The upper limit of the total number thereof is not particularly limited, but, in terms of synthesis being easier and dispersibility in the wiring layer being more excellent, the total number thereof is preferably 50 or less, and more preferably 40 or less.

Here, in the total number of carbon atoms, for example, when all of $R_{6a}$ to $R_{8a}$ are alkyl groups, the sum of the number of carbon atoms contained in the alkyl group $R_{6a}$, the number of carbon atoms contained in the alkyl group $R_{7a}$, and the number of carbon atoms contained in the alkyl group $R_{8a}$ may be 6 or more.

If necessary, $R_{6a}$ to $R_{8a}$ may further contain a known substituent. Examples of the substituent are synonymous with the substituents used in the aforementioned $R_{1a}$ to $R_{5a}$.

Moreover, $R_{6a}$ to $R_{8a}$ may be bonded to each other to form a ring.

In the General Formula (3A), each of $R_{9a}$ to $R_{12a}$ independently represents an alkyl group which may contain a hetero atom, an aryl group which may contain a hetero atom, or a group composed of the combination thereof.

The number of carbon atoms contained in the alkyl group or the aryl group is not particularly limited, but is preferably 1 to 40, and more preferably 2 to 20, in terms of ion migration inhibiting function being more excellent.

In addition, the alkyl group or the aryl group may contain a hetero atom. The kind of the hetero atom to be contained is not particularly limited, but examples thereof include a halogen atom, an oxygen atom, a nitrogen atom, a sulfur atom, a selenium atom, a tellurium atom, and the like. Among them, in terms of ion migration inhibiting function being excellent, the alkyl group or the aryl group preferably contains the hetero atom in the form of $-X_1-$, $-N(R_a)-$, $-C(=X_2)-$, $-CON(R_b)-$, $-C(=X_3)X_4-$, $-SO_n-$, $-SO_2N(R_c)-$, a halogen atom, or a group composed of any combination of these.

Here, each of $X_1$ to $X_4$ is independently selected from the group consisting of an oxygen atom, a sulfur atom, a selenium atom, and a tellurium atom. Among them, an oxygen atom and a sulfur atom are preferable in terms of handling being more convenient.

Each of $R_a$, $R_b$, and $R_c$ is independently selected from a hydrogen atom and hydrocarbon groups having 1 to 20 carbon atoms.

n represents an integer of 1 to 3.

In the General Formula (3A), the total number of carbon atoms contained in all the groups of $R_{9a}$ to $R_{12a}$ is 6 or more. When the total number of carbon atoms is within the above range, the ion migration of metal is further suppressed. In terms of the effect being more excellent, the total number thereof is preferably 8 or more, and more preferably 10 or more. The upper limit of the total number thereof is not particularly limited, but, in terms of synthesis being easier and dispersibility in the wiring layer being more excellent, the total number thereof is preferably 50 or less, and more preferably 40 or less.

Here, in the total number of carbon atoms, for example, when all of $R_{9a}$ to $R_{12a}$ are alkyl groups, the sum of the number of carbon atoms contained in the alkyl group $R_{9a}$, the number of carbon atoms contained in the alkyl group $R_{10a}$, the number of carbon atoms contained in the alkyl group $R_{11a}$, and the number of carbon atoms contained in the alkyl group $R_{12a}$ may be 6 or more.

Moreover, $R_{9a}$ to $R_{12a}$ may be bonded to each other to form a ring.

(Preferred Embodiments)

Among the above-mentioned compounds represented by the General Formulae (1A) to (3A), in terms of ion migration inhibiting function being more excellent, a compound represented by General Formulae (4A), (5A) or (10A) is preferably exemplified.

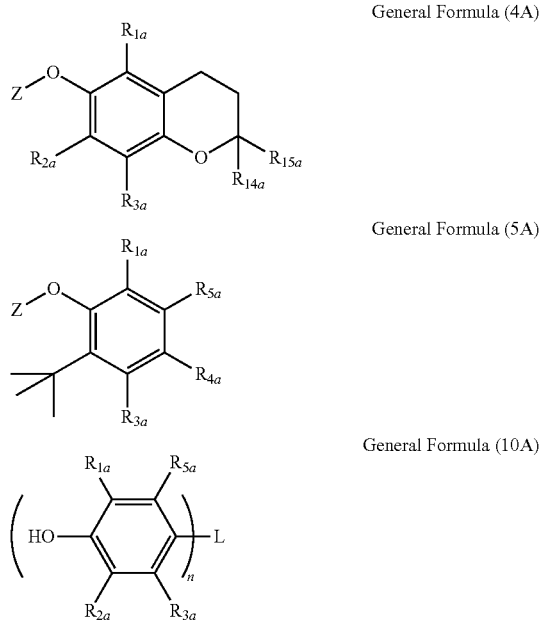

General Formula (4A)

General Formula (5A)

General Formula (10A)

In the General Formula (4A), the definition of each of Z, $R_{1a}$, $R_{2a}$, and $R_{3a}$ is the same as the definition of each group in the General Formula (1A).

In the General Formula (4A), each of $R_{14a}$ and $R_{15a}$ independently represents a hydrogen atom, a hydroxyl group, an aliphatic hydrocarbon group which may contain an oxygen atom, or an aromatic hydrocarbon group which may contain an oxygen atom. Among them, in terms of ion migration inhibiting function being more excellent, $R_{14a}$ and $R_{15a}$ are preferably an alkyl group containing tertiary carbon atoms or quaternary carbon atoms.

The number of carbon atoms contained in the aliphatic hydrocarbon group or the aromatic hydrocarbon group is not particularly limited, but is preferably 1 to 40, and more preferably 2 to 20. In particular, it is preferable that $R_{14a}$ is an alkyl group having 1 to 5 carbon atoms, and $R_{15a}$ is an alkyl group having 10 to 20 carbon atoms.

The number of carbon atoms contained in at least one of $R_{1a}$, $R_{2a}$, $R_{14a}$ and $R_{15a}$ is preferably 1 to 40. When the number of carbon atoms thereof is within the above range, the dispersibility in the wiring layer is improved, and thus, the ion migration inhibiting function is improved. Among them, the number of carbon atoms thereof is preferably 8 to 40, and more preferably 10 to 30.

In addition, the total number of carbon atoms contained in all the groups of $R_{1a}$, $R_{2a}$, $R_{14a}$, and $R_{15a}$ is preferably 4 or more. When the total number of carbon atoms is within the above range, the ion migration of metal is further suppressed. In terms of the effect being more excellent, the total number thereof is preferably 8 or more, and more preferably 10 or more. The upper limit of the total number thereof is not particularly limited, but, in terms of synthesis being easier and dispersibility in the wiring layer being more excellent, the total number thereof is preferably 50 or less, and more preferably 40 or less.

In the General Formula (5A), the definition of each of Z, $R_{1a}$, $R_{3a}$, $R_{4a}$, and $R_{5a}$ is the same as the definition of each group in the General Formula (1A).

In the General Formula (10A), the definition of each of Z, $R_{1a}$, $R_{2a}$, $R_{3a}$ and $R_{5a}$ is the same as the definition of each group in the General Formula (1A).

L represents a divalent or trivalent aliphatic hydrocarbon group which may have an oxygen atom, a divalent or trivalent aromatic hydrocarbon group which may have an oxygen atom, —S—, or a group composed of any combination of these.

The number of carbon atoms contained in the aliphatic hydrocarbon group or the aromatic hydrocarbon group is not particularly limited. However, the number of carbon atoms contained in the aliphatic hydrocarbon group is preferably 1 to 40 and more preferably 2 to 20, and the number of carbon atoms contained in the aromatic hydrocarbon group is preferably 6 to 40 and more preferably 6 to 20.

In addition, the aliphatic hydrocarbon group may be a linear, branched, or cyclic aliphatic hydrocarbon group. n is an integer of 2 or 3.

The organic ion adsorbent refers to an organic compound which can adsorb metal ions, and the structure thereof is not particularly limited. Organic compounds known as organic ion adsorbents can be used in the present invention. Among them, a compound (hereinafter, referred to as a SH group-containing compound), which has a structure (hereinafter, referred to as a heterocyclic structure) selected from the group consisting of a tetrazole structure, a triazole structure, a thiadiazole structure, and a benzimidazole structure, a mercapto group, and one or more of hydrocarbon groups that may have a hetero atom, and in which the total number of carbon atoms in the hydrocarbon group (in the case of a plurality of hydrocarbon groups, the sum of the numbers of carbon atoms in each of the hydrocarbon groups) is 5 or more, is preferable.

The SH group-containing compound has a structure selected from the group consisting of a tetrazole structure, a triazole structure, a thiadiazole structure, and a benzimidazole structure. Among these structures, in terms of ion migration inhibiting function being more excellent, a triazole structure and a thiadiazole structure are preferable.

More specific examples of the respective structures can be represented by the following General Formulae (X) to (W), respectively.

General Formula (X)

General Formula (Y)

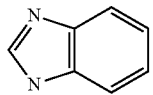

General Formula (Z)

General Formula (W)

The SH group-containing compound contains a mercapto group (HS—). The mercapto group is highly reactive to form a covalent bond with a metal. The mercapto group is bonded to the above heterocyclic structure such as a triazole structure or the like.

The amount of the mercapto group in the SH group-containing compound is not particularly limited, but the ratio of the total atomic weight of the mercapto group to the total molecular weight of the compound is preferably 50% or less, and particularly preferably 40% or less.

In addition, the SH group-containing compound may contain only one mercapto group or a plurality of mercapto groups.

The SH group-containing compound has at least one hydrocarbon group which may contain a hetero atom (hereinafter, simply referred to as a hydrocarbon group), and the total number of carbon atoms in the hydrocarbon group (in the case of a plurality of hydrocarbon groups, the sum of the numbers of carbon atoms in each of the hydrocarbon groups) is 5 or more. By containing the hydrocarbon group in the SH group-containing compound, the effect of suppressing metal ion migration thereof is further enhanced.

The hydrocarbon group is a group containing a carbon atom and a hydrogen atom. The hydrocarbon group is generally bonded to the above heterocyclic structure such as a triazole structure or the like. As the hydrocarbon group, more specifically, an aliphatic hydrocarbon group, an aromatic hydrocarbon group, or a group composed of the combination thereof is exemplified.

The number of carbon atoms in each hydrocarbon group is not particularly limited as long as the total number of carbon atoms, to be described later, is 5 or more. However, in terms of ion migration inhibiting function being more excellent, the number of carbon atoms is preferably 4 or more, more preferably 6 or more, and particularly preferably 8 or more. The upper limit thereof is not particularly limited, but, in terms of ion migration inhibiting function being more excellent, the number of carbon atoms is preferably 30 or less, and more preferably 24 or less.

The number of carbon atoms in the aliphatic hydrocarbon group is preferably 4 or more, and more preferably 6 or more. The upper limit thereof is not particularly limited, but, in terms of ion migration inhibiting function being more excellent, the number of carbon atoms is preferably 40 or less. The aliphatic hydrocarbon group may be a linear, branched, or cyclic aliphatic hydrocarbon group. In terms of dispersibility of the compound in the wiring layer being more excellent, the number of carbon atoms in the linear aliphatic hydrocarbon group is preferably 18 or less. Alternatively, the aliphatic hydrocarbon group is preferably a branched aliphatic hydrocarbon group containing tertiary or quaternary carbon atoms.

Preferably, the aromatic hydrocarbon group is an aromatic hydrocarbon group having 6 or more carbon atoms, and, more preferably, the aromatic hydrocarbon group is an aromatic hydrocarbon group having two or more substituents.

The total number of carbon atoms in all of the hydrocarbon groups bonded to the above heterocyclic structure is 5 or more. When the total number of carbon atoms is within the above range, ion migration is further suppressed. In terms of the effect being more excellent, the total number of carbon atoms is preferably 6 or more, and more preferably 8 or more. The upper limit thereof is not particularly limited, but, in terms of synthesis being easier and dispersibility in the wiring layer being more excellent, the total number of carbon atoms is preferably 36 or less, and more preferably 24 or less.

When the number of hydrocarbon groups in the compound is 1, the number of carbon atoms in the hydrocarbon group may be 5 or more.

When a plurality of hydrocarbon groups are contained in the compound, the sum of the numbers of carbon atoms contained in all of the hydrocarbon groups may be 5 or more. More specifically, when two hydrocarbon groups (hydrocarbon group A and hydrocarbon group B) are contained in the compound, the sum of the number of carbon atoms in the hydrocarbon group A and the number of carbon atoms in the hydrocarbon group B may be 5 or more.

Meanwhile, the total number of carbon atoms can also be represented by the following General Formula (A).

That is, in the compound, the total number $Tc$ of carbon atoms, represented by the General Formula (A), may be 5 or more.

$$Tc = \sum_{i=1}^{n} Ci \qquad \text{General Formula (A)}$$

In the General Formula (A), $Ci$ represents the number of carbon atoms in i-th hydrocarbon group contained in the compound. i represents an integer of 1 to n.

The hydrocarbon group may contain a hetero atom. The kind of hetero atom to be contained is not particularly limited, but examples thereof include a halogen atom, an oxygen atom, a nitrogen atom, a sulfur atom, a selenium atom, a tellurium atom, and the like. Among them, in terms of ion migration inhibiting function being excellent, the hydrocarbon group preferably contains the hetero atom in the form of —$X_1$—, —$N(R_a)$—, —$C(=X_2)$—, —CON($R_b$)—, —$C(=X_3)X_4$—, —$SO_n$—, —$SO_2N(R_c)$—, a halogen atom, or a group composed of the combination of these.

Each of $X_1$ to $X_4$ is independently selected from the group consisting of an oxygen atom, a sulfur atom, a selenium atom, and a tellurium atom. Among them, an oxygen atom and a sulfur atom are preferable in terms of handling being more convenient.

Each of $R_a$, $R_b$, and $R_c$ is independently selected from a hydrogen atom or hydrocarbon groups having 1 to 20 carbon atoms.

n represents an integer of 1 to 3.

When a hetero atom is contained in the hydrocarbon group, it may be contained in the form of a mercapto group (—SH).

The molecular weight of the SH group-containing compound is not particularly limited, but, in terms of dispersibility in the wiring layer being more excellent, the molecular weight thereof is preferably 50 to 1000, and more preferably 100 to 600.

(Preferred Embodiments)

Preferred embodiments of the SH group-containing compound include compounds represented by the following General Formulae (6A) to (8A). These compounds are more excellent in an ion migration inhibiting function. In particular, in terms of the effect of the present invention being more excellent, the compound represented by the General Formula (6A) or (7A) is preferable.

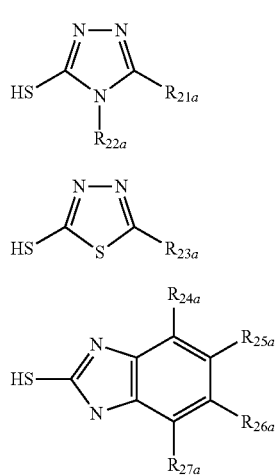

General Formula (6A)

General Formula (7A)

General Formula (8A)

In the General Formula (6A), each of $R_{21a}$ and $R_{22a}$ independently represents a hydrogen atom or a hydrocarbon group which may contain a hetero atom, at least one of $R_{21a}$ and $R_{22a}$ represents a hydrocarbon group which may contain a hetero atom, and the sum of the numbers of carbon atoms contained in all of the groups of $R_{21a}$ and $R_{22a}$ is 5 or more.

Preferred embodiments of $R_{21a}$ and $R_{22a}$ include —$X_1$—, —N($R_a$)—, —C(=$X_2$)—, —CON($R_b$)—, —C(=$X_3$)$X_4$—, —SO$_n$—, —SO$_2$N($R_c$)—, and a hydrocarbon group which may contain a halogen atom (for example, an aliphatic hydrocarbon group, an aromatic hydrocarbon group, or a group composed of the combination thereof). The definitions of $X_1$ to $X_4$, $R_a$ to $R_c$, and n are as described above. Among them, in terms of the ion migration inhibiting function of the SH group-containing compound being more excellent, an aryl group or a hydrocarbon group which may contain —$X_1$—, —N($R_a$)—, —C(=$X_2$)—, —CON($R_b$)— or —C(=$X_3$)$X_4$— is preferable. It is more preferable that at least one of $R_{21a}$ and $R_{22a}$ is an aliphatic hydrocarbon group.

Preferred embodiments of the hydrocarbon group (aliphatic hydrocarbon group and aromatic hydrocarbon group) are as described above, and the kind of the hetero atom is also as described above.

In the General Formula (6A), the sum of the numbers of carbon atoms contained in all of the groups of $R_{21a}$ and $R_{22a}$ is 5 or more. In other words, the sum (total carbon number) of the number of carbon atoms in $R_{21a}$ and the number of carbon atoms in $R_{22a}$ may be 5 or more. Preferred embodiments of the total number are as described above.

In the General Formula (7A), $R_{23a}$ represents a hydrocarbon group which may contain a hetero atom, and the number of carbon atoms contained in $R_{23a}$ is 5 or more.

The definition of the hydrocarbon group is as described above. In the General Formula (7A), preferred embodiments of the hydrocarbon group include —$X_1$—, —N($R_a$)—, —C(=$X_2$)—, —CON($R_b$)—, —C(=$X_3$)$X_4$—, —SO$_n$—, —SO$_2$N($R_c$)—, and a hydrocarbon group which may contain a halogen atom (for example, an aliphatic hydrocarbon group, an aromatic hydrocarbon group, or a group composed of the combination thereof). A hydrocarbon group having —$X_1$— (particularly, an aliphatic hydrocarbon group) is more preferable.

In the General Formula (8A), each of $R_{24a}$ to $R_{27a}$ independently represents a hydrogen atom, a halogen atom or a hydrocarbon group which may contain a hetero atom, at least one of $R_{24a}$ to $R_{27a}$ represents a hydrocarbon group, and the sum of the numbers of carbon atoms contained in all of the groups of $R_{24a}$ to $R_{27a}$ is 5 or more.

The definition of the hydrocarbon group is as described above. In the General Formula (8A), preferred embodiments of the hydrocarbon group include —$X_1$—, —N($R_a$)—, —C(=$X_2$)—, —CON($R_b$)—, —C(=$X_3$)$X_4$—, —SO$_n$—, —SO$_2$N($R_c$)—, and a hydrocarbon group which may contain a halogen atom (for example, an aliphatic hydrocarbon group, an aromatic hydrocarbon group, or a group composed of the combination thereof). A group represented by the following General Formula (9A) is more preferable. When this group is used, the dispersibility of the SH group-containing compound in the wiring layer is more excellent, and the ion migration inhibiting function is further improved.

 *-$L_1$-$R_{30a}$   General Formula (9A)

In the General Formula (9A), $L_1$ represents a single bond, —O—, —N$R_{31a}$—, —CO—, —C($R_{32a}$)($R_{33a}$)—, or a group composed of any combination of these. Each of $R_{31a}$ to $R_{33a}$ independently represents a hydrogen atom or an aliphatic hydrocarbon group.

$R_{30a}$ represents an aliphatic hydrocarbon group, an aromatic hydrocarbon group, or a group composed of the combination thereof. Preferred embodiments of the aliphatic hydrocarbon group and the aromatic hydrocarbon group are as described above.

In the General Formula (9A), * represents a binding position.

In the General Formula (8A), at least one of $R_{24a}$ to $R_{27a}$ represents a hydrocarbon group which may contain a hetero atom. In terms of ion migration inhibiting function being more excellent, one to two of $R_{24a}$ to $R_{27a}$ is preferably the hydrocarbon group, and more preferably, one of $R_{24a}$ to $R_{27a}$ is the hydrocarbon group.

In addition, the sum of the numbers of carbon atoms contained in all of the groups of $R_{24a}$ to $R_{27a}$ is 5 or more. In other words, the sum (total carbon number) of the number of carbon atoms in $R_{24a}$, the number of carbon atoms in $R_{25a}$, the number of carbon atoms in $R_{26a}$, and the number of carbon atoms in $R_{27a}$ may be 5 or more. Preferred embodiments of the total number are as described above.

Other preferred embodiments of the migration inhibitor (anti-migration agent) include compounds represented by General Formulae (1) to (5), a compound represented by General Formula (22), a compound represented by General Formula (23), and a compound having a group represented by General Formula (24) and a group represented by General Formula (25), which are to be described later. A fluorine atom is contained in the respective compounds, and, as described later, by containing this fluorine atom-containing compound in a one pack type composition for forming a wiring layer, it is possible to easily manufacture a wiring layer in which the migration inhibitor is contained with a desired distribution state.

The fluorine content of the above-mentioned fluorine atom-containing migration inhibitors (the compounds represented by General Formulae (1) to (5), the compound represented by General Formula (22), the compound represented by General Formula (23), and the compound having the group represented by General Formula (24) and the group represented by General Formula (25)) is preferably equal to or more than 20 mass % and less than 65 mass %, more preferably 25 mass % to 60 mass %, and still more preferably 30 mass % to 55 mass %, in terms of the ion migration inhibiting function of the formed wiring layer being more excellent and the surface characteristics thereof being also more excellent.

Here, the fluorine content refers to a ratio (content) of mass occupied by a fluorine atom in the total molecular weight of the migration inhibitor.

Hereinafter, the respective compounds will be described in detail.

(Compound Represented by General Formula (1))

First, the compound represented by General Formula (1) will be described.

$$P-(CR_1=Y)_n-Q \qquad \text{General Formula (1)}$$

In the General Formula (1), each of P and Q is independently OH, $NR_2R_3$, or $CHR_4R_5$. However, when n is 0, neither both P and Q are $CHR_4R_5$, nor both P and Q are OH. Y represents $CR_6$ or a nitrogen atom.

In the General Formula (1), each of $R_2$ and $R_3$ is independently a hydrogen atom or a group which can be substituted with a nitrogen atom.

The group which can be substituted with a nitrogen atom is not particularly limited as long as it can be substituted with a nitrogen atom, and examples thereof include an alkyl group (including a cycloalkyl group), an alkenyl group (including a cycloalkenyl group and a bicycloalkenyl group), an alkynyl group, an aryl group, a heterocyclic group, alkyl and aryl sulfinyl groups, alkyl and aryl sulfonyl groups, an acyl group, an alkoxy carbonyl group, an aryloxy carbonyl group, a carbamoyl group, a phosphino group, a phosphinyl group, and a group composed of any combination of these.

More specifically, preferred examples thereof include the following groups (a) to (m). (a) An alkyl group which is a linear, branched, or cyclic substituted or unsubstituted alky group. Examples of the alkyl group include an alkyl group (preferably, an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably, a substituted or unsubstituted cycloalkyl group having 3 to 30 carbon atoms, for example, cyclohexyl, cyclopentyl, or 4-n-dodecylcyclohexyl), and a bicycloalkyl group (preferably, a substituted or unsubstituted bicycloalkyl group having 5 to 30 carbon atoms, that is, a monovalent group obtained by removing one hydrogen atom from a bicycloalkane having 5 to 30 carbon atoms, for example, bicyclo[1.2.2]heptane-2-yl, or bicyclo[2.2.2]octane-3-yl). Examples of the alkyl group further include a tricyclo structure having many cyclic structures and the like. Among the substituents to be described below, an alkyl group (for example, an alkyl group of an alkylthio group) represents the aforementioned alkyl group, (b) an alkenyl group which is a linear, branched, or cyclic substituted or unsubstituted alkenyl group. Examples of the alkenyl group include an alkenyl group (preferably, a substituted or unsubstituted alkenyl group having 2 to 30 carbon atoms, for example, vinyl, allyl, prenyl, geranyl, or oleyl), a cycloalkenyl group (preferably, a substituted or unsubstituted cycloalkenyl group having 3 to 30 carbon atoms, that is, a monovalent group obtained by removing one hydrogen atom from cycloalkene having 3 to 30 carbon atoms, for example, 2-cyclopentene-1-yl or 2-cyclohexene-1-yl), and a bicycloalkenyl group (a substituted or unsubstituted bicycloalkenyl group, preferably a substituted or unsubstituted bicycloalkenyl group having 5 to 30 carbon atoms, that is, a monovalent group obtained by removing one hydrogen atom from bicycloalkene having one double bond, for example, bicyclo[2.2.1]hept-2-en-1-yl or bicyclo[2.2.2]oct-2-en-4-yl, (c) an alkynyl group (preferably, a substituted or unsubstituted alkynyl group having 2 to 30 carbon atoms, for example, ethynyl, propargyl, or a trimethylsilyl ethynyl group), (d) an aryl group (preferably, a substituted or unsubstituted aryl group having 6 to 30 carbon atoms, for example, phenyl, p-tolyl, naphthyl, m-chlorophenyl, or o-hexadecanoylaminophenyl), (e) an heterocyclic group (preferably, a monovalent group obtained by removing one hydrogen atom from a 5- or 6-membered substituted or unsubstituted aromatic or non-aromatic heterocyclic compound, and more preferably a 5- or 6-membered aromatic heterocyclic group having 3 to 30 carbon atoms, for example, 2-furanyl, 2-thienyl, 2-pyrimidinyl, or 2-benzothiazolinyl, (f) alkyl and aryl sulfinyl groups (preferably, a substituted or unsubstituted alkylsulfinyl group having 1 to 30 carbon atoms and a substituted or unsubstituted arylsulfinyl group having 6 to 30 carbon atoms, for example, methylsulfinyl, ethylsulfinyl, phenylsulfinyl, or p-methylphenylsulfinyl), (g) alkyl and aryl sulfonyl groups (preferably, a substituted or unsubstituted alkylsulfonyl group having 1 to 30 carbon atoms and a substituted or unsubstituted arylsulfonyl group having 6 to 30 carbon atoms, for example, methylsulfonyl, ethylsulfonyl, phenylsulfonyl, or p-methylphenylsulfonyl), (h) an acyl group (preferably, a formyl group, a substituted or unsubstituted alkylcarbonyl group having 2 to 30 carbon atoms, a substituted or unsubstituted arylcarbonyl group having 7 to 30 carbon atoms, and a substituted or unsubstituted heterocyclic carbonyl group having 4 to 30 carbon atoms in which a carbon atom is bonded with a carbonyl group, for example, acetyl, pivaloyl, 2-chloroacetyl, stearoyl, benzoyl, p-n-octyloxyphenylcarbonyl, 2-pyridylcarbonyl, or 2-furylcarbonyl), (i) an aryloxy carbonyl group (preferably, a substituted or unsubstituted aryloxy carbonyl group having 7 to 30 carbon atoms, for example, phenoxycarbonyl, o-chlorophenoxycarbonyl, m-nitrophenoxycarbonyl, or p-t-butyl-phenoxycarbonyl), (j) an alkoxycarbonyl group (preferably, a substituted or unsubstituted alkoxycarbonyl group having 2 to 30 carbon atoms, for example, methoxycarbonyl, ethoxycarbonyl, t-butoxycarbonyl, or n-octadecyloxycarbonyl), (k) a carbamoyl group (preferably, a substituted or unsubstituted carbamoyl group having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl), (l) a phosphino group (preferably, a substituted or unsubstituted phosphino group having 2 to 30 carbon atoms, for example, dimethylphosphino, diphenylphosphino, or methylphenoxyphosphino) and (m) a phosphinyl group (preferably, a substituted or unsubstituted phosphinyl group having 2 to 30 carbon atoms, for example, phosphinyl, dioctyloxyphosphinyl, or diethoxyphosphinyl).

Among the above functional groups, functional groups having a hydrogen atom may be further substituted by removing the hydrogen atom.

The alkyl group represented by $R_2$ and $R_3$ in the General Formula (1) is a linear, branched, or cyclic substituted or unsubstituted alkyl group. The alkyl group has preferably 1 to 50 carbon atoms, more preferably 1 to 30 carbon atoms, and particularly preferably 1 to 20 carbon atoms.

Preferable examples of the alkyl group include methyl, ethyl, n-propyl, isopropyl, cyclopropyl, butyl, isobutyl, t-butyl, sec-butyl, pentyl, isopentyl, neopentyl, t-pentyl, hexyl, cyclohexyl, heptyl, cyclopentyl, octyl, 2-ethylhexyl, nonyl, decyl, dodecyl, tetradecyl, hexadecyl, octadecyl, eicosyl, docosyl, triacontyl, and the like. More preferable examples thereof include methyl, ethyl, n-propyl, isopropyl, butyl, isobutyl, t-butyl, sec-butyl, t-butyl, pentyl, isopentyl, neopentyl, hexyl, cyclohexyl, octyl, 2-ethylhexyl, dodecyl, hexadecyl, and octadecyl. Particularly preferable examples thereof include methyl, ethyl, n-propyl, isopropyl, butyl, t-butyl, pentyl, isopentyl, hexyl, cyclohexyl, octyl, 2-ethylhexyl, dodecyl, hexadecyl, and octadecyl.

The alkyl group may include a linking group such as —CO—, —NH—, —O—, —S—, or a group composed of any combination of these. Here, when the linking group is included in the alkyl group, the position of the linking group is not particularly limited, and may be the terminal of the alkyl group. —S—$R_x$ ($R_x$: alkyl group) may be exemplified.

The alkyl group represented by $R_2$ and $R_3$ may further include a substituent.

Examples of the substituent include a halogen atom, an alkyl group (including a cycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocycloxy group, an acyloxy group, a carbamoyloxy group, an alkoxycarbonyloxy group, an aryloxycarbonyloxy group, an amino group (including an anilino group), an acylamino group, an amino carbonyl amino group, an alkoxycarbonyl amino group, an aryloxycarbonylamino group, a sulfamoylamino group, alkyl and aryl sulfonyl amino group, a mercapto group, an alkylthio group, an arylthio group, a heterocyclic thio group, a sulfamoyl group, a sulfo group, alkyl and aryl sulfinyl groups, alkyl and aryl sulfonyl groups, an acyl group, an aryloxy carbonyl group, an alkoxycarbonyl group, a carbamoyl group, aryl and heterocyclic azo groups, an imide group, a phosphino group, a phosphinyl group, a phosphinyloxy group, a phosphinylamino group, a silyl group, and a group composed of any combination of these.

More specifically, examples of the substituent include a halogen atom (for example, a chlorine atom, a bromine atom, or an iodine atom), an alkyl group, and an alkenyl group. Here, the alkyl group represents a linear, branched, or cyclic substituted or unsubstituted alkyl group. Examples of the alkyl group include an alkyl group (preferably, an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably, a substituted or unsubstituted cycloalkyl group having 3 to 30 carbon atoms, for example, cyclohexyl, cyclopentyl, or 4-n-dodecyl cyclohexyl), and a bicycloalkyl group (preferably, a substituted or unsubstituted bicycloalkyl group having 5 to 30 carbon atoms, that is, a monovalent group obtained by removing one hydrogen atom from bicycloalkane having 5 to 30 carbon atoms, for example, bicyclo[1.2.2]heptane-2-yl or bicyclo[2.2.2]octane-3-yl. Examples of the alkyl group further include a tricyclo structure having many cyclic structures, and the like. Among the substituents to be described below, an alkyl group (for example, an alkyl group of an alkylthio group) represents the aforementioned alkyl group.

The alkenyl group represents a linear, branched, or cyclic substituted or unsubstituted alkenyl group. Examples of the alkenyl group include an alkenyl group (preferably, a substituted or unsubstituted alkenyl group having 2 to 30 carbon atoms, for example, vinyl, allyl, prenyl, geranyl, or oleyl), a cycloalkenyl group (preferably, a substituted or unsubstituted cycloalkenyl group having 3 to 30 carbon atoms, that is, a monovalent group obtained by removing one hydrogen atom from cycloalkene having 3 to 30 carbon atoms, for example, 2-cyclopentene-1-yl or 2-cyclohexen-1-yl), and a bicycloalkenyl group (a substituted or unsubstituted bicycloalkenyl group, preferably, a substituted or unsubstituted bicycloalkenyl group having 5 to 30 carbon atoms, that is, a monovalent group obtained by removing one hydrogen atom from bicycloalkene having one double bond, for example, bicyclo[2.2.1]hept-2-en-1-yl or bicyclo[2.2.2]oct-2-en-4-yl).

Examples of the substituent further include an alkynyl group (preferably, a substituted or unsubstituted alkynyl group having 2 to 30 carbon atoms, for example, ethynyl, propargyl, or a trimethylsilylethynyl group);

an aryl group (preferably, a substituted or unsubstituted aryl group having 6 to 30 carbon atoms, for example, phenyl, p-tolyl, naphthyl, m-chlorophenyl, or o-hexadecanoylaminophenyl); a heterocyclic group (preferably, a monovalent group obtained by removing one hydrogen atom from a 5- or 6-membered substituted or unsubstituted aromatic or non-aromatic heterocyclic compound, and more preferably a 5- or 6-membered aromatic heterocyclic group having 3 to 30 carbon atoms, for example, 2-furanyl, 2-thienyl, 2-pyrimidinyl, or 2-benzothiazolinyl);

a cyano group; a hydroxyl group; a nitro group; a carboxyl group; an alkoxy group (preferably, a substituted or unsubstituted alkoxy group having 1 to 30 carbon atoms, for example, methoxy, ethoxy, isopropoxy, t-butoxy, n-octyloxy, or 2-methoxyethoxy); an aryloxy group (preferably, a substituted or unsubstituted aryloxy group having 6 to 30 carbon atoms, for example, phenoxy, 2-methylphenoxy, 4-t-butylphenoxy, 3-nitrophenoxy, or 2-tetradecanoyl aminophenoxy); a silyloxy group (preferably, a silyloxy group having 3 to 20 carbon atoms, for example, trimethylsilyloxy or t-butyldimethylsilyloxy); a heterocycloxy group (preferably, a substituted or unsubstituted heterocycloxy group having 2 to 30 carbon atoms, for example, 1-phenyl tetrazole-5-oxy or 2-tetrahydropyranyloxy); an acyloxy group (preferably, a formyloxy group, a substituted or unsubstituted alkylcarbonyloxy group having 2 to 30 carbon atoms, and a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy); a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholino carbonyloxy, N,N-di-n-octyl aminocarbonyloxy, or N-n-octylcarbamoyloxy); an alkoxycarbonyloxy group (preferably a substituted or unsubstituted alkoxycarbonyloxy group having 2 to 30 carbon atoms, for example, methoxycarbonyloxy, ethoxycarbonyloxy, t-butoxycarbonyloxy, or n-octyl carbonyloxy); an aryloxycarbonyloxy group (preferably a substituted or unsubstituted aryloxycarbonyloxy group having 7 to 30 carbon atoms, for example, phenoxycarbonyloxy, p-methoxyphenoxy carbonyloxy, or p-n-hexadecyloxy phenoxycarbonyloxy); an amino group (preferably, an amino group, a substituted or unsubstituted alkylamino group having 1 to 30 carbon atoms, and a substituted or unsubstituted anilino group having 6 to 30 carbon atoms, for example, amino, methylamino, dimethylamino, anilino, N-methyl-anilino, or diphenylamino); an acylamino group (preferably, a formylamino group, a substituted or unsubstituted alkyl carbonylamino group having 1 to 30 carbon atoms, and a substituted or unsubstituted arylcarbonylamino group having 6 to 30 carbon atoms, for example, formylamino, acetylamino, pivaloylamino, lauroylamino, benzoylamino, or 3,4,5-tri-n-octyloxyphenylcarbonylamino); an aminocarbonylamino group (preferably, a substituted or unsubstituted aminocarbonylamino group having 1 to 30 carbon atoms, for example, carbamoylamino, N,N-dimethylaminocarbonyl amino, N,N-diethylamino carbonylamino, or morpholinocarbonylamino); an alkoxycarbonylamino group (preferably, a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxy carbonyl amino); an aryloxycarbonylamino group (preferably, a substituted or unsubstituted aryloxycarbonylamino group having 7 to 30 carbon atoms, for example, phenoxycarbonylamino, p-chloro phenoxycarbonylamino, or m-n-octyloxy phenoxycarbonylamino); a sulfamoylamino group (preferably, a substituted or unsubstituted sulfamoylamino group having 0 to 30 carbon atoms, for example, sulfamoylamino, N,N-dimethylaminosulfonylamino, or N-n-octyl aminosulfonylamino); alkyl and aryl sulfonylamino groups (preferably a substituted or unsubstituted alkylsulfonylamino having 1 to 30 carbon atoms, and a substituted or unsubstituted arylsulfonylamino having 6 to 30 carbon atoms, for example, methylsulfonylamino, butylsulfonylamino, phenyl sulfonylamino, 2,3,5-trichlorophenyl sulfonylamino, or p-methylphenyl sulfonylamino);

a mercapto group; an alkylthio group (preferably, a substituted or unsubstituted alkylthio group having 1 to 30 carbon atoms, for example, methylthio, ethylthio, or n-hexadecylthio); an arylthio group (preferably, a substituted or unsubstituted arylthio group having 6 to 30 carbon atoms, for example, phenylthio, p-chlorophenylthio, or m-methoxyphenylthio); a heterocyclic thio group (preferably a substituted or unsubstituted heterocyclic thio group having 2 to 30 carbon atoms, for example, 2-benzothiazolylthio or 1-phenyltetrazole-5-ylthio); a sulfamoyl group (preferably a substituted or unsubstituted sulfamoyl group having 0 to 30 carbon atoms, for example, N-ethylsulfamoyl, N-(3-dodecyloxypropyl) sulfamoyl, N,N-dimethylsulfamoyl, N-acetyl sulfamoyl, N-benzoylsulfamoyl, or N—(N'-phenylcarbamoyl) sulfamoyl); a sulfo group; alkyl and aryl sulfinyl groups (preferably a substituted or unsubstituted alkyl sulfinyl group having 1 to 30 carbon atoms, and a substituted or unsubstituted aryl sulfinyl group having 6 to 30 carbon atoms, for example, methylsulfinyl, ethylsulfinyl, phenylsulfinyl, or p-methyl phenylsulfinyl);

an acyl group (preferably, a formyl group, a substituted or unsubstituted alkylcarbonyl group having 2 to 30 carbon atoms, a substituted or unsubstituted arylcarbonyl group having 7 to 30 carbon atoms, and a substituted or unsubstituted heterocyclic carbonyl group having 4 to 30 carbon atoms in which a carbon atom is bonded with the carbonyl group, for example, acetyl, pivaloyl, 2-chloroacetyl, stearoyl, benzoyl, p-n-octyloxyphenyl carbonyl, 2-pyridylcarbonyl, or 2-furyl carbonyl); an aryloxycarbonyl group (preferably, a substituted or unsubstituted aryloxy carbonyl group having 7 to 30 carbon atoms, for example, phenoxycarbonyl, o-chlorophenoxycarbonyl, m-nitrophenoxycarbonyl, or p-t-butylphenoxycarbonyl); an alkoxycarbonyl group (preferably, a substituted or unsubstituted alkoxycarbonyl group having 2 to 30 carbon atoms, for example, methoxycarbonyl, ethoxycarbonyl, t-butoxycarbonyl, or n-octadecyl oxycarbonyl);

a carbamoyl group (preferably a substituted or unsubstituted carbamoyl having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl); aryl and heterocyclic azo groups (preferably a substituted or unsubstituted aryl azo group having 6 to 30 carbon atoms, and a substituted or unsubstituted heterocyclic azo group having 3 to 30 carbon atoms, for example, phenylazo, p-chlorophenyl azo, or 5-ethylthio-1,3,4-thiadiazole-2-yl azo); an imide group (preferably, N-succinimide, or N-phthalimide); a phosphino group (preferably, a substituted or unsubstituted phosphino group having 2 to 30 carbon atoms, for example, dimethylphosphino, diphenylphosphino, or methylphenoxy phosphino); a phosphinyl group (preferably, a substituted or unsubstituted phosphinyl group having 2 to 30 carbon atoms, for example, phosphinyl, dioctyloxyphosphinyl, or diethoxyphosphinyl); a phosphinyloxy group (preferably, a substituted or unsubstituted phosphinyloxy group having 2 to 30 carbon atoms, for example, diphenoxyphosphinyloxy or dioctyloxyphosphinyloxy); a phosphinylamino group (preferably a substituted or unsubstituted phosphinylamino group having 2 to 30 carbon atoms, for example, dimethoxyphosphinylamino or dimethylamino phosphinylamino); and a silyl group (preferably a substituted or unsubstituted silyl group having 3 to 30 carbon atoms, for example, trimethylsilyl, t-butyldimethylsilyl, or phenyldimethylsilyl).

Among the above functional groups, functional groups having a hydrogen atom may be further substituted with the above groups by removing the hydrogen atom. Examples of such functional groups include an alkylcarbonylaminosulfonyl group, an arylcarbonylaminosulfonyl group, an alkylsulfonyl aminocarbonyl group, an arylsulfonyl aminocarbonyl group, and the like. Examples thereof include methylsulfonylaminocarbonyl, p-methylphenyl sulfonyl aminocarbonyl, acetylamino sulfonyl, benzoylaminosulfonyl group, and the like.

The alkenyl group represented by $R_2$ and $R_3$ is a linear, branched, or cyclic substituted or unsubstituted alkenyl group. The alkenyl group has preferably 2 to 50 carbon atoms, more preferably 2 to 30 carbon atoms, and particularly preferably 2 to 20 carbon atoms. Preferable examples thereof include vinyl, allyl, prenyl, geranyl, oleyl, 2-cyclopentene-1-yl, 2-cyclohexene-1-yl, bicyclo[2.2.1]hept-2-en-1-yl, bicyclo[2.2.2]oct-2-en-4-yl, and the like. More preferable examples thereof include vinyl, allyl, prenyl, geranyl, oleyl, 2-cyclopentene-1-yl, and 2-cyclohexene-1-yl. The alkenyl group represented by $R_2$ and $R_3$ may further include a substituent. Examples of the substituent include the substituents of the above-mentioned alkyl group represented by $R_2$ and $R_3$.

In addition, similarly to the above-mentioned alkyl group, the alkenyl group may include a linking group such as —CO—, —NH—, —O—, —S—, or a group composed of any combination of these.

The alkynyl group represented by $R_2$ and $R_3$ is a linear, branched, or cyclic substituted or unsubstituted alkynyl group. The alkynyl group has preferably 2 to 50 carbon atoms, more preferably 2 to 30 carbon atoms, and particularly preferably 2 to 20 carbon atoms. Preferable examples thereof include ethynyl, propargyl, and the like.

The alkynyl group represented by $R_2$ and $R_3$ may further include a substituent. Examples of the substituent include the substituents of the above-mentioned alkyl group represented by $R_2$ and $R_3$.

In addition, similarly to the above-mentioned alkyl group, the alkynyl group may include a linking group such as —CO—, —NH—, —O—, —S—, or a group composed of any combination of these.

The aryl group represented by $R_2$ and $R_3$ is a substituted or unsubstituted aryl group. The aryl group has preferably 6 to 50 carbon atoms, more preferably 6 to 30 carbon atoms, and particularly preferably 6 to 20 carbon atoms. Preferable examples thereof include phenyl, 2-methylphenyl, 3-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 3-chlorophenyl, 4-chlorophenyl, 2-methoxyphenyl, 3-methoxyphenyl, 4-methoxyphenyl, 2-benzylphenyl, 4-benzylphenyl, 2-methylcarbonylphenyl, 4-methylcarbonylphenyl, and the like.

More preferable examples thereof include phenyl, 2-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 3-methoxyphenyl, 4-methoxyphenyl, 2-benzylphenyl, 4-benzylphenyl, and the like. Particularly preferable examples thereof include phenyl, 2-methylphenyl, 4-methylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 4-methoxyphenyl, 2-benzylphenyl, 4-benzylphenyl, and the like.

The aryl group represented by $R_2$ and $R_3$ may further include a substituent. Examples of the substituent include the substituents of the above-mentioned alkyl group represented by $R_2$ and $R_3$.

Each of $R_4$ and $R_5$ independently represents a hydrogen atom or a substituent.

Examples of the substituents represented by $R_4$ and $R_5$ may include the substituents of the above-mentioned alkyl group represented by $R_2$ and $R_3$. Preferable examples thereof include an alkyl group, an alkenyl group, an alkynyl group, an aryl group, and a group composed of any combination of these, and preferable examples of the respective groups include the examples of the above-mentioned $R_2$ and $R_3$.

The group represented by $R_4$ and $R_5$ may further include a substituent. Examples of the substituent include the substituents of the above-mentioned alkyl group represented by $R_2$ and $R_3$.

Each of $R_1$ and $R_6$ independently represents a hydrogen atom or a substituent.

Examples of the substituents represented by $R_1$ and $R_6$ may include the substituents of the above-mentioned alkyl group represented by $R_2$ and $R_3$. Preferable examples thereof include an alkyl group, an alkenyl group, an alkynyl group, an aryl group, and a group composed of any combination of these, and preferable examples of the respective groups include the examples of above-mentioned $R_2$ and $R_3$.

The group represented by $R_1$ and $R_6$ may further include a substituent. Examples of the substituent include the substituents of the above-mentioned alkyl group represented by $R_2$ and $R_3$.

n is an integer of 0 to 5. However, when n is 0, neither both P and Q are OH, nor both P and Q are $CHR_4R_5$. When n is 2 or more, a plurality of atomic groups represented by ($CR_1$=Y) may be the same as or different from each other.

The compound represented by General Formula (1) may be a chain compound or a cyclic compound. When the compound is a cyclic compound, at least two of groups represented by $R_1$, $R_2$, $R_3$, $R_4$, $R_5$, and $R_6$ may be bonded to each other to form a ring.

When the two groups are bonded to each other, the coupling form may be any of a single bond, a double bond, and a triple bond.

At least one group of $R_1$ to $R_6$ contains a fluorine atom. Here, it is preferable that the fluorine atom is contained such that the content thereof is within the aforementioned range. The fluorine atom may substitute for any carbon atom of the compound represented by the General Formula (1).

Further, it is preferable that some or all hydrogen atoms contained in at least one group of $R_1$ to $R_6$ (preferably, some or all hydrogen atoms bonded to carbon atoms) are substituted with fluorine atoms. In this case, it is preferable that fluorine atoms are contained as a fluoroalkyl group (hereinafter, referred to as an $R_f$ group) or a group substituted with the $R_f$ group. In other words, it is preferable that a fluoroalkyl group is contained in at least one group of $R_1$ to $R_6$.

It is preferable for the $R_f$ group to be a linear or branched perfluoroalkyl group having 1 to 14 carbon atoms or a substituent having 2 to 20 carbon atom and substituted with the linear or branched perfluoroalkyl group having 1 to 14 carbon atoms.

Examples of the linear or branched perfluoroalkyl group having 1 to 14 carbon atoms include $CF_3$—, $C_2F_5$—, $C_3F_7$—, $C_4F_9$—, $C_5F_{11}$—, $(CF_3)_2$—CF—$(CF_2)_2$—, $C_6F_{13}$—, $C_7F_{15}$—, $(CF_3)_2$—CF—$(CF_2)_4$—, $C_8F_{17}$—, $C_9F_{19}$—, $C_{10}F_{21}$—, $C_{12}F_{25}$—, and $C_{14}F_{29}$—.

Examples of the substituent having 2 to 20 carbon atom and substituted with the linear or branched perfluoroalkyl group having 1 to 14 carbon atoms include, but are not limited to, $(CF_3)_2CF(CF_2)_4(CH_2)_2$—, $C_9F_{19}CH_2$—, $C_8F_{17}CH_2CH(OH)$ $CH_2$—, $C_8F_{17}CH_2CH(OH)$ $CH_2OC$=$OCH_2$—, $(CF_3)_2CF(CF_2)_4$ $(CH_2)_2OC$=$OCH_2$—, $C_8F_{17}CH_2CH(OH)CH_2OC$=$O(CH_2)_2$—, $(CF_3)_2CF(CF_2)_4$ $(CH_2)_2OC$=$O(CH_2)_2$—, $(CF_3)_2CFOC_2F_4$—, and $CF_3CF_2CF_2O[CF(CF_3)CF_2O]_4$—$CF(CF_3)$—.

It is preferable that 1 to 4 $R_f$ groups are contained in a molecule.

Two or more kinds of the compound represented by the General Formula (1) may be used.

It is preferable that the compound represented by General Formula (1) is at least one selected from the group consisting of compounds represented by General Formulae (6) to (21).

In addition, it is preferable that each of compounds represented by General Formulae (6) to (21) contains fluorine atoms in an amount of satisfying the above-mentioned fluorine content.

General Formula (6)

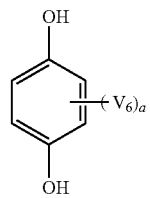

-continued

General Formula (7)

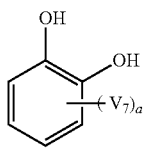

General Formula (8)

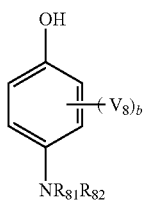

General Formula (9)

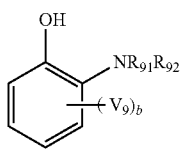

General Formula (10)

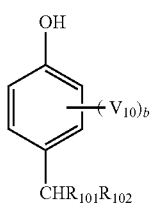

General Formula (11)

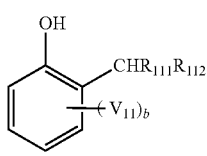

General Formula (12)

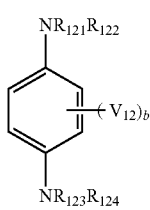

General Formula (13)

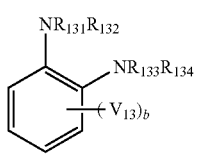

General Formula (14)

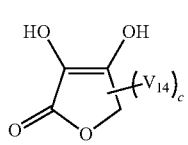

General Formula (15)

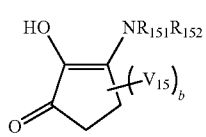

General Formula (16)

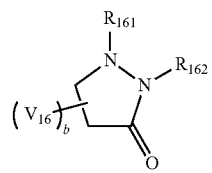

General Formula (17)

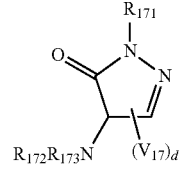

General Formula (18)

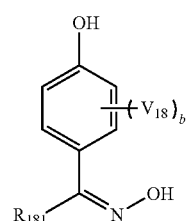

General Formula (19)

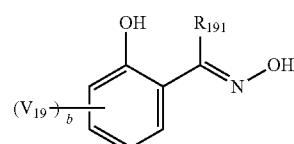

General Formula (20)

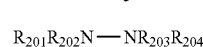

General Formula (21)

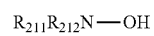

The compound represented by the General Formula (6) is an example of the compound of General Formula (1) in which P and Q are OH respectively, Y is $CR_6$, n is 2, and $R_1$ on the carbon atom adjacent to P and $R_6$ on the carbon atom adjacent to Q are bonded to each other to form a ring having a double bond.

In the General Formula (6), $V_6$ represents a substituent. a is an integer of 1 to 4 (preferably 1 to 2, and more preferably 1). At least one of $V_6$ contains a fluorine atom. In other words, in the case of one $V_6$, the fluorine atom is contained in the substituent, and, in the case of two or more $V_6$, the fluorine atom may be contained in at least one $V_6$. It is preferable that fluorine atoms are introduced by substituting some or all carbon atoms of at least one group represented by $V_6$ (preferably, some or all hydrogen atoms bonded to carbon atoms) with the fluorine atoms. In this case, it is preferable that the above $R_f$ group is contained in $V_6$.

As the substituent represented by $V_6$, there can be exemplified the substituents of the above-mentioned alkyl group represented by $R_2$ and $R_3$ in the General Formula (1). When a plurality of $V_6$ are present in the General Formula (6), the respective groups may be the same as or different from each other, and may be bonded to each other to form a ring.

Specific examples of the compound represented by the General Formula (6) are shown below. However, the present invention is not limited thereto. Hereinafter, the percentage described with the structural formula of each of the compounds is intended to represent the mass content of fluorine atoms (fluorine content).

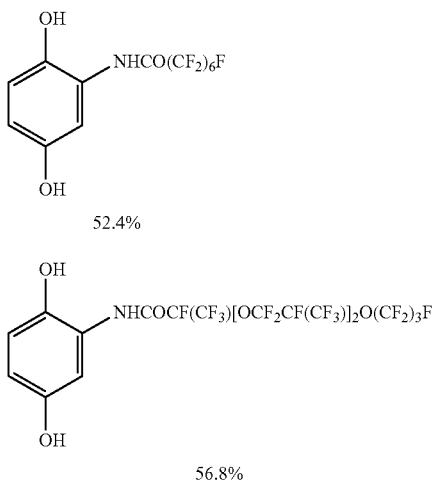

6-1

52.4%

6-2

56.8%

The compound represented by the General Formula (7) is an example of the compound of General Formula (1) in which P and Q are OH respectively, Y is $CR_6$, n is 1, and $R_1$ on the carbon atom adjacent to P and $R_6$ on the carbon atom adjacent to Q are bonded to each other to form a ring.

In the General Formula (7), $V_7$ represents a substituent. a is an integer of 1 to 4 (preferably 1 to 2, and more preferably 1). At least one $V_7$ contains a fluorine atom. In other words, in the case of one $V_7$, the fluorine atom is contained in the substituent, and, in the case of two or more $V_7$, the fluorine atom may be contained in at least one $V_7$. It is preferable that fluorine atoms are introduced by substituting some or all carbon atoms of at least one group represented by $V_7$ (preferably, some or all hydrogen atoms bonded to carbon atoms) with the fluorine atoms. In this case, it is preferable that the above $R_f$ group is contained in $V_7$.

As the substituent represented by $V_7$, there can be exemplified the substituents of the above-mentioned alkyl group represented by $R_2$ and $R_3$ in the General Formula (1). When a plurality of $V_7$ are present in the General Formula (7), the respective groups may be the same as or different from each other, and may be bonded to each other to form a ring.

Specific examples of the compound represented by the General Formula (7) are shown below. However, the present invention is not limited thereto.

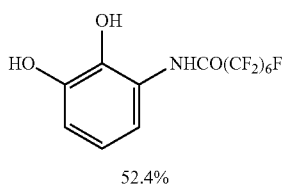

7-1

52.4%

7-2

55.6%

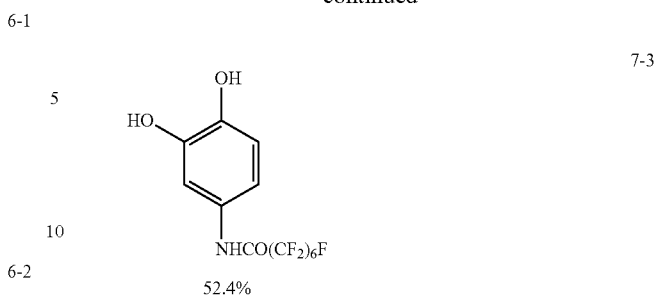

7-3

52.4%

The compound represented by the General Formula (8) is an example of the compound of General Formula (1) in which P is OH, Q is $NR_2R_3$, Y is $CR_6$, n is 2, and $R_1$ on the carbon atom adjacent to P and $R_6$ on the carbon atom adjacent to Q are bonded to each other to form a ring having a double bond.

In the General Formula (8), $V_8$ represents a substituent. b is an integer of 0 to 4 (preferably 1 to 2, and more preferably 1). As the substituent represented by $V_8$, there can be exemplified the substituents of the above-mentioned alkyl group represented by $R_2$ and $R_3$ in the General Formula (1). When a plurality of $V_8$ are present in the General Formula (8), the respective groups may be the same as or different from each other, and may be bonded to each other to form a ring.

Each of $R_{81}$ and $R_{82}$ independently represents a hydrogen atom or a group which can be substituted with a nitrogen atom. Preferable examples of the group which can be substituted with a nitrogen atom include the groups exemplified in the above-mentioned $R_2$ and $R_3$ of the General Formula (1).

At least one of $V_8$, $R_{81}$, and $R_{82}$ contains a fluorine atom. In this case, it is preferable that some or all hydrogen atoms of at least one group of $V_8$, $R_{81}$, and $R_{82}$ (preferably, some or all hydrogen atoms bonded to carbon atoms) are substituted with fluorine atoms. In addition, it is more preferable that the above $R_f$ group is contained in at least one of $V_8$, $R_{81}$, and $R_{82}$.

Further, in the case where a plurality of $V_8$ is contained in the compound, the fluorine atom is contained in at least one group of the plurality of $V_8$, $R_{81}$, and $R_{82}$.

Specific examples of the compound represented by the General Formula (8) are shown below. However, the present invention is not limited thereto.

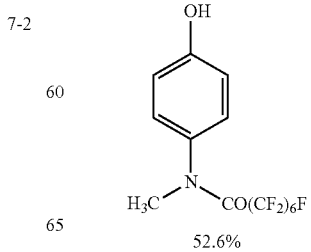

8-1

52.6%

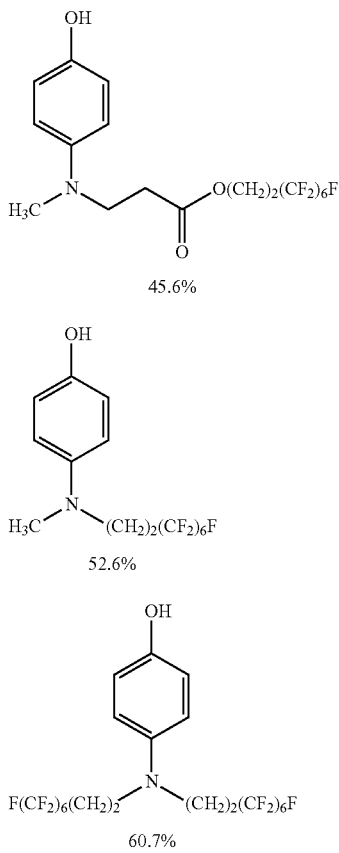

8-2

45.6%

8-3

52.6%

8-4

60.7%

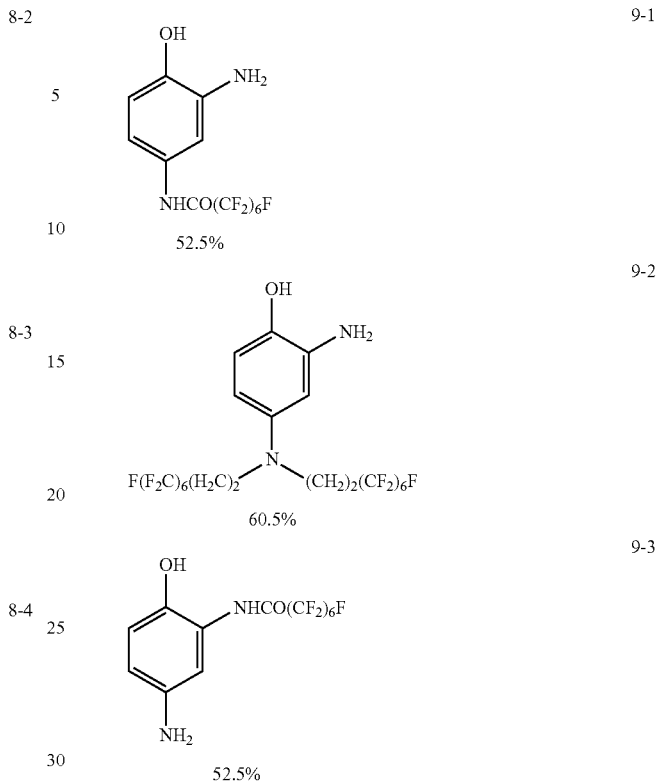

9-1

52.5%

9-2

60.5%

9-3

52.5%

The compound represented by the General Formula (9) is an example of the compound of General Formula (1) in which P is OH, Q is $NR_2R_3$, Y is $CR_6$, n is 1, and $R_1$ on the carbon atom adjacent to P and $R_6$ on the carbon atom adjacent to Q are bonded to each other to form a ring.

In the General Formula (9), $V_9$ represents a substituent. b is an integer of 0 to 4 (preferably 1 to 2, and more preferably 1). As the substituent represented by $V_9$, there can be exemplified the substituents of the above-mentioned alkyl group represented by $R_2$ and $R_3$ in the General Formula (1). When a plurality of $V_9$ are present in the General Formula (9), the respective groups may be the same as or different from each other, and may be bonded to each other to form a ring.

Each of $R_{91}$ and $R_{92}$ independently represents a hydrogen atom or a group which can be substituted with a nitrogen atom. Preferable examples of the group which can be substituted with a nitrogen atom include the groups exemplified in the above-mentioned $R_2$ and $R_3$ of the General Formula (1).

At least one of $V_9$, $R_{91}$, and $R_{92}$ contains a fluorine atom. In this case, it is preferable that some or all hydrogen atoms of at least one group of $V_9$, $R_{91}$, and $R_{92}$ (preferably, some or all hydrogen atoms bonded to carbon atoms) are substituted with fluorine atoms. In addition, it is more preferable that the above $R_f$ group is contained in at least one of $V_9$, $R_{91}$, and $R_{92}$.

Further, in the case where a plurality of $V_9$ is contained in the compound, the fluorine atom is contained in at least one group of the plurality of $V_9$, $R_{91}$, and $R_{92}$.

Specific examples of the compound represented by the General Formula (9) are shown below. However, the present invention is not limited thereto.

The compound represented by the General Formula (10) is an example of the compound of General Formula (1) in which P is OH, Q is $CHR_4R_5$, Y is $CR_6$, n is 2, and $R_1$ on the carbon atom adjacent to P and $R_6$ on the carbon atom adjacent to Q are bonded to each other to form a ring having a double bond.

In the General Formula (10), $V_{10}$ represents a substituent. b is an integer of 0 to 4 (preferably 1 to 2, and more preferably 1). As the substituent represented by $V_{10}$, there can be exemplified the substituents of the above-mentioned alkyl group represented by $R_2$ and $R_3$ in the General Formula (1). When a plurality of $V_{10}$ are present in the General Formula (10), the respective groups may be the same as or different from each other, and may be bonded to each other to form a ring.

Each of $R_{101}$ and $R_{102}$ independently represents a hydrogen atom or a substituent.

As the substituent represented by $R_{101}$ and $R_{102}$, there can be exemplified the substituents of the above-mentioned alkyl group represented by $R_2$ and $R_3$. The substituent is preferably an alkyl group, an alkenyl group, an alkynyl group, or an aryl group. Preferable examples of the respective groups include the examples of the above-mentioned $R_2$ and $R_3$.

When $R_{101}$ and $R_{102}$ are substituents, each of these groups may further include a substituent. Examples of the substituent include the substituents of the above-mentioned alkyl group represented by $R_2$ and $R_3$ in the General Formula (1).

At least one of $V_{10}$, $V_{101}$, and $R_{102}$ contains a fluorine atom. In this case, it is preferable that some or all hydrogen atoms of at least one group of $V_{10}$, $V_{101}$, and $R_{102}$ (preferably, some or all hydrogen atoms bonded to carbon atoms) are substituted with fluorine atoms. In addition, it is preferable that the above $R_f$ group is contained in at least one of $V_{10}$, $V_{101}$, and $R_{102}$.

Further, in the case where a plurality of $V_{10}$ is contained in the compound, the fluorine atom is contained in at least one group of the plurality of $V_{10}$, $V_{101}$, and $R_{102}$.

Specific examples of the compound represented by the General Formula (10) are shown below. However, the present invention is not limited thereto.

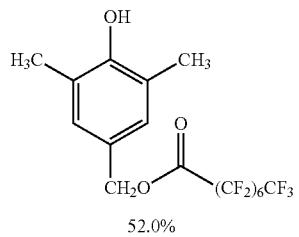

10-1

52.0%

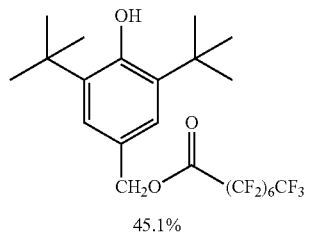

10-2

45.1%

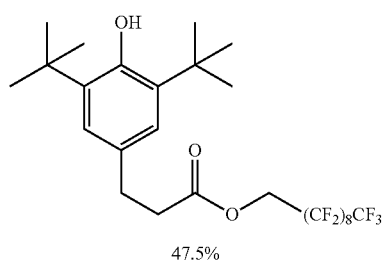

10-3

47.5%

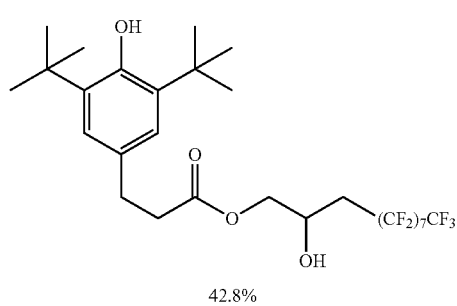

10-4

42.8%

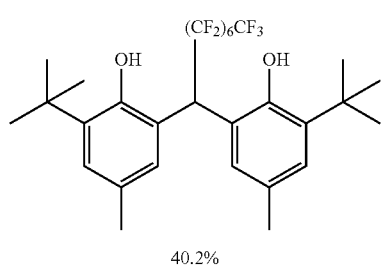

10-5

40.2%

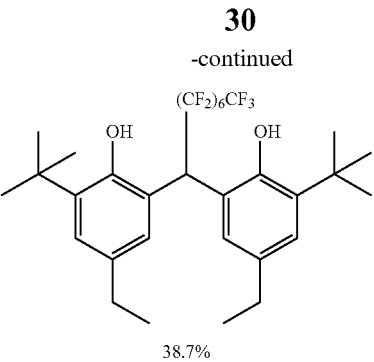

10-6

38.7%

The compound represented by the General Formula (11) is an example of the compound of General Formula (1) in which P is OH, Q is $CHR_4R_5$, Y is $CR_6$, n is 1, and $R_1$ on the carbon atom adjacent to P and $R_6$ on the carbon atom adjacent to Q are bonded to each other to form a ring.

In the General Formula (11), $V_{11}$ represents a substituent. b is an integer of 0 to 4 (preferably 1 to 2, and more preferably 1). As the substituent represented by $V_{11}$, there can be exemplified the substituents of the above-mentioned alkyl group represented by $R_2$ and $R_3$ in the General Formula (1). When a plurality of $V_{11}$ are present in the General Formula (11), the respective groups may be the same as or different from each other, and may be bonded to each other to form a ring.

Each of $R_{111}$ and $R_{112}$ independently represents a hydrogen atom or a substituent.

As the substituent represented by $R_{111}$ and $R_{112}$, there can be exemplified the substituents of the above-mentioned alkyl group represented by $R_2$ and $R_3$. The substituent is preferably an alkyl group, an alkenyl group, an alkynyl group, or an aryl group. Preferable examples of the respective groups include the examples of the above-mentioned $R_2$ and $R_3$.

When $R_{111}$ and $R_{112}$ are substituents, each of these groups may further include a substituent. Examples of the substituent include the substituents of the above-mentioned alkyl group represented by $R_2$ and $R_3$ in the General Formula (1).

At least one of $V_{11}$, $R_{111}$, and $R_{112}$ contains a fluorine atom. In this case, it is preferable that some or all hydrogen atoms of at least one group of $V_{11}$, $R_{111}$, and $R_{112}$ (preferably, some or all hydrogen atoms bonded to carbon atoms) are substituted with fluorine atoms. In addition, it is preferable that the above $R_f$ group is contained in at least one of $V_{11}$, $R_{111}$, and $R_{112}$.

Further, in the case where a plurality of $V_{11}$ is contained in the compound, the fluorine atom is contained in at least one group of the plurality of $V_{11}$, $R_{111}$, and $R_{112}$.

Specific examples of the compound represented by the General Formula (11) are shown below. However, the present invention is not limited thereto.

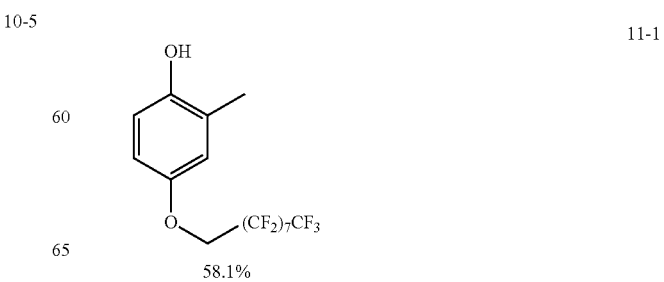

11-1

58.1%

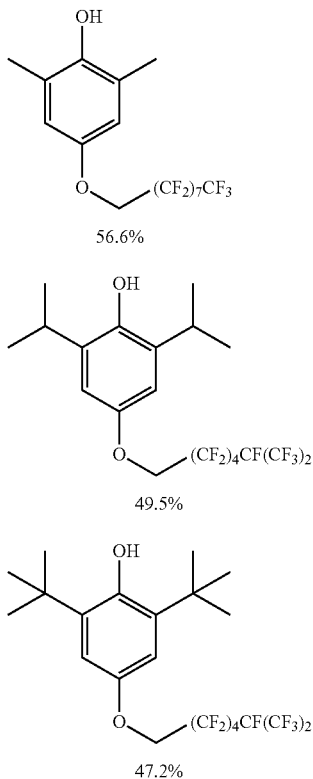

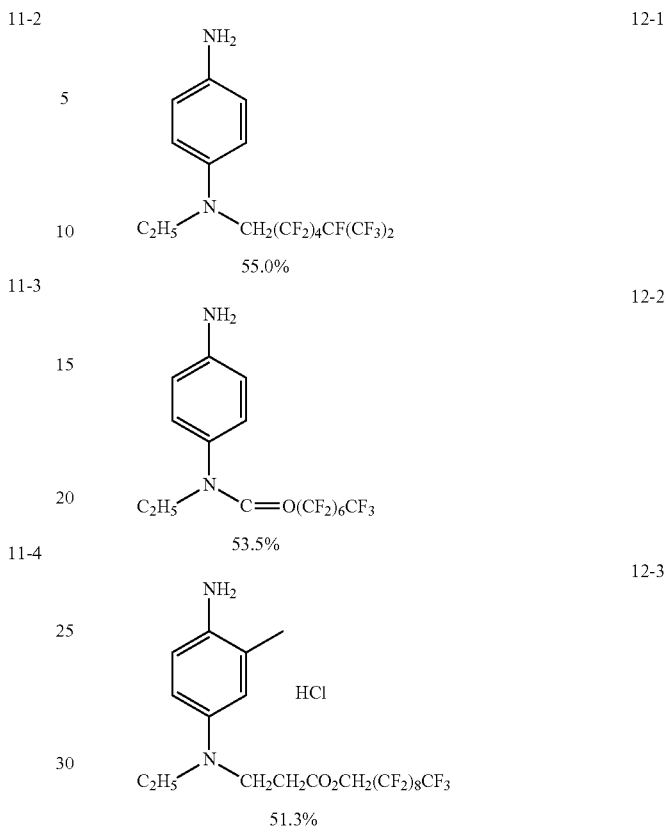

The compound represented by the General Formula (12) is an example of the compound of General Formula (1) in which P and Q are $NR_2R_3$ respectively, Y is $CR_6$, n is 2, and $R_1$ on the carbon atom adjacent to P and $R_6$ on the carbon atom adjacent to Q are bonded to each other to form a ring having a double bond.

In the General Formula (12), $V_{12}$ represents a substituent. b is an integer of 0 to 4 (preferably 1 to 2, and more preferably 1). As the substituent represented by $V_{12}$, there can be exemplified the substituents of the above-mentioned alkyl group represented by $R_2$ and $R_3$ in the General Formula (1). When a plurality of $V_{12}$ are present in the General Formula (12), the respective groups may be the same as or different from each other, and may be bonded to each other to form a ring.

Each of $R_{121}$, $R_{122}$, $R_{123}$, and $R_{124}$ independently represents a hydrogen atom or a group which can be substituted with a nitrogen atom. Preferable examples of the group which can be substituted with a nitrogen atom include the groups exemplified in the above-mentioned $R_2$ and $R_3$ of the General Formula (1).

At least one of $V_{12}$, $R_{121}$, $R_{122}$, $R_{123}$, and $R_{124}$ contains a fluorine atom. In this case, it is preferable that some or all hydrogen atoms of at least one group of $V_{12}$, $R_{121}$, $R_{122}$, $R_{123}$, and $R_{124}$ (preferably, some or all hydrogen atoms bonded to carbon atoms) are substituted with fluorine atoms. In addition, it is more preferable that the above $R_f$ group is contained in at least one of $V_{12}$, $R_{121}$, $R_{122}$, $R_{123}$, and $R_{124}$.

Further, in the case where a plurality of $V_{12}$ is contained in the compound, the fluorine atom is contained in at least one group of the plurality of $V_{12}$, $R_{121}$, $R_{122}$, $R_{123}$, and $R_{124}$.

Specific examples of the compound represented by the General Formula (12) are shown below. However, the present invention is not limited thereto.

The compound represented by the General Formula (13) is an example of the compound of General Formula (1) in which P and Q are $NR_2R_3$ respectively, Y is $CR_6$, n is 1, and $R_1$ on the carbon atom adjacent to P and $R_6$ on the carbon atom adjacent to Q are bonded to each other to form a ring.

In the General Formula (13), $V_{13}$ represents a substituent. b is an integer of 0 to 4 (preferably 1 to 2, and more preferably 1). As the substituent represented by $V_{13}$, there can be exemplified the substituents of the above-mentioned alkyl group represented by $R_2$ and $R_3$ in the General Formula (1). When a plurality of $V_{13}$ are present in the General Formula (13), the respective groups may be the same as or different from each other, and may be bonded to each other to form a ring.

Each of $R_{131}$, $R_{132}$, $R_{133}$, and $R_{134}$ independently represents a hydrogen atom or a group which can be substituted with a nitrogen atom. Preferable examples of the group which can be substituted with a nitrogen atom include the groups exemplified in the above-mentioned $R_2$ and $R_3$ of the General Formula (1).

At least one of $V_{13}$, $R_{131}$, $R_{132}$, $R_{133}$, and $R_{134}$ contains a fluorine atom. In this case, it is preferable that some or all hydrogen atoms of at least one group of $V_{13}$, $R_{131}$, $R_{132}$, $R_{133}$, and $R_{134}$ (preferably, some or all hydrogen atoms bonded to carbon atoms) are substituted with fluorine atoms. In addition, it is more preferable that the above $R_f$ group is contained in at least one of $V_{13}$, $R_{131}$, $R_{132}$, $R_{133}$, and $R_{134}$.

Further, in the case where a plurality of $V_{13}$ is contained in the compound, the fluorine atom is contained in at least one group of the plurality of $V_{13}$, $R_{131}$, $R_{132}$, $R_{133}$, and $R_{134}$.

Specific examples of the compound represented by the General Formula (13) are shown below. However, the present invention is not limited thereto.

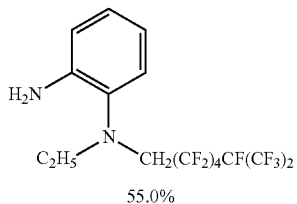

13-1

55.0%

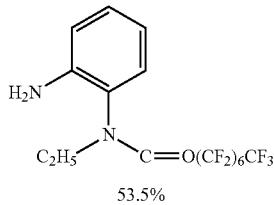

13-2

53.5%

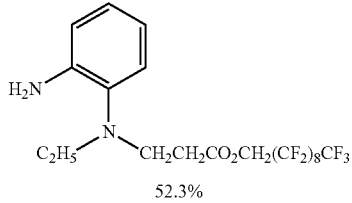

13-3

52.3%

The compound represented by the General Formula (14) is an example of the compound of General Formula (1) in which P and Q are OH respectively, Y is $CR_6$, n is 1, and $R_1$ on the carbon atom adjacent to P and $R_6$ on the carbon atom adjacent to Q are bonded to each other to form a ring.

In the General Formula (14), $V_{14}$ represents a substituent. c is an integer of 1 to 2 (preferably 1). At least one $V_{14}$ contains a fluorine atom. In other words, in the case of one $V_{14}$, the fluorine atom is contained in the substituent, and, in the case of two or more $V_{14}$, the fluorine atom may be contained in at least one $V_{14}$. It is preferable that fluorine atoms are introduced by substituting some or all hydrogen atoms of at least one group represented by $V_{14}$ (preferably, some or all hydrogen atoms bonded to carbon atoms) with the fluorine atoms. In this case, it is more preferable that the above $R_f$ group is contained in $V_{14}$.

As the substituent represented by $V_{14}$, there is exemplified the substituents of the above-mentioned alkyl group represented by $R_2$ and $R_3$ in the General Formula (1). When a plurality of $V_{14}$ are present in the General Formula (14), the respective groups may be the same as or different from each other, and may be bonded to each other to form a ring.

Specific examples of the compound represented by the General Formula (14) are shown below. However, the present invention is not limited thereto.

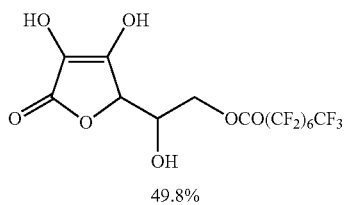

14-1

49.8%

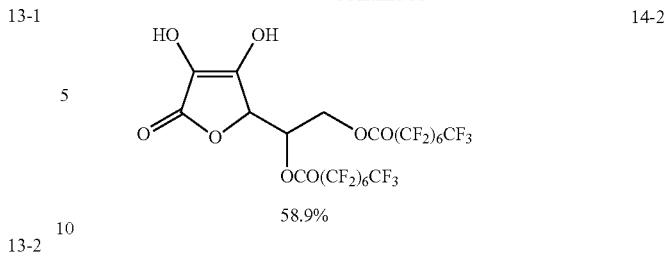

14-2

58.9%

The compound represented by the General Formula (15) is an example of the compound of General Formula (1) in which P is OH, Q is $NR_2R_3$, Y is $CR_6$, n is 1, and $R_1$ on the carbon atom adjacent to P and $R_6$ on the carbon atom adjacent to Q are bonded to each other to form a ring.

In the General Formula (15), $V_{15}$ represents a substituent. b is an integer of 0 to 4 (preferably, 1 to 2, and more preferably 1). As the substituent represented by $V_{15}$, there can be exemplified the substituents of the above-mentioned alkyl group represented by $R_2$ and $R_3$ in the General Formula (1). When a plurality of $V_{15}$ are present in the General Formula (15), the respective groups may be the same as or different from each other, and may be bonded to each other to form a ring.

Each of $R_{151}$ and $R_{152}$ independently represents a hydrogen atom or a group which can be substituted with a nitrogen atom. Preferable examples of the group which can be substituted with a nitrogen atom include the groups exemplified in the above-mentioned $R_2$ and $R_3$ of the General Formula (1).

At least one of $V_{15}$, $R_{151}$, and $R_{152}$ contains a fluorine atom. In this case, it is preferable that some or all hydrogen atoms of at least one group of $V_{15}$, $R_{151}$, and $R_{152}$ (preferably, some or all hydrogen atoms bonded to carbon atoms) are substituted with fluorine atoms. In addition, it is preferable that the above $R_f$ group is contained in at least one of $V_{15}$, $R_{151}$, and $R_{152}$.

Further, in the case where a plurality of $V_{15}$ is contained in the compound, the fluorine atom is contained in at least one group of the plurality of $V_{15}$, $R_{151}$, and $R_{152}$.

Specific examples of the compound represented by the General Formula (15) are shown below. However, the present invention is not limited thereto.

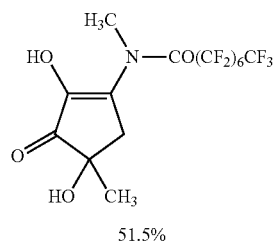

15-1

51.5%

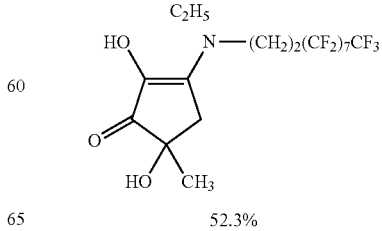

15-2

52.3%

The compound represented by the General Formula (16) is an example of the compound of General Formula (1) in which P and Q are $NR_2R_3$ respectively, n is 0, and $R_2$ and $R_3$ are bonded to each other to form a ring.

In the General Formula (16), $V_{16}$ represents a substituent. b is an integer of 0 to 4 (preferably, 1 to 2, and more preferably 1). As the substituent represented by $V_{16}$, there can be exemplified the substituents of the above-mentioned alkyl group represented by $R_2$ and $R_3$ in the General Formula (1). When a plurality of $V_{16}$ are present in the General Formula (16), the respective groups may be the same as or different from each other, and may be bonded to each other to form a ring.

Each of $R_{161}$ and $R_{162}$ independently represents a hydrogen atom or a group which can be substituted with a nitrogen atom. Preferable examples of the group which can be substituted with a nitrogen atom include the groups exemplified in the above-mentioned $R_2$ and $R_3$ of the General Formula (1).

At least one of $V_{16}$, $R_{161}$, and $R_{162}$ contains a fluorine atom. In this case, it is preferable that some or all hydrogen atoms of at least one group of $V_{16}$, $R_{161}$, and $R_{162}$ (preferably, some or all hydrogen atoms bonded to carbon atoms) are substituted with fluorine atoms. In addition, it is preferable that the above $R_f$ group is contained in at least one of $V_{16}$, $R_{161}$, and $R_{162}$.

Further, in the case where a plurality of $V_{16}$ is contained in the compound, the fluorine atom is contained in at least one group of the plurality of $V_{16}$, $R_{161}$, and $R_{162}$.

Specific examples of the compound represented by the General Formula (16) are shown below. However, the present invention is not limited thereto.

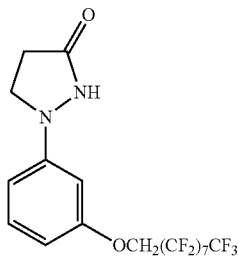

16-1

52.9%

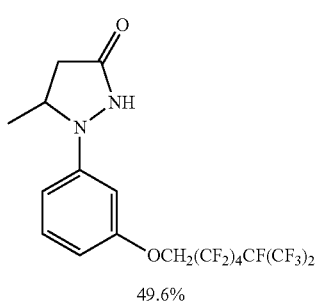

16-2

49.6%

The compound represented by the General Formula (17) is an example of the compound of General Formula (1) in which P and Q are $NR_2R_3$ respectively, n is 0, and $R_2$ and $R_3$ are bonded to each other to form a ring.

In the General Formula (17), $V_{17}$ represents a substituent. d is 0 or 1. As the substituent represented by $V_{17}$, there can be exemplified the substituents of the above-mentioned alkyl group represented by $R_2$ and $R_3$ in the General Formula (1). When a plurality of $V_{17}$ are present in the General Formula (17), the respective groups may be the same as or different from each other, and may be bonded to each other to form a ring.

Each of $R_{171}$, $R_{172}$, and $R_{173}$ independently represents a hydrogen atom or a group which can be substituted with a nitrogen atom. Preferable examples of the group which can be substituted with a nitrogen atom include the groups exemplified in the above-mentioned $R_2$ and $R_3$ of the General Formula (1).

At least one of $V_{17}$, $R_{171}$, $R_{172}$, and $R_{173}$ contains a fluorine atom. In this case, it is preferable that some or all hydrogen atoms of at least one group of $V_{17}$, $R_{171}$, $R_{172}$, and $R_{173}$ (preferably, some or all hydrogen atoms bonded to carbon atoms) are substituted with fluorine atoms. In addition, it is preferable that the above $R_f$ group is contained in at least one of $V_{17}$, $R_{171}$, $R_{172}$, and $R_{173}$.

Further, in the case where a plurality of $V_{17}$ is contained in the compound, the fluorine atom is contained in at least one group of the plurality of $V_{17}$, $R_{171}$, $R_{172}$, and $R_{173}$.

Specific examples of the compound represented by the General Formula (17) are shown below. However, the present invention is not limited thereto.

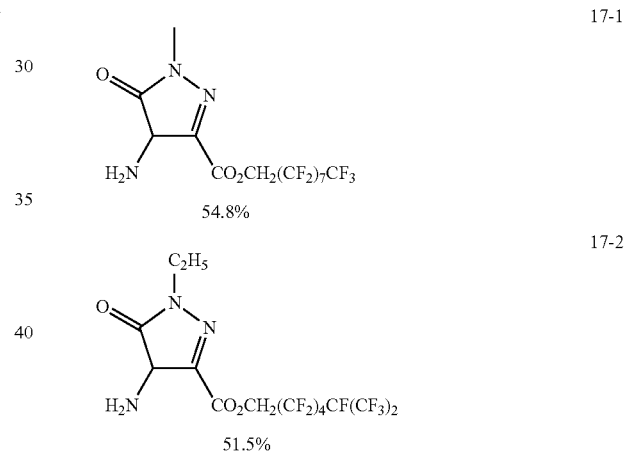

The compound represented by the General Formula (18) is an example of the compound of General Formula (1) in which P and Q are OH respectively, Y is $CR_6$ and nitrogen atom, n is 3, and $R_1$ and $R_6$ are bonded to each other to form a ring.

In the General Formula (18), $V_{18}$ represents a substituent. b is an integer of 0 to 4 (preferably 1 to 2, and more preferably 1). As the substituent represented by $V_{18}$, there can be exemplified the substituents of the above-mentioned alkyl group represented by $R_2$ and $R_3$ in the General Formula (1). When a plurality of $V_{18}$ are present in the General Formula (18), the respective groups may be the same as or different from each other, and may be bonded to each other to form a ring.

$R_{181}$ represents a hydrogen atom or a substituent. As the substituent represented by $R_{181}$, there can be exemplified the substituents of the above-mentioned alkyl group represented by $R_2$ and $R_3$. The substituent is preferably an alkyl group, an alkenyl group, an alkynyl group, or an aryl group. Preferable examples of the respective groups include the examples of the above-mentioned $R_2$ and $R_3$.

When $R_{181}$ represents a substituent, this group may further include a substituent. Examples of the substituent include the substituents of the above-mentioned alkyl group represented by $R_2$ and $R_3$ in the General Formula (1).

At least one of $V_{18}$ and $R_{181}$ contains a fluorine atom. In this case, it is preferable that some or all hydrogen atoms of at least one group of $V_{18}$ and $R_{181}$ (preferably, some or all hydrogen atoms bonded to carbon atoms) are substituted with fluorine atoms. In addition, it is preferable that the above $R_f$ group is contained in at least one of $V_{18}$ and $R_{181}$.

Further, in the case where a plurality of $V_{18}$ is contained in the compound, the fluorine atom is contained in at least one group of the plurality of $V_{18}$ and $R_{181}$.

Specific examples of the compound represented by the General Formula (18) are shown below. However, the present invention is not limited thereto.

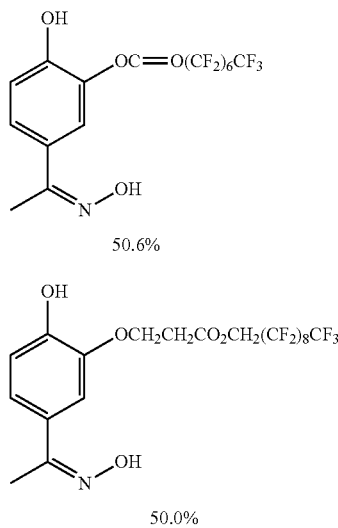

The compound represented by the General Formula (19) is an example of the compound of General Formula (1) in which P and Q are OH respectively, Y is $CR_6$ and nitrogen atom, n is 2, and $R_1$ and $R_6$ are bonded to each other to form a ring.

In the General Formula (19), $V_{19}$ represents a substituent. b is an integer of 0 to 4 (preferably 1 to 2, and more preferably 1). As the substituent represented by $V_{19}$, there can be exemplified the substituents of the above-mentioned alkyl group represented by $R_2$ and $R_3$ in the General Formula (1). When a plurality of $V_{19}$ are present in the General Formula (19), the respective groups may be the same as or different from each other, and may be bonded to each other to form a ring.

$R_{191}$ represents a hydrogen atom or a substituent. As the substituent represented by $R_{191}$, there can be exemplified the substituents of the above-mentioned alkyl group represented by $R_2$ and $R_3$. The substituent is preferably an alkyl group, an alkenyl group, an alkynyl group, or an aryl group. Preferable examples of the respective groups include the examples of the above-mentioned $R_2$ and $R_3$.

When $R_{191}$ represents a substituent, this group may further include a substituent. Examples of the substituent include the substituents of the above-mentioned alkyl group represented by $R_2$ and $R_3$ in the General Formula (1).

At least one of $V_{19}$ and $R_{191}$ contains a fluorine atom. In this case, it is preferable that some or all hydrogen atoms of at least one group of $V_{19}$ and $R_{191}$ (preferably, some or all hydrogen atoms bonded to carbon atoms) are substituted with fluorine atoms. In addition, it is preferable that the above $R_f$ group is contained in at least one of $V_{19}$ and $R_{191}$.

Further, in the case where a plurality of $V_{19}$ is contained in the compound, the fluorine atom is contained in at least one group of the plurality of $V_{19}$ and $R_{191}$.

Specific examples of the compound represented by the General Formula (19) are shown below. However, the present invention is not limited thereto.

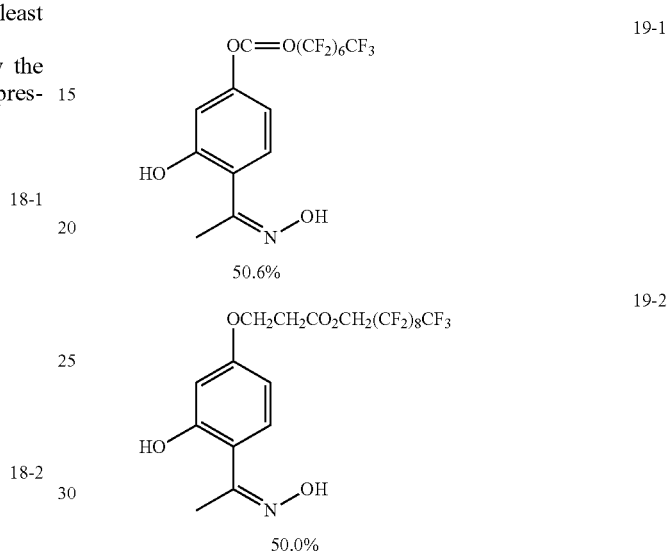

The compound represented by the General Formula (20) is an example of the compound of General Formula (1) in which P and Q are $NR_2R_3$ respectively, and n is 0.

In the General Formula (20), each of $R_{201}$, $R_{202}$, $R_{203}$, and $R_{204}$ independently represents a hydrogen atom or a group which can be substituted with a nitrogen atom. Preferable examples of the group which can be substituted with a nitrogen atom include the groups exemplified in the above-mentioned $R_2$ and $R_3$ of the General Formula (1).

At least one of $R_{201}$, $R_{202}$, $R_{203}$, and $R_{204}$ contains a fluorine atom. In this case, it is preferable that some or all hydrogen atoms of at least one group of $R_{201}$, $R_{202}$, $R_{203}$, and $R_{204}$ (preferably, some or all hydrogen atoms bonded to carbon atoms) are substituted with fluorine atoms. In addition, it is preferable that the above $R_f$ group is contained in at least one of $R_{201}$, $R_{202}$, $R_{203}$, and $R_{204}$.

Specific examples of the compound represented by the General Formula (20) are shown below. However, the present invention is not limited thereto.

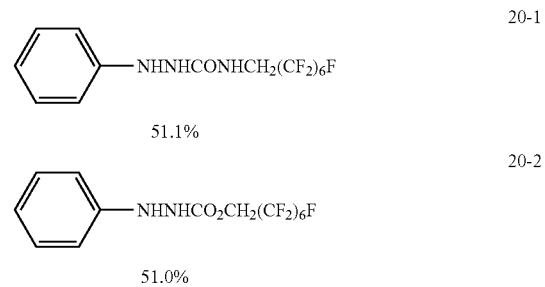

The compound represented by the General Formula (21) is an example of the compound of General Formula (1) in which P is $NR_2R_3$, Q is OH, and n is 0.

In the General Formula (21), each of $R_{211}$ and $R_{212}$ independently represents a hydrogen atom or a group which can be substituted with a nitrogen atom. Preferable examples of the group which can be substituted with a nitrogen atom include the groups exemplified in the above-mentioned $R_2$ and $R_3$ of the General Formula (1).

At least one of $R_{211}$ and $R_{212}$ contains a fluorine atom. In this case, it is preferable that some or all hydrogen atoms of at least one group of $R_{211}$ and $R_{212}$ (preferably, some or all hydrogen atoms bonded to carbon atoms) are substituted with fluorine atoms. In addition, it is preferable that the above $R_f$ group is contained in at least one of $R_{211}$ and $R_{212}$.

Specific examples of the compound represented by the General Formula (21) are shown below. However, the present invention is not limited thereto.

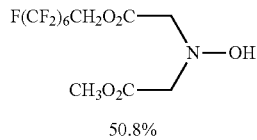

21-1

50.8%

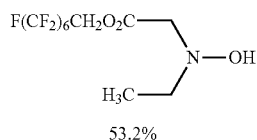

21-2

53.2%

Meanwhile, as the most preferred embodiment of the compound represented by the General Formula (1), there is exemplified a compound represented by General Formula (X1) below.

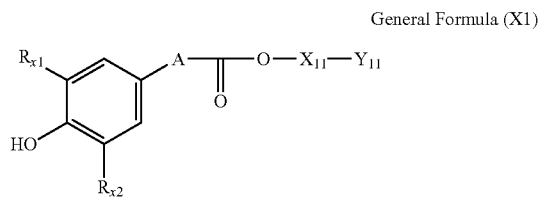

General Formula (X1)

Each of $R_{x1}$ and $R_{x2}$ independently represents an alkyl group having 1 to 12 carbon atoms. In terms of the ion migration inhibiting function being more excellent, the number of carbon atoms in the alkyl group is preferably 1 to 8, more preferably 1 to 6, and particularly preferably 1 to 5. Specific examples of the preferable alkyl group include methyl, ethyl, n-propyl, isopropyl, t-butyl, isobutyl, 2,2-dimethyl propyl, hexyl, cyclohexyl, and the like.

A represents an alkylene group having 1 to 2 carbon atoms. A is preferably —$CH_2$— or —$CH_2CH_2$—, and more preferably —$CH_2CH_2$—.

$X_{11}$ represents an alkylene group having 1 to 3 carbon atoms which may contain a hydroxyl group. $X_{11}$ is preferably —$CH_2$—, —$CH_2CH_2$—, —$CH_2CH(CH_2)$—, —$CH_2CH_2CH_2$—, —$CH_2CH(OH)CH_2$— or —$CH_2CH(CH_2OH)$—, more preferably —$CH_2$—, —$CH_2CH_2$—, —$CH_2CH(OH)CH_2$— or —$CH_2CH_2CH_2$—, and particularly preferably —$CH_2$— or —$CH_2CH_2$—.

$Y_{11}$ represents a linear perfluoroalkyl group having 4 to 12 carbon atoms. Preferred examples of the perfluoroalkyl group include $C_4F_9$—, $C_5F_{11}$—, $C_6F_{13}$—, $C_7F_{15}$—, $C_8F_{17}$—, $C_9F_{19}$—, $C_{10}F_{21}$—, and $C_{12}F_{25}$—. When the number of carbon atoms is within the above range, the ion migration inhibiting function is more excellent.

$R_{x1}$, $R_{x2}$, A, and $X_{11}$ may have the above-mentioned substituent.

(Compound Represented by General Formula (2))

Next, a compound represented by General Formula (2) will be described.

$$R_7-C(=O)-H \qquad \text{General Formula (2)}$$

In the present invention, the compound represented by the General Formula (2) also contains a compound exhibiting reducing properties due to the existence of equilibrium between aldehyde and hemiacetal (aldose or the like), or a compound forming aldehyde due to the isomerization between aldose and ketose by the L'Obree-Doburyuin-Fanedge Ken Stein dislocation reaction (fructose or the like).

In the General Formula (2), $R_7$ represents an alkyl group, an alkenyl group, an alkynyl group, an aryl group, a heterocyclic group, or a group composed of any combination of these.

When $R_7$ represents an alkyl group, an alkenyl group, an alkynyl group, or an aryl group, preferred examples of the respective groups include the examples of the above-mentioned $R_2$ and $R_3$.

When $R_7$ represents a heterocyclic group, $R_7$ is preferably a monovalent group obtained by removing one hydrogen atom from a 5- or 6-membered substituted or unsubstituted aromatic or non-aromatic heterocyclic compound, and more preferably a 5- or 6-membered aromatic or non-aromatic heterocyclic group having 3 to 30 carbon atoms. Preferred examples thereof include 2-furanyl, 2-thienyl, 2-pyrimidinyl, 2-benzothiazolyl, 2-benzoxazolyl, 2-imidazolyl, 4-imidazolyl, triazolyl, benzotriazolyl, thiadiazolyl, pyrrolidinyl, piperidinyl, imidazolidinyl, pyrazolidinyl, morpholinyl, tetrahydrofuranyl, tetrahydrothienyl, and the like.

$R_7$ is more preferably an alkyl group, an alkenyl group, an alkynyl group, or an aryl group, and particularly preferably an alkyl or an aryl group.

The alkyl group, alkenyl group, alkynyl group, aryl group or heterocyclic group represented by $R_7$ may further include a substituent. Examples of the substituent include the substituents of the above-mentioned alkyl group represented by $R_2$ and $R_3$ in the General Formula (1).

Some or all hydrogen atoms in the group represented by $R_7$ (preferably, some or all hydrogen atoms bonded to carbon atoms) are substituted with fluorine atoms. In this case, it is preferable that the above $R_f$ group is contained in $R_7$. Further, it is preferable for the compound represented by the General Formula (2) to contain fluorine atoms in an amount of satisfying the above-mentioned fluorine content.

Moreover, a hydroxyl group or a group represented by —COO— may be contained in the group represented by $R_7$.

Specific examples of the compound represented by the General Formula (2) are shown below. However, the present invention is not limited thereto.

2-1

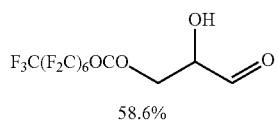

58.6%

2-2

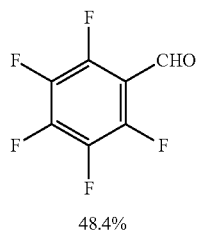

48.4%

2-3

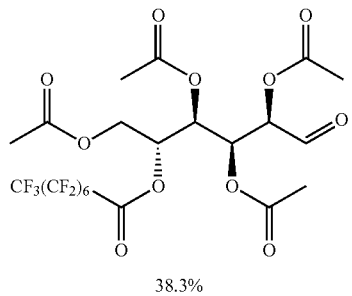

38.3%

(Compound Represented by General Formula (3))

Next, a compound represented by General Formula (3) will be described.

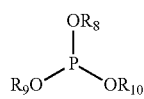

General Formula (3)

In the General Formula (3), each of the groups represented by $R_8$, $R_9$ and $R_{10}$ independently represents an alkyl group, an alkenyl group, an alkynyl group, an aryl group, a heterocyclic group, or a group composed of any combination of these. Preferred examples of the alkyl group, alkenyl group, alkynyl group, aryl group, and heterocyclic group include the examples of the above-mentioned $R_2$ and $R_3$ in the General Formula (1).

Each of the groups represented by $R_8$, $R_9$, and $R_{10}$ may further include a substituent. Examples of the substituent include the substituents of the above-mentioned alkyl group represented by $R_2$ and $R_3$ in the General Formula (1).

Some or all hydrogen atoms of at least one group of $R_8$ to $R_{10}$ (preferably, some or all hydrogen atoms bonded to carbon atoms) are substituted with fluorine atoms. In this case, it is preferable that the above $R_f$ group is contained in at least one group of $R_8$ to $R_{10}$. Further, it is preferable that the compound represented by the General Formula (3) contains fluorine atoms in an amount of satisfying the above-mentioned fluorine content.

Specific examples of the compound represented by the General Formula (3) are shown below. However, the present invention is not limited thereto.

3-1

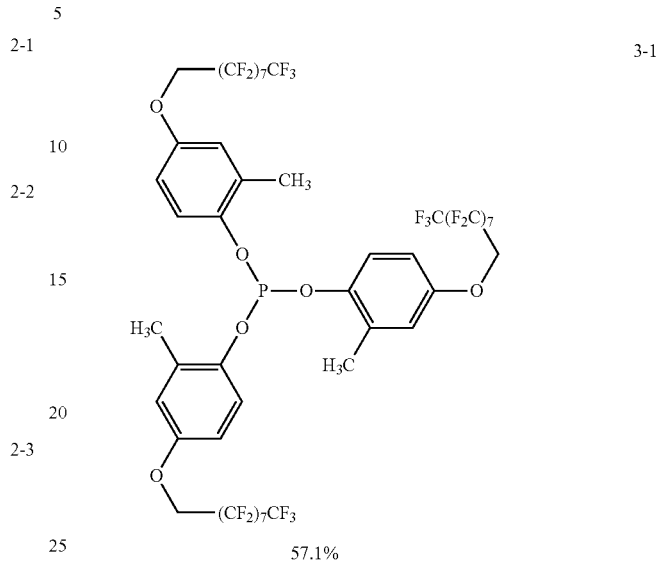

57.1%

(Compound Represented by General Formula (4))

Next, a compound represented by General Formula (4) will be described.

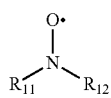

General Formula (4)

In the General Formula (4), each of $R_{11}$ and $R_{12}$ independently represents an alkyl group, an alkenyl group, an alkynyl group, an aryl group, a heterocyclic group, or a group composed of any combination of these. Preferred examples of the alkyl group, alkenyl group, alkynyl group, aryl group, and heterocyclic group include the examples of the above-mentioned $R_2$ and $R_3$ in the General Formula (1).

Each of the groups represented by $R_{11}$ and $R_{12}$ may further include a substituent. Examples of the substituent may include the substituents of the above-mentioned alkyl group represented by $R_2$ and $R_3$ in the General Formula (1).

Some or all hydrogen atoms of at least one group of $R_{11}$ to $R_{12}$ (preferably, some or all hydrogen atoms bonded to carbon atoms) are substituted with fluorine atoms. In this case, it is preferable that the above $R_f$ group is contained in at least one group of $R_{11}$ to $R_{12}$. Further, it is preferable that the compound represented by the General Formula (4) contains fluorine atoms in an amount of satisfying the above-mentioned fluorine content.

Specific examples of the compound represented by the General Formula (4) are shown below. However, the present invention is not limited thereto.

4-1

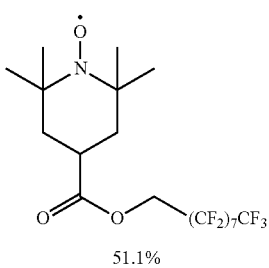

51.1%

4-2

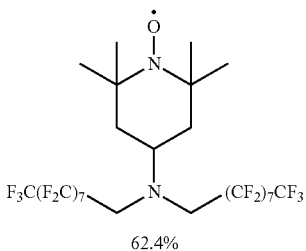

62.4%

(Compound Represented by General Formula (5))

Next, a compound represented by General Formula (5) will be described.

Z—SH  General Formula (5)

In the General Formula (5), Z represents an alkyl group, an alkenyl group, an alkynyl group, an aryl group, a heterocyclic group, or a group composed of any combination of these. Preferred examples of the alkyl group, alkenyl group, alkynyl group, aryl group, and heterocyclic group include the examples of the above-mentioned $R_2$ and $R_3$ in the General Formula (1).

The group represented by Z may further include a substituent. Examples of the substituent include the substituents of the above-mentioned alkyl group represented by $R_2$ and $R_3$ in the General Formula (1).

Some or all hydrogen atoms of the group represented by Z (preferably, some or all hydrogen atoms bonded to carbon atoms) are substituted with fluorine atoms. In this case, it is preferable that the above $R_f$ group is contained in Z. Further, it is preferable that the compound represented by the General Formula (5) contains fluorine atoms in an amount of satisfying the above-mentioned fluorine content.

The compound represented by General Formula (5) is preferably the respective compounds represented by General Formulae (51) to (54).

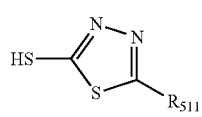

General Formula (51)

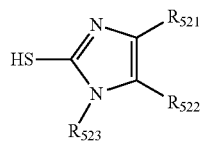

General Formula (52)

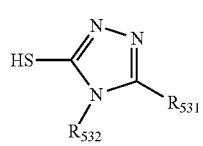

General Formula (53)

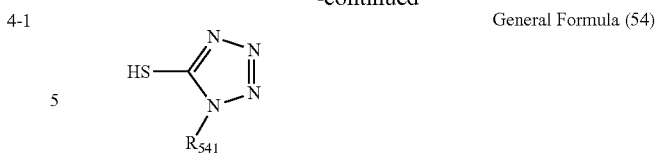

General Formula (54)

In the General Formula (51), $R_{511}$ represents a substituent containing a fluorine atom.

As the substituent, there can be exemplified the substituents of the above-mentioned alkyl group represented by $R_2$ and $R_3$ in the General Formula (1). The group represented by $R_{511}$ may further include a substituent. Examples of the substituent include the substituents of the above-mentioned alkyl group represented by $R_2$ and $R_3$ in the General Formula (1).

In addition, $R_{511}$ contains a fluorine atom. In this case, some or all hydrogen atoms of $R_{511}$ (preferably, some or all hydrogen atoms bonded to carbon atoms) are substituted with fluorine atoms. Further, it is preferable that the above $R_f$ group is contained in $R_{511}$.

Specific examples of the compound represented by the General Formula (51) are shown below. However, the present invention is not limited thereto.

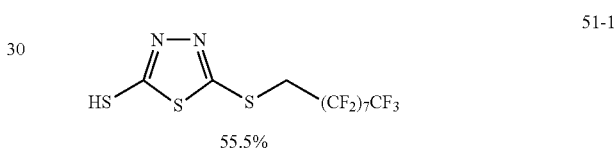

51-1

55.5%

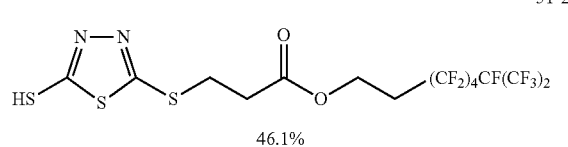

51-2

46.1%

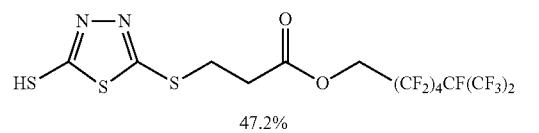

51-3

47.2%

In the General Formula (52), each of $R_{521}$ and $R_{522}$ independently represents a hydrogen atom or a substituent. $R_{523}$ represents a hydrogen atom or a group which can be substituted with a nitrogen atom. Preferable examples of the group which can be substituted with a nitrogen atom include the groups exemplified in the above-mentioned $R_2$ and $R_3$ of the General Formula (1). Further, as the substituent, there can be exemplified the substituents of the above-mentioned alkyl group represented by $R_2$ and $R_3$ in the General Formula (1). $R_{521}$, $R_{522}$, and $R_{523}$ may be the same as or different from each other, and may be bonded to each other to form a ring.

At least one group of $R_{521}$, $R_{522}$, and $R_{523}$ contains a fluorine atom. In this case, it is preferable that some or all hydrogen atoms of at least one group of $R_{521}$, $R_{522}$, and $R_{523}$ (preferably, some or all hydrogen atoms bonded to carbon atoms) are substituted with fluorine atoms. In addition, it is more preferable that the above $R_f$ group is contained in at least one group of $R_{521}$, $R_{522}$, and $R_{523}$.

Specific examples of the compound represented by the General Formula (52) are shown below. However, the present invention is not limited thereto.

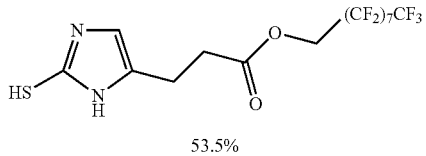

52-1

53.5%

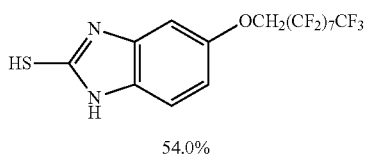

52-2

54.0%

In the General Formula (53), $R_{531}$ represents a hydrogen atom or a substituent. $R_{332}$ represents a hydrogen atom or a group which can be substituted with a nitrogen atom. Preferable examples of the group which can be substituted with a nitrogen atom include the groups exemplified in the above-mentioned $R_2$ and $R_3$ of the General Formula (1). Further, as the substituent, there can be exemplified the substituents of the above-mentioned alkyl group represented by $R_2$ and $R_3$ in the General Formula (1). $R_{531}$ and $R_{332}$ may be the same as or different from each other, and may be bonded to each other to form a ring.

At least one group of $R_{331}$ and $R_{332}$ contains a fluorine atom. In this case, it is preferable that some or all hydrogen atoms of at least one group of $R_{531}$ and $R_{532}$ (preferably, some or all hydrogen atoms bonded to carbon atoms) are substituted with fluorine atoms. In addition, it is more preferable that the above $R_f$ group is contained in at least one group of $R_{531}$ and $R_{532}$.

Specific examples of the compound represented by the General Formula (53) are shown below. However, the present invention is not limited thereto.

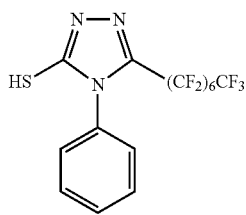

53-1

52.3%

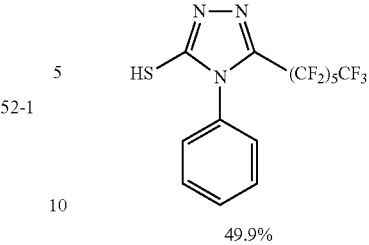

53-2

49.9%

In the General Formula (54), $R_{541}$ represents a fluorine atom-containing group which can be substituted with a nitrogen atom. Preferable examples of the group which can be substituted with a nitrogen atom include the groups exemplified in the above-mentioned $R_2$ and $R_3$ of the General Formula (1).

$R_{541}$ contains a fluorine atom. In this case, it is preferable that some or all hydrogen atoms of $R_{541}$ (preferably, some or all hydrogen atoms bonded to carbon atoms) are substituted with fluorine atoms. In addition, it is more preferable that the above $R_f$ group is contained in $R_{541}$.

Specific examples of the compound represented by the General Formula (54) are shown below. However, the present invention is not limited thereto.

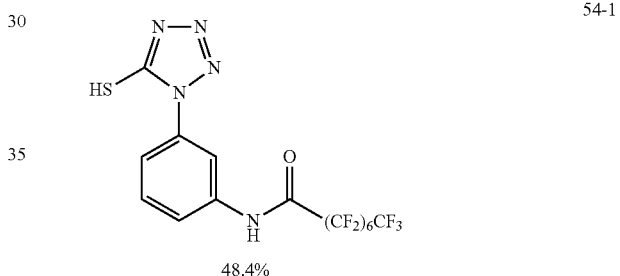

54-1

48.4%

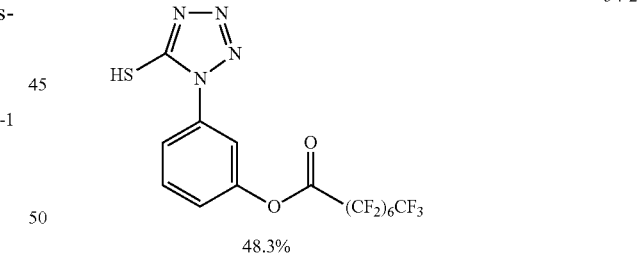

54-2

48.3%

Meanwhile, as the most preferred embodiment of the compound represented by the General Formula (5), there is exemplified a compound represented by the following General Formula (Y).

General Formula (Y)

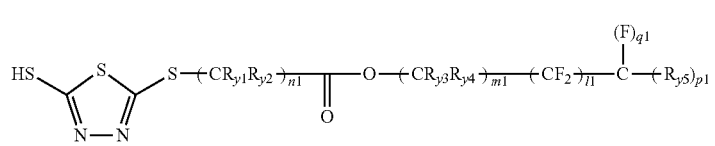

In the General Formula (Y), each of $R_{y1}$ and $R_{y2}$ independently represents a hydrogen atom or an alkyl group. n1 is 1 or 2, and preferably 2. When n1 is 2, a plurality of unit structures represented by $CR_{y1}R_{y2}$ may be the same as or different from each other.

When each of $R_{y1}$ and $R_{y2}$ represents an alkyl group, the alkyl group preferably has 1 to 30 carbon atoms, more preferably 1 to 15 carbon atoms, and particularly preferably 1 to 6 carbon atoms. Preferable examples thereof include methyl, ethyl, n-propyl, isopropyl, t-butyl, n-octyl, eicosyl, chloromethyl, hydroxymethyl, aminoethyl, N,N-dimethyl-aminomethyl, 2-chloroethyl, 2-cyanoethyl, 2-hydroxyethyl, 2-(N,N-dimethylamino)ethyl, 2-ethylhexyl, and the like.

The structure represented by $(CR_{y1}R_{y2})_{n1}$ is preferably —CH$_2$—, —CH$_2$CH$_2$— or —CH$_2$CH(CH$_3$)—, more preferably —CH$_2$CH$_2$— or —CH$_2$CH(CH$_3$)—, and particularly preferably —CH$_2$CH$_2$—.

Each of $R_{y3}$ and $R_{y4}$ independently represents a hydrogen atom or a substituent. m1 is an integer of 1 to 6. When m1 is 2 or more, a plurality of unit structures represented by $CR_{y3}R_{y4}$ may be the same as or different from each other. Further, $R_{y3}$ and $R_{y4}$ may be bonded to each other to form a ring. The definition of the substituent is as described above.

The structure represented by $(CR_{y3}R_{y4})_{m1}$ is preferably —CH$_2$—, —CH$_2$CH$_2$—, —CH$_2$CH(CH$_3$)—, —CH$_2$CH$_2$CH$_2$—, —CH$_2$CH(OH)CH$_2$— or —CH$_2$CH(CH$_2$OH)—, more preferably —CH$_2$—, —CH$_2$CH$_2$—, —CH$_2$CH(OH)CH$_2$— or —CH$_2$CH$_2$CH$_2$—, and particularly preferably —CH$_2$— or —CH$_2$CH$_2$—.

l1 is an integer of 1 to 6. In this case, in terms of compatibility with fluorine-based resin being excellent, l1 is preferably 2 to 5, and more preferably 3 to 4.

q1 represents 0 or 1, p1 represents 2 or 3, and p1+q1 represents 3. In terms of compatibility with fluorine-based resin being excellent, it preferable that q1 is 1, and p1 is 2.

$R_{y5}$ represents a perfluoroalkyl group having 1 to 14 carbon atoms. The perfluoroalkyl group may be either linear or branched.

Examples of the linear or branched perfluoroalkyl group having 1 to 14 carbon atoms include CF$_3$—, C$_2$F$_5$—, C$_3$F$_7$—, C$_4$F$_9$—, C$_5$F$_{11}$—, C$_6$F$_{13}$—, C$_7$F$_{15}$—, C$_8$F$_{17}$—, C$_9$F$_{19}$—, C$_{10}$F$_{21}$—, C$_{12}$F$_{25}$—, C$_{14}$F$_{29}$—, and the like.

(Compound Represented by General Formula (22))

Next, a compound represented by General Formula (22) will be described. Here, it is preferable for the compound represented by formula (22) to contain fluorine atoms in an amount of satisfying the above-mentioned fluorine content.

General Formula (22)

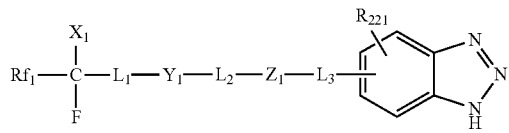

In the General Formula (22), Rf$_1$ represents a fluoroalkyl group having 22 or less carbon atoms, which may have an ethereal oxygen atom and in which at least one of hydrogen atoms is substituted with a fluorine atom, or represents a fluorine atom.

Hydrogen atoms in the perfluoroalkyl group may be substituted with a halogen atom other than the fluorine atom. It is preferable that the halogen atom other than the fluorine atom is a chlorine atom. The ethereal oxygen atom (—O—) may be present between the carbon-carbon bond of the fluoroalkyl group, or may be present at the terminal of the fluoroalkyl group. The structure of the fluoroalkyl group may be a linear structure, a branched structure, a cyclic structure or a partially cyclic structure, and among these, a linear structure is preferable.

Rf$_1$ is preferably a perfluoroalkyl group or a perfluoroalkyl group containing one hydrogen atom, and particularly preferably a perfluoroalkyl group (however, including a perfluoroalkyl group having an ethereal oxygen atom).

As Rf$_1$, a perfluoroalkyl group having 4 to 6 carbon atoms, or a perfluoroalkyl group having 4 to 9 carbon atoms and containing an ethereal oxygen atom is preferable.

Specific examples of Rf$_1$ include —CF$_3$, —CF$_2$CF$_3$, —CF$_2$CHF$_2$, —(CF$_2$)$_2$CF$_3$, —(CF$_2$)$_3$CF$_3$, —(CF$_2$)$_4$CF$_3$, —(CF$_2$)$_5$CF$_3$, —(CF$_2$)$_6$CF$_3$, —(CF$_2$)$_7$CF$_3$, —(CF$_2$)$_8$CF$_3$, —(CF$_2$)$_9$CF$_3$, —(CF$_2$)$_{11}$CF$_3$, —(CF$_2$)$_{15}$CF$_3$, —CF(CF$_3$)O(CF$_2$)$_5$CF$_3$, —CF$_2$O(CF$_2$CF$_2$O)$_p$CF$_3$ (p is an integer of 1 to 8), —CF(CF$_3$)O(CF$_2$CF(CF$_3$)O)$_q$C$_6$F$_{13}$ (q is an integer of 1 to 4), and —CF(CF$_3$)O(CF$_2$CF(CF$_3$)O)$_r$C$_3$F$_7$ (r is an integer of 1 to 5).

Particularly preferably, Rf$_1$ is —(CF$_2$)CF$_3$ or —(CF$_2$)$_5$CF$_3$.

$X_1$ represents a hydrogen atom, a fluorine atom, or a trifluoromethyl group.

Among them, a fluorine atom or trifluoromethyl group is preferable.

$L_1$ represents a single bond or an alkylene group having 1 to 6 carbon atoms. An alkylene group having 1 to 2 carbon atoms is preferable.

$L_2$ represents a single bond or an alkylene group having 1 to 6 carbon atoms which may be substituted with a hydroxyl group or a fluorine atom. Among them, an alkylene group having 1 to 2 carbon atoms is preferable.

$L_3$ represents a single bond or an alkylene group having 1 to 6 carbon atoms. Among them, a single bond or an alkylene group having 1 or 2 carbon atoms is preferable.

Each of $Y_1$ and $Z_1$ independently represents a single bond, —CO$_2$—, —CO—, —OC(=O)O—, —SO$_3$—, —CONR$_{222}$—, —NHCOO—, —O—, —S—, —SO$_2$NR$_{222}$—, or —NR$_{222}$—. $R_{222}$ represents a hydrogen atom or an alkyl group having 1 to 5 carbon atoms.

Among them, —CO$_2$—, —O—, —S—, —SO$_2$NR$_{222}$—, or —CONR$_{222}$— is preferable.

$R_{221}$ represents a hydrogen atom, a linear or branched alkyl group having 1 to 8 carbon atoms, or Rf$_1$—CFX$_1$-L$_1$-Y$_1$-L$_2$-Z$_1$-L$_3$-.

However, when both $Y_1$ and $Z_1$ are other than a single bond, $L_2$ represents an alkylene group having 1 to 6 carbon atoms which may be substituted with a fluorine atom.

Specific examples of the compound represented by the General Formula (22) are shown below. However, the present invention is not limited thereto.

1-1

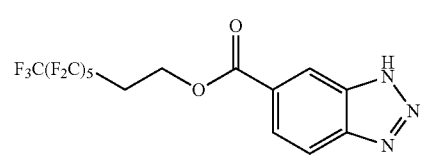

1-2

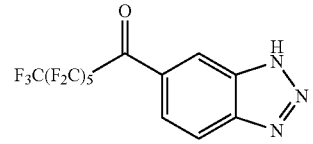

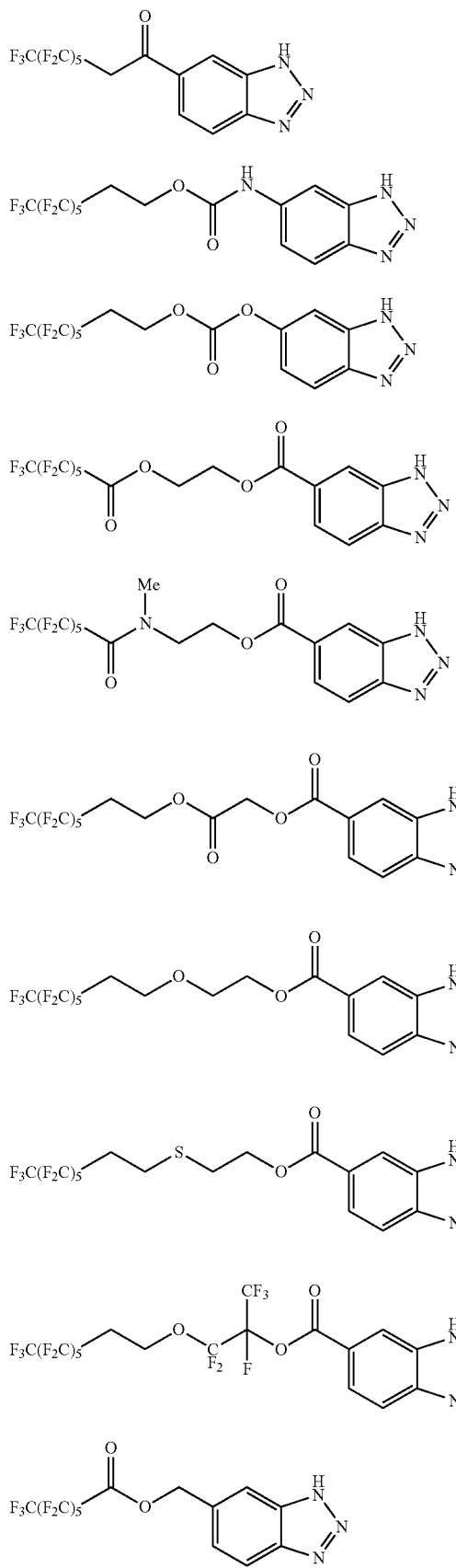

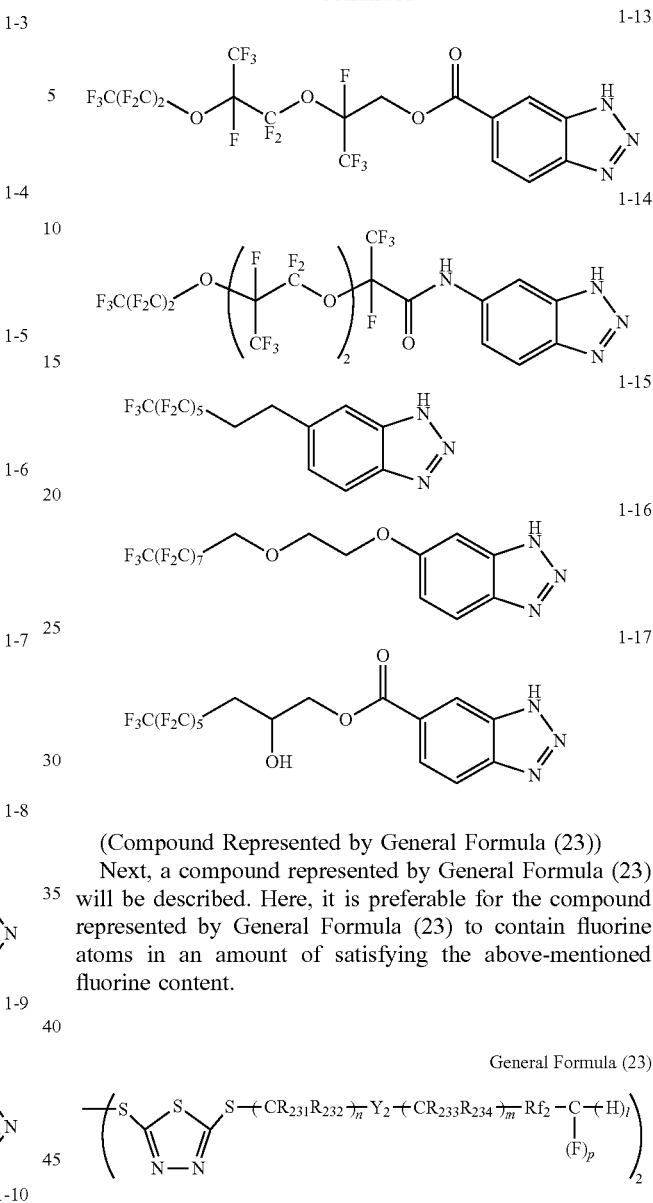

(Compound Represented by General Formula (23))

Next, a compound represented by General Formula (23) will be described. Here, it is preferable for the compound represented by General Formula (23) to contain fluorine atoms in an amount of satisfying the above-mentioned fluorine content.

In the General Formula (23), each of $R_{231}$ and $R_{232}$ independently represents a hydrogen atom or an alkyl group. When each of $R_{231}$ and $R_{232}$ represents an alkyl group, the alkyl group has preferably 1 to 30 carbon atoms, more preferably 1 to 15 carbon atoms, and particularly preferably 1 to 6 carbon atoms. Preferable examples thereof include methyl, ethyl, n-propyl, isopropyl, t-butyl, n-octyl, eicosyl, chloromethyl, hydroxymethyl, aminoethyl, N,N-dimethyl-aminomethyl, 2-chloroethyl, 2-cyanoethyl, 2-hydroxyethyl, 2-(N,N-dimethylamino)ethyl, 2-ethylhexyl, and the like.

The structure represented by $(CR_{231}R_{232})_n$ is preferably —CH$_2$—, —CH$_2$CH$_2$— or —CH$_2$CH(CH$_3$)—, more preferably —CH$_2$CH$_2$— or —CH$_2$CH(CH$_3$)—, and particularly preferably —CH$_2$CH$_2$—.

Each of $R_{233}$ and $R_{234}$ independently represents a hydrogen atom or a substituent. Examples of the substituent may include the substituents of the above-mentioned alkyl group represented by $R_2$ and $R_3$.

The structure represented by $(CR_{233}R_{234})_m$ is preferably —CH$_2$—, —CH$_2$CH$_2$—, —CH$_2$CH(CH$_3$)—, —CH$_2$CH$_2$CH$_2$—, —CH$_2$CH(OH)CH$_2$— or —CH$_2$CH(CH$_2$OH)—, more preferably —CH$_2$—, —CH$_2$CH$_2$—, —CH$_2$CH(OH)CH$_2$— or —CH$_2$CH$_2$CH$_2$—, and particularly preferably —CH$_2$— or —CH$_2$CH$_2$—.

Y$_2$ represents a single bond, —CO—, or —COO—.

When Y$_2$ is a single bond or —CO—, n represents 0, and m represents an integer of 0 to 6. In this case, m is preferably 0 to 4, and more preferably 1 to 2.

When Y$_2$ is —COO—, n represents 1 or 2, and preferably 2. m represents an integer of 1 to 6, preferably 1 to 4, and more preferably 1 to 2.

Rf$_2$ represents a linear or branched perfluoroalkylene group having 1 to 20 carbon atoms, or a linear or branched perfluoroether group having 1 to 20 carbon atoms.

The number of carbon atoms in the perfluoroalkylene group is 1 to 20, but is preferably 2 to 15, and more preferably 3 to 12. Specific examples of the perfluoroalkylene group include —C$_4$F$_8$—, —C$_5$F$_{10}$—, —C$_6$F$_{12}$—, —C$_7$F$_{14}$—, —C$_8$F$_{16}$—, —C$_9$F$_{18}$—, —C$_{10}$F$_{20}$—, —C$_{12}$F$_{24}$—, and the like.

The perfluoroether group means a group in which an ethereal oxygen atom (—O—) is inserted between the carbon atoms at one or more places in the perfluoroalkylene group or is inserted in the bonding end of the perfluoroalkylene group. The number of carbon atoms in the perfluoroalkylene group is 1 to 20, but is preferably 2 to 15, and more preferably 3 to 12. As an specific example of the perfluoroether group, there is exemplified a perfluoroether group represented by the Formula —(C$_g$F$_{2g}$O)$_h$— (here, g is an integer of 1 to 20, h is an integer of 1 or more, and g×h≤20).

p represents an integer of 2 to 3, l represents an integer of 0 to 1, and p+l=3. It is preferable that p is 3 and l is 0.

Specific examples of the compound represented by the General Formula (23) are shown below. However, the present invention is not limited thereto.

1-1
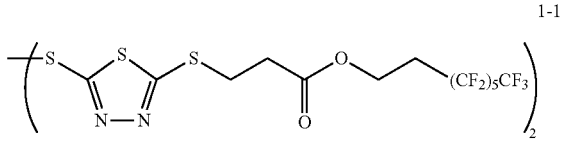

1-2
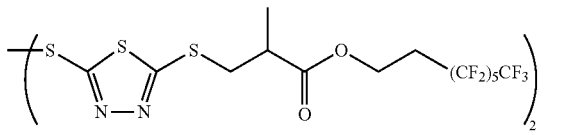

1-3
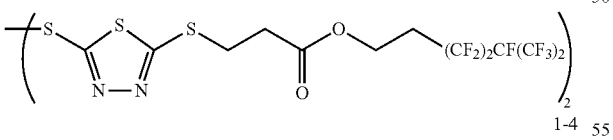

1-4

1-5
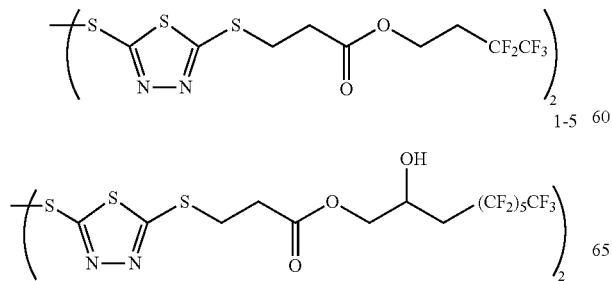

1-6
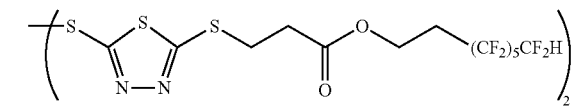

(Compound Having Group Represented by General Formula (24) and Group Represented by General Formula (25))

Next, a compound (hereinafter, referred to as "compound X") having a group represented by General Formula (24) and a group represented by General Formula (25) will be described. Here, it is preferable for the compound X to contain fluorine atoms in an amount of satisfying the above-mentioned fluorine content.

General Formula (24)
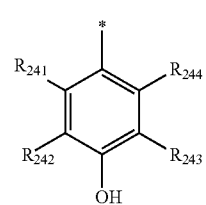

General Formula (25)

*—CFXRf

In the General Formula (24), each of R$_{241}$, R$_{242}$, R$_{243}$, and R$_{244}$ independently represents a hydrogen atom or a substituent. Examples of the substituent include the substituents of the above-mentioned alkyl group represented by R$_2$ and R$_3$. It is preferable for the substituent to be an alkyl group, and it is particularly preferable for each of R$_{242}$ and R$_{243}$ to be an alkyl group (particularly, tert-butyl group). Further, it is preferable for each of R$_{241}$ and R$_{244}$ to be a hydrogen atom.

* represents a binding position.

In the General Formula (25), X represents a hydrogen atom, a fluorine atom, or a trifluoromethyl group. Among them, a fluorine atom or a trifluoromethyl group is preferable.

Rf represents a fluoroalkyl group having 20 or less carbon atoms, which may have an ethereal oxygen atom and in which at least one of hydrogen atoms is substituted with a fluorine atom, or represents a fluorine atom. The definition of Rf is the same as that of the above Rf$_1$, except that the number of carbon atoms is different, and the preferred embodiments of Rf is also the same as those of the above Rf$_1$.

* represents a binding position.

As a preferred embodiment of the compound X, there is exemplified a polymer A having a repeating unit represented by the following General Formula (26) and a repeating unit represented by the following General Formula (27).

General Formula (26)
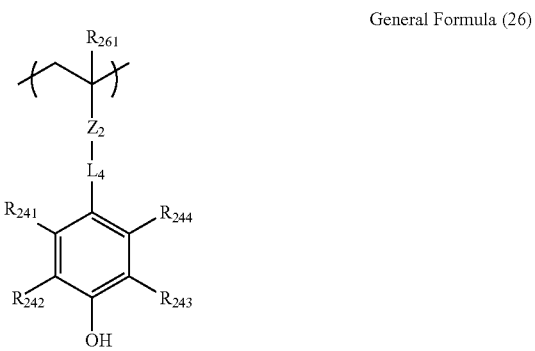

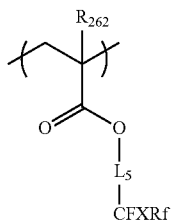

General Formula (27)

In the General Formula (26) and the General Formula (27), each of $R_{261}$ and $R_{262}$ independently represents a hydrogen atom or a substituted or unsubstituted alkyl group having 1 to 4 carbon atoms.

$Z_2$ represents a single bond, an ester group, an amide group, or an ether group.

$L_4$ represents a single bond or a divalent organic group. In a preferred embodiment, the organic group represented by $L_4$ is a linear, branched, or cyclic alkylene group, an aromatic group, or a group composed of the combination thereof. In the group composed of the combination of an alkylene group and an aromatic group, the alkylene group and the aromatic group may be combined through an ether group, an ester group, an amide group, a urethane group, or a urea group. It is preferable that the total number of carbon atoms in $L_4$ is 1 to 15. Here, the total number of carbon atoms means, for example, the total number of carbon atoms contained in a substituted or unsubstituted divalent organic group represented by $L_4$. Specific examples of the divalent organic group include a methylene group, an ethylene group, a propylene group, a butylene group, a phenylene group, substitutes of these with a methoxy group, a hydroxyl group, a chlorine atom, a bromine atom, a fluorine atom, or the like, and a group composed of any combination of these.

$L_5$ represents a single bond or a divalent organic group having 1 to 6 carbon atoms and containing no fluorine. Among them, an alkylene group having 2 to 4 carbon atoms is preferable.

The definitions of $R_{241}$ to $R_{244}$, X and Rf in the General Formula (26) and the General Formula (27) are as described above.

The content of the repeating unit represented by the General Formula (26) in the polymer A is not particularly limited, but, in terms of the effect of the present invention being more excellent, the content is preferably 5 to 90 mol %, and more preferably 10 to 70 mol %, based on the whole repeating unit in the polymer.

The content of the repeating unit represented by the General Formula (27) in the polymer A is not particularly limited, but, in terms of the effect of the present invention being more excellent, the content is preferably 10 to 95 mol %, and more preferably 30 to 90 mol %, based on the whole repeating unit in the polymer.

The weight average molecular weight of the polymer A is not particularly limited, but, in terms of the ion migration inhibiting ability being more excellent, the weight average molecular weight is preferably 3,000 to 500,000, and more preferably 5,000 to 100,000.

As another preferred embodiment of the compound X, it is preferable that a group represented by the following General Formula (28) is further contained in the compound.
* represents a binding position.

$$*\text{-}(R_{281}O)_q R_{282} \qquad \text{General Formula (28)}$$

$R_{281}$ represents an alkylene group having 1 to 4 carbon atoms.

$R_{282}$ represents a hydrogen atom or an alkyl group having 1 to 10 carbon atoms which may have a substituent. $R_{282}$ is preferably a hydrogen atom or an alkyl group having 1 to 4 carbon atoms. Examples of the substituent include the substituents of the above-mentioned alkyl group represented by $R_2$ and $R_3$.

q represents an integer of 1 to 210.

As a preferred embodiment of the group represented by the General Formula (28), there is exemplified a group represented by the following General Formula (28-1).

$$*\text{-}(R_{283}O)_k(R_{284}O)R_{282} \qquad \text{General Formula (28-1)}$$

$R_{283}$ represents an ethylene group. $R_{284}$ represents an alkylene group having 3 or 4 carbon atoms.

k represents an integer of 0 to 100, preferably 1 to 50, and more preferably 2 to 23.

j represents an integer of 0 to 100, preferably 0 to 50, and more preferably 0 to 23.

In addition, k+j satisfies $2 \leq k+j \leq 100$.

As a preferred embodiment of the compound X, there is exemplified a polymer B having a repeating unit represented by the General Formula (26), a repeating unit represented by the General Formula (27), and a repeating unit represented by the following General Formula (29).

Descriptions of the General Formula (26) and the General Formula (27) are as described above.

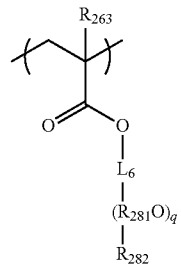

General Formula (29)

In the General Formula (29), $R_{263}$ represent a hydrogen atom or a substituted or unsubstituted alkyl group having 1 to 4 carbon atoms.

$L_6$ represents a single bond or a divalent organic group having 1 to 10 carbon atoms and containing no fluorine. When $L_6$ is the above organic group, the organic group is preferably a linear, branched, cyclic or partially cyclic oxyalkylene group having 1 to 10 carbon atoms. Specific examples of the oxyalkylene group include $CH_2CH_{10}CH_2O$ (here, $C_6H_{10}$ is a cyclohexylene group.), $CH_2O$, $CH_2CH_2O$, $CH_2CH(CH_3)O$, $CH(CH_3)O$, $CH_2CH_2CH_2O$, $C(CH_3)_2O$, $CH(CH_2CH_3)CH_2O$, $CH_2CH_2CH_2CH_2O$, $CH(CH_2CH_3)O$, $CH_2(CH_2)_3CH_2O$, $CH(CH_2CH(CH_3)_2)O$, and the like. Among them, an oxyalkylene group having 2 to 4 carbon atoms is preferable.

The definitions of $R_{281}$, $R_{282}$, and q in the General Formula (29) are as described above.

The content of the repeating unit represented by the General Formula (26) in the polymer B is not particularly limited, but, in terms of the effect of the present invention being more excellent, the content is preferably 5 to 80 mol %, and more preferably 10 to 60 mol %, based on the whole repeating unit in the polymer.

The content of the repeating unit represented by the General Formula (27) in the polymer B is not particularly limited, but, in terms of the effect of the present invention being more excellent, the content is preferably 10 to 85 mol %, and more preferably 20 to 70 mol %, based on the whole repeating unit in the polymer.

The content of the repeating unit represented by the General Formula (29) in the polymer B is not particularly limited, but, in terms of the effect of the present invention being more excellent, the content is preferably 10 to 85 mol %, and more preferably 20 to 70 mol %, based on the whole repeating unit in the polymer.

The weight average molecular weight of the polymer B is not particularly limited, but, in terms of the ion migration inhibiting ability being more excellent, the weight average molecular weight is preferably 3,000 to 500,000, and more preferably 5,000 to 100,000.

Specific examples of the compound X are shown below. However, the present invention is not limited thereto.

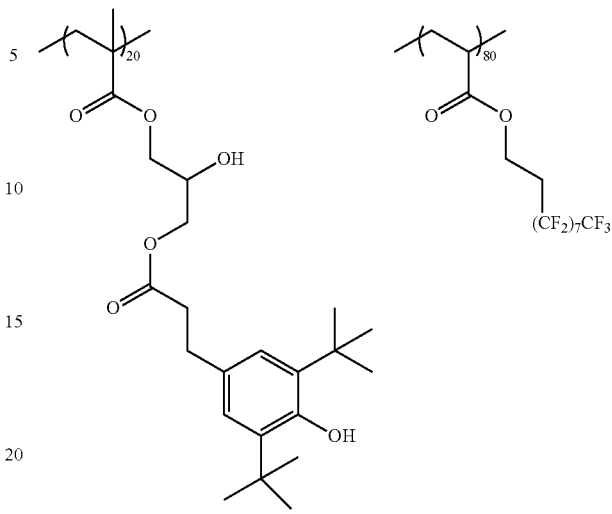

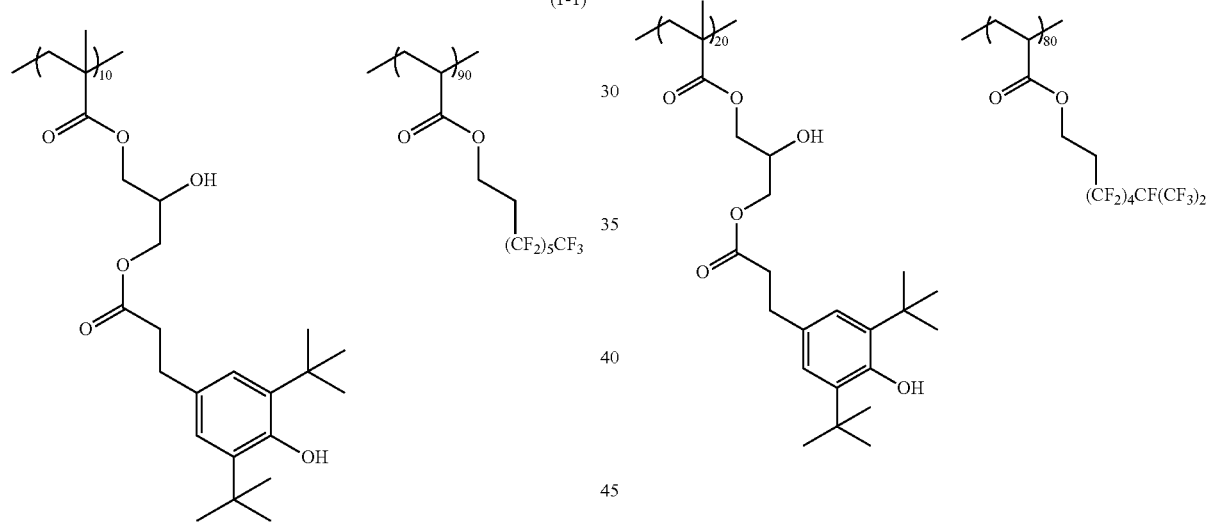

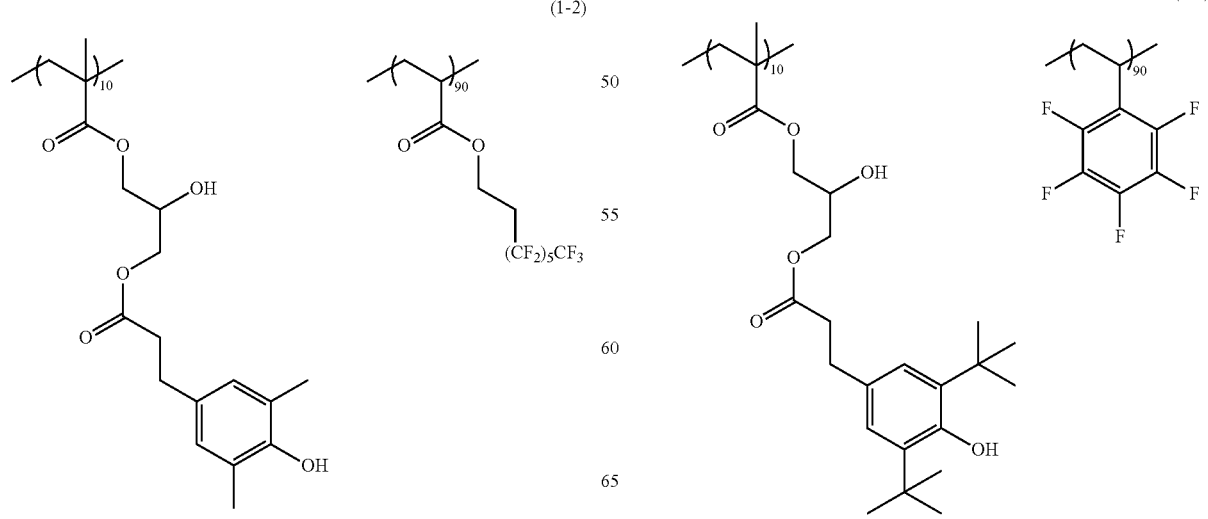

-continued

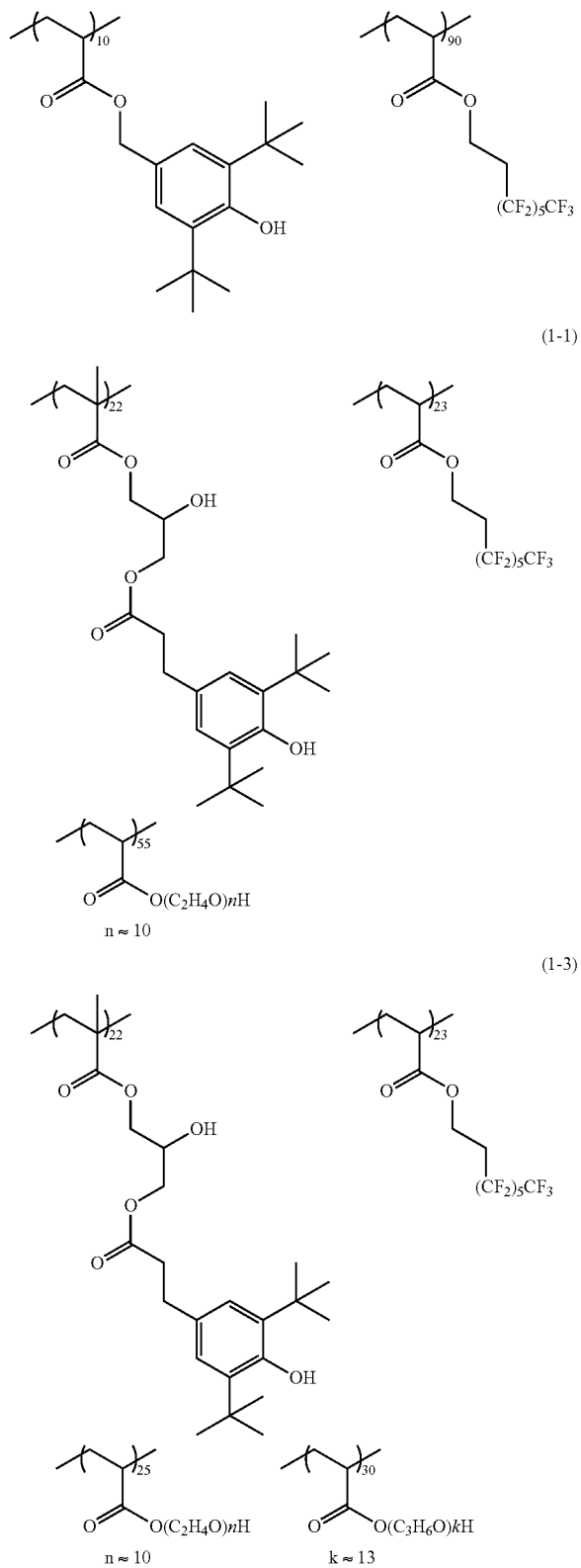

Next, the second embodiment of the wiring board of the present invention will be described in detail with reference to the accompanying drawings.

Figure 2:
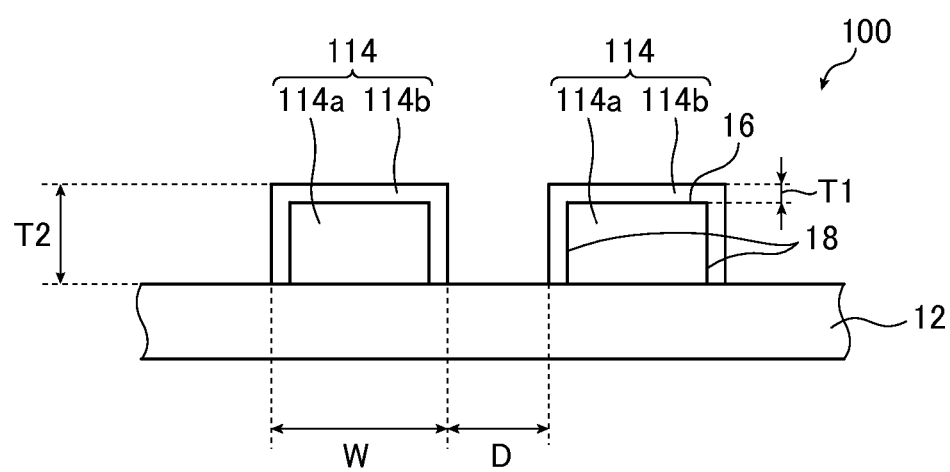
FIG. 2 is a schematic cross-sectional view showing a second embodiment of the wiring board of the present invention.

FIG. 2 is a schematic cross-sectional view showing the second embodiment of the wiring board of the present invention. The wiring board 100 includes an insulating substrate 12 and two wiring layers 114 disposed on the insulating substrate 12. Each of the wiring layers 114 has a first thin wire-shaped metal layer 114a and a second metal layer 114b.

The wiring board 100 shown in FIG. 2 has the same configuration as the wiring board 10 shown in FIG. 1, except that the shape of the wiring layer 114 is different. Therefore, the same elements are given the same reference numerals, and descriptions thereof will not be repeated. Hereinafter, the wiring layer 114 will be mainly described.

The wiring layer 114 includes a first thin wire-shaped metal layer 114a and a second metal layer 114b covering the surface, which is not in contact with the insulating substrate 12, of the first metal layer 114a.

The wiring layer 114 corresponds to the wiring layer 14 in the wiring board 10 shown in FIG. 1, and has the same configuration as the wiring layer 14, and thus only the shape thereof is different. In other words, the first metal layer 114a corresponds to the first metal layer 14a in the wiring board 10 shown in FIG. 1, and the second metal layer 114b corresponds to the second metal layer 14b in the wiring board 10 shown in FIG. 1.

More specifically, the preferred embodiment of the kind of the metal constituting the wiring layer 114 is the same as in the above-described first embodiment.

In addition, as in the above-described first embodiment, the thickness T1 of the second metal layer 114b corresponds to 1/10 of the total thickness T2 of the wiring layer 114.

Further, as in the above-described first embodiment, the mass Y of the migration inhibitor contained in the second metal layer 114b is greater than the mass X of the migration inhibitor contained in the first metal layer 114a, and the preferred embodiments thereof are also the same as those in the above-described first embodiment.

Moreover, the preferred range of the mass of the migration inhibitor contained in the entire wiring layer 114 and the preferred range of the mass of the migration inhibitor contained in the second metal layer 114b are the same as those in the above-described first embodiment.

In FIG. 2, the first metal layer 114a is a thin wire-shaped metal layer, and the second metal layer 114b is disposed so as to cover the first metal layer 114a (so as to cover the upper surface 16 and the two side faces 18 of the first metal layer 114a).

In FIG. 2, the wiring layer 114 is a layer of which the vertical section is rectangular, but the shape thereof is not particularly limited, and may be any shape.

In FIG. 2, the two wiring layers 114 are arranged in the form of stripes, but the number and arrangement pattern thereof are not particularly limited.

The width W of the wiring layer 114 is preferably 0.1 μm to 10000 μm, more preferably 0.1 μm to 300 μm, still more preferably 0.1 μm to 100 μm, and particularly preferably 0.2 μm to 50 μm, in terms of high integration of wiring board.

The interval D between the wiring layers 114 is preferably 0.1 μm to 1000 μm, more preferably 0.1 μm to 300 μm, still more preferably 0.1 μm to 100 μm, and particularly preferably 0.2 μm to 50 μm, in terms of high integration of wiring board.

The thickness T2 of the wiring layer 114 is preferably 0.001 μm to 100 μm, more preferably 0.01 μm to 30 μm, and still more preferably 0.01 μm to 20 μm, in terms of high integration of wiring board.

The wiring board of the present invention can be used for various applications and structures, for example, such as a printed circuit board, a panel substrate for plasma display panels, a substrate for solar cell electrodes, a membrane circuit board, and a substrate for touch panel electrodes.

Further, it is preferable for the wiring board of the present invention to be included in electronic equipment. Here, the electronic equipment refers to a touch panel; a membrane switch; equipment in which a touch panel or a membrane switch is installed such as a TV, mobile communication equipment, a personal computer, game equipment, in-vehicle display equipment, net communication equipment, or the like; an LED for lighting and display; an electronic wiring device for solar cell control; a wireless communication device such as RFID; equipment controlled to drive by a semiconductor wiring board or an organic TFT circuit board; or the like.

If necessary, an insulating layer may be further provided on the wiring layer side of the wiring board of the present invention.

Figure 3:
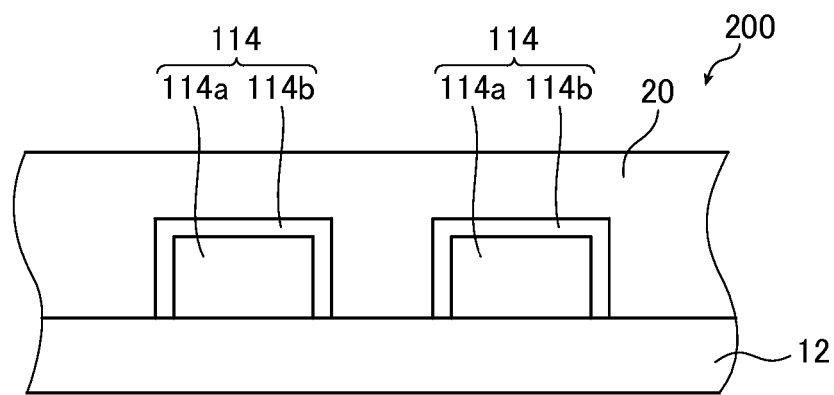
FIG. 3 is a schematic cross-sectional view showing an embodiment of an insulating layer-equipped wiring board of the present invention.

For example, as shown in FIG. 3, if necessary, an insulating layer 20 may be further provided on the wiring layer 114 side of the wiring board 100 so as to cover the wiring layer 114, thereby forming a wiring board with insulating layer 200. If the insulating layer 20 is provided, insulation characteristics between the wiring layers 114 are further improved.

Known insulating materials can be used for the material of the insulating layer 20. Examples thereof include an epoxy resin, an aramid resin, a crystalline polyolefin resin, an amorphous polyolefin resin, a fluorine-containing resin (polytetrafluoroethylene, perfluorinated polyimide, perfluorinated amorphous resin, and the like), a polyimide resin, a polyether sulfone resin, a polyphenylene sulfide resin, a polyether ether ketone resin, an acrylate resin, and the like.

In addition, as the insulating layer 20, so-called optically clear adhesive sheet (OCA) may be used. Commercially available OCA products may be used, and examples thereof include 8171 CL series and 8146 CL series (manufactured by 3M Ltd), and the like.

Further, as the insulating layer 20, so-called solder resist layer may be used. Commercially available solder resist products may be used, and examples thereof include PFR800 and PSR4000 (trade names, manufactured by Taiyo Ink Mfg. Co., Ltd.), SR7200G (manufactured by Hitachi Chemical Co., Ltd.), and the like.

[Method of Manufacturing a Wiring Board (1)]

The method of manufacturing a wiring board is not particularly limited as long as it can form the above-mentioned wiring layer, and known methods can be adopted as the method.

As a preferred embodiment of the method of manufacturing a wiring board, a wiring layer is preferably formed by a method in which a composition (conductive paste) containing metal particles is applied onto an insulating substrate and, if necessary, the applied composition is subjected to heat treatment.

In the above method, it is preferable that the wiring layer is formed by using at least two compositions of a composition containing at least metal particles (corresponding to conductive paste, hereinafter referred to as "composition X") and a composition containing at least a migration inhibitor (hereinafter referred to as "composition Y"). More specifically, it is preferable that the wiring layer is formed by applying the composition X and the composition Y onto the insulating substrate as an independent coating composition (hereinafter, this method is referred to as "first method") or by applying a mixture of the composition X and the composition Y onto the insulating substrate (hereinafter, this method is referred to as "second method").

Here, the method of applying the composition onto the insulating substrate is not particularly limited, and examples thereof include an ink jet method, a screen printing method, a gravure printing method, a gravure offset printing method, an offset printing method, a flexo printing method, and the like.

Hereinafter, the first and second methods using an ink jet method will be described in detail.

Here, for the convenience of the following explanations, the composition Y, used in the first and second methods, contains a migration inhibitor, and the composition X, used in the first and second methods, does not contain a migration inhibitor. Details of the conductive paste used in the method of manufacturing a wiring board will be described later.

The first method is a method of mixing the composition X and the composition Y on an insulating substrate by simultaneously applying these compositions onto the insulating substrate while adjusting the ratio of application amounts of both the composition X and the composition Y. In other words, the first method includes a control step of determining the ratio of the amounts of the composition X and the composition Y to be applied onto the insulating substrate; a formation step of according to the determined ratio, applying the composition X and/or the composition Y onto the insulating substrate to form one layer; and a laminating step of stacking a plurality of layers on the insulating substrate by repeating the formation step to obtain the above-mentioned wiring layer, and in the control step, the ratio of application amounts of both the composition X and the composition Y is determined such that the ratio of the composition X increases and the ratio of the composition Y decreases from the layer close to the insulating substrate toward the layer distant therefrom in the thickness direction of the plurality of layers. By carrying out the method, it is possible to unevenly distribute the migration inhibitor such that a larger amount thereof is distributed in the vicinity of the outer surface of the wiring layer (in the vicinity of the surface distant from the insulating substrate).

An embodiment in which the first method is carried out using the ink jet method will be described with reference to FIGS. 4A to 4C.

First, an insulating substrate 12 is mounted on a stage 22. Generally, the stage 22 has a width greater than that of the insulating substrate 12, and is configured such that it can be freely moved in a horizontal direction by a moving mechanism (not shown). As the moving mechanism, a rack-and-pinion mechanism, a ball screw mechanism, or the like is exemplified. Further, the moving mechanism is controlled by a stage control unit (not shown), and thus it is possible to cause the stage 22 to move to a desired position.

Next, the composition X is ejected onto the insulating substrate 12 from an ink jet head 24 for ejecting the composition X to form a first layer 30 of one layer or a plurality of layers stacked. In the lamination of the composition X, as shown in FIG. 4A, the composition X is ejected from the ink jet head 24 while the stage 22 is moved by the moving mechanism (in FIG. 4A, the stage 22 is moved leftward). At this time, the composition Y is not ejected from an ink jet head 26 for ejecting the composition Y toward the insulating substrate 12.

After the ejection of the composition X, if necessary, a step of heating the first layer 30 may be performed. If the heat treatment is performed, it is possible to remove a solvent and to fuse metal particles. For example, after the ejection of the composition X, it is preferable for the first layer 30 to be held at an environmental temperature of 25° C. to 250° C. (more preferably, 80° C. to 230° C.) for a predetermined period of time.

Next, a mixed layer 32 of the composition X and the composition Y is formed on the first layer 30. In the formation of the mixed layer 32, as shown in FIG. 4B, while moving the stage 22, the composition X is ejected from the ink jet head 24, and the composition Y is simultaneously ejected from the ink jet head 26. At this time, the ejection amount of the composition X and the ejection amount of the composition Y are adjusted to a desired ratio. Here, the ejection amount of each composition from each nozzle is adjusted such that the ejection amount of the composition X is 25% and the ejection amount of the composition Y is 75%.

The ejection amount of each composition from each nozzle may be adjusted by controlling the dot pitch density of the drawing. For example, in a state where the ejection amount of each composition from each nozzle of the ink jet head 24 and the ink jet head 26 is maintained constant, the ratio of the number of the ink jet heads 24 and the number of the ink jet heads 26 is adjusted to 25:75, and thus it is possible to adjust the ratio of the ejection amount of the composition X and the ejection amount of the composition Y.

Figure 4A:
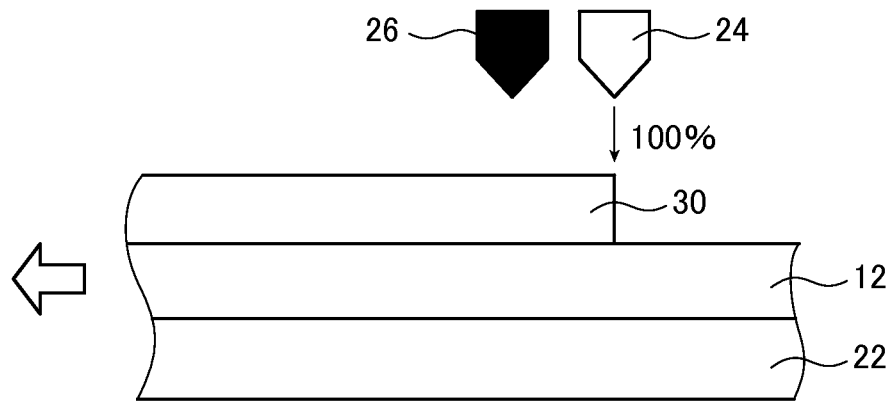
FIGS. 4A to 4C are views for explaining the formation of a wiring layer by a first method.
Figure 4B:
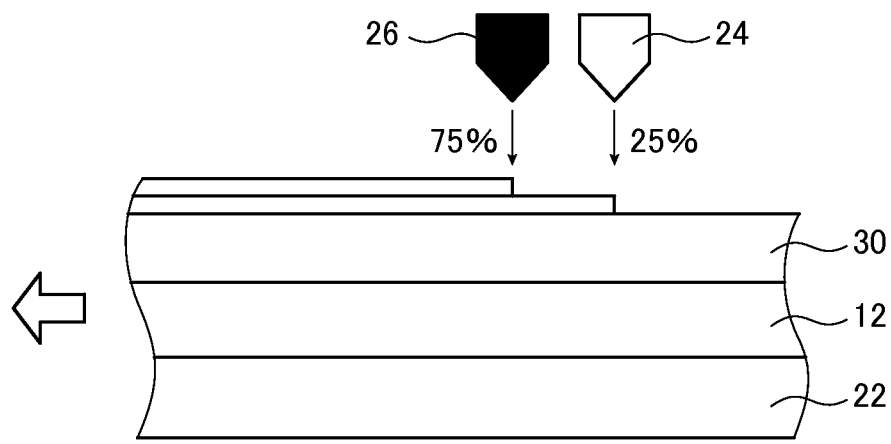
Figure 4C:
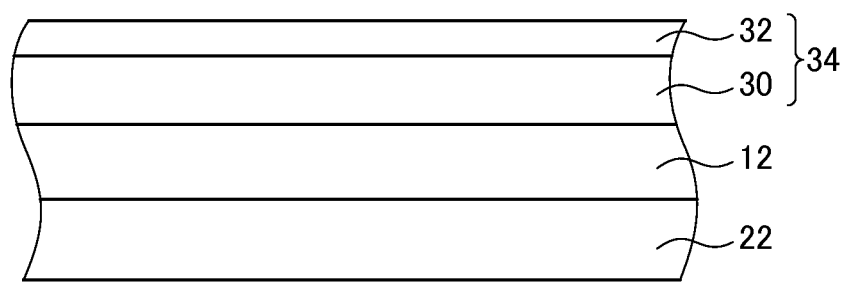

After the ejection of the composition X and the composition Y, as shown in FIG. 4C, the composition X and the composition Y which have been ejected in the respective ejection amounts are dispersed and mixed to form the mixed layer 32 on the first layer 30.

After the ejection of the composition X and the composition Y, if necessary, a step of heating the mixed layer 32 may be performed. If the heat treatment is performed, it is possible to remove a solvent and to fuse metal particles. For example, after the ejection of the composition X and the composition Y, it is preferable for the mixed layer 32 to be held at an environmental temperature of 25° C. to 250° C. (more preferably, 80° C. to 230° C.) for a predetermined period of time.

The mixed layer 32 formed by this method contains the migration inhibitor which has been contained in the composition Y, and, as a result, the migration inhibitor can be unevenly distributed such that a larger amount thereof is distributed in the mixed layer 32 which is the outer part of the wiring layer 34 composed of the first layer 30 and the mixed layer 32. In other words, the concentration of the migration inhibitor in the composition X and the composition Y is adjusted, and the ratio of the application amounts (ejection amounts) of the compositions is adjusted to stack the plurality of layers, thereby forming the above-mentioned wiring layer in which the migration inhibitor is unevenly distributed as described above.

In FIGS. 4A to 4C, the two-layer laminate of the first layer 30 and the mixed layer 32 is described. However, the number of layers stacked is not particularly limited. That is, arbitrary number of layers may be stacked as long as the above-mentioned wiring layer can be formed. Further, the wiring layer 34 may be formed by adjusting the mixing ratio of the composition X and the composition Y such that the first layer 30 and the mixed layer 32 correspond to the above-mentioned first metal layer 14a (or first metal layer 114a) and second metal layer 14b (or second metal layer 114b), respectively.

Moreover, in the above first method, the embodiment in which the migration inhibitor is not contained in the composition X is described, but the migration inhibitor and the metal particles may be contained in both the composition X and the composition Y.

The second method is a method in which a plurality of mixed compositions having different ratios of the composition X and the composition Y is prepared in advance by mixing the compositions X and Y at different ratios, and then the mixed compositions having different ratios are sequentially applied. In other words, the second method includes a preparation step of preparing the plurality of mixed compositions having different mixing ratios of the composition X and the composition Y; a formation step of selecting the mixed compositions in descending order of the ratio of the composition X and applying a selected mixed composition onto the insulating substrate to form one layer; and a laminating step of stacking a plurality of layers on the insulating substrate by repeating the formation step to obtain the above-mentioned wiring layer. By carrying out the method, it is possible to distribute a larger amount of the migration inhibitor in the vicinity of the outer surface of the wiring layer.

An embodiment in which the second method is carried out using the ink jet method will be described with reference to FIGS. 5A and 5B.

First, an insulating substrate 12 is mounted on a stage 22.

Next, the composition X is ejected onto the insulating substrate 12 from an ink jet head 24 for ejecting the composition X to form a first layer 30 of one layer or a plurality of layers stacked. In the lamination of the composition X, as in the first method, the composition X is ejected from the ink jet head 24 while the stage 22 is moved by the moving mechanism (in FIG. 5A, the stage 22 is moved leftward).

After the ejection of the composition X, if necessary, a step of heating the first layer 30 may be performed. If the heat treatment is performed, it is possible to remove a solvent and to fuse metal particles. For example, after the ejection of the composition X, it is preferable for the first layer 30 to be held at an environmental temperature of 25° C. to 250° C. (more preferably, 80° C. to 230° C.) for a predetermined period of time.

Next, a mixed composition (the mixing ratio of the composition X and the composition Y is 25:75) is ejected onto the first layer 30 from an ink jet head 28 to form a mixed layer 32. In the lamination of the mixed composition, as in the first method, the mixed composition is ejected from the ink jet head 28 while the stage 22 is moved by the moving mechanism (in FIG. 5B, the stage 22 is moved leftward).

After the ejection of the mixed composition, if necessary, a step of heating the mixed layer 32 may be performed. If the heat treatment is performed, it is possible to remove a solvent and to fuse metal particles. For example, after the ejection of the mixed composition, it is preferable for the mixed layer 32 to be held at an environmental temperature of 25° C. to 250° C. (more preferably, 80° C. to 230° C.) for a predetermined period of time.

The mixed layer 32 formed by this method contains the migration inhibitor which has been contained in the composition Y, and, as a result, the migration inhibitor can be unevenly distributed such that a larger amount thereof is distributed in the mixed layer 32 which is the outer part of the wiring layer 34 composed of the first layer 30 and the mixed layer 32.

Figure 5A:
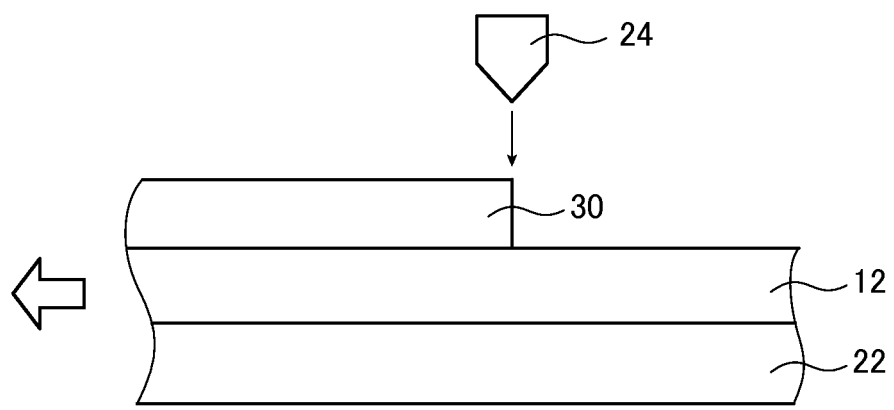
FIGS. 5A and 5B are views for explaining the formation of a wiring layer by a second method.
Figure 5B:
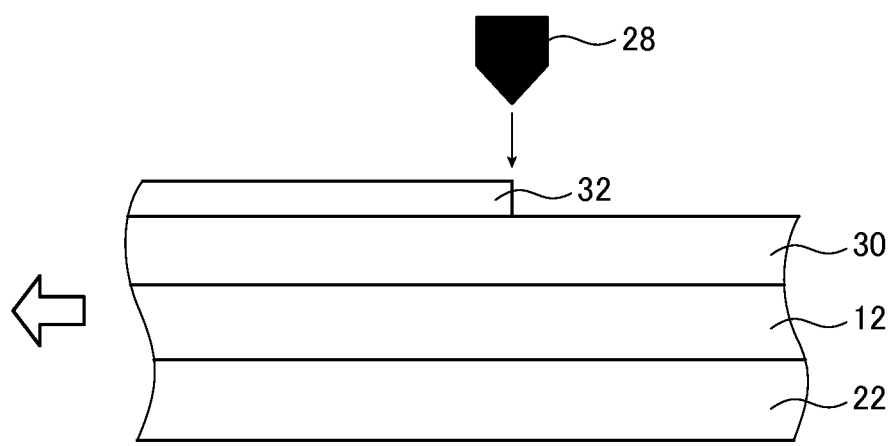

In FIGS. 5A and 5B, the two-layer laminate of the first layer 30 and the mixed layer 32 is described. However, the number of layers stacked is not particularly limited. That is, arbitrary number of layers may be stacked as long as the above-mentioned wiring layer can be formed.

Further, in the above second method, the embodiment in which the migration inhibitor is not contained in the composition X is described, but the migration inhibitor and the metal particles may be contained in both the composition X and the composition Y.

In the second method, the mixed compositions of the composition X and the composition Y are used. However, a wiring board may be manufactured by preparing a plurality of compositions having different mixing ratios of metal particles and a migration inhibitor and performing the same procedure as that in the second method.

With respect to the first method and the second method, the embodiment using the ink jet method is described above in detail. However, the wiring layer may be formed in the same procedure using another method (for example, a screen printing method, a dispenser method, or the like) instead of the ink jet method.

Generally, the composition (hereinafter, referred to as conductive paste) for forming the wiring layer used in the above-mentioned first method and second method contains metal particles. When the composition is applied onto the insulating substrate and subjected to heat treatment as needed, metal particles are fused to each other to form grains, and these grains are also aggregated and fused to each other to form the wiring layer (in other words, the first metal layer and the second metal layer).

The kind of metal constituting the metal particles is not particularly limited, and optimum metals are appropriately selected according to the applications. Among them, from the viewpoint of an application as a wiring circuit such as a printed circuit board and the like, examples thereof include gold, silver, copper, aluminum, nickel, and alloys of these.

The average particle size of the metal particles is not particularly limited. In the conductive paste, two kinds of metal particles, that is, metal particles having a micro-order average particle size (hereinafter, referred to as metal microparticles) and metal particles having a nano-order average particle size (hereinafter, referred to as metal nanoparticles) are mainly used.

The average particle size of the metal microparticles is not particularly limited, but, in terms of conductive characteristics of the wiring layer being more excellent, the average particle size is preferably 0.5 µm to 10 µm, and more preferably 1 µm to 5 µm.

The average particle size of the metal nanoparticles is not particularly limited, but, in terms of conductive characteristics of the wiring layer being more excellent, the average particle size is preferably 5 nm to 100 nm, and more preferably 10 nm to 20 nm.

Here, the average particle size of metal particles is a mean value obtained by observing metal particles using an electron microscope (SEM or TEM), measuring the primary particle sizes (diameters) of 20 metal particles or more and then arithmetically averaging the measured primary particle sizes.

If necessary, the surface of metal particles may be coated with a protecting agent. If the surface of metal particles is coated with the protecting agent, the storage stability of the metal particles in the conductive paste is improved.

The kind of the protecting agent used is not particularly limited. As the protecting agent, a known polymer (for example, a polymer having a functional group with free electrons at the side chain thereof, such as polyvinyl pyrrolidone), a known surfactant, or the like is exemplified.

Especially, regarding metal nanoparticles, it is preferable that the surface thereof is coated with a protecting agent, and it is particularly preferable that a protecting agent having a weight loss of 30% or more when heated to 160° C. in thermogravimetric analysis (TGA) is used. If such a protecting agent is used, at the time of forming a wiring layer by performing heat treatment, the protecting agent hardly remains in the wiring layer, and thus a wiring layer having excellent conductive characteristics can be obtained.

The conductive paste may contain the above-mentioned migration inhibitor.

Further, the conductive paste, if necessary, may contain other components in addition to the metal particles and the migration inhibitor.

For example, the conductive paste may contain a resin binder. If the conductive paste contains the resin binder, adherence between the insulating substrate and the wiring layer is further improved. The kind of the resin binder used is not particularly limited, and examples thereof include epoxy resin, acrylic resin, polyvinylpyrrolidone, and a reaction product of a silane coupling agent.

Moreover, the conductive paste may contain a solvent. The kind of the solvent used is not particularly limited, and water or an organic solvent is exemplified.

Examples of the organic solvent used include alcohol-based solvents (for example, methanol, ethanol, isopropanol, sec-butanol, carbitol, 2-heptanol, octanol, 2-ethylhexanol, α-terpineol, and diethylene glycol monoethyl ether), ketone-based solvents (for example, acetone, methyl ethyl ketone, methyl isobutyl ketone, cyclopentanone, and cyclohexanone), hydrocarbon-based solvents (for example, heptane, octane, and dodecane), aromatic hydrocarbon-based solvents (for example, toluene and xylene), amide-based solvents (for example, formamide, dimethylacetamide, N-methylpyrrolidone, and dimethyl propylene urea), nitrile-based solvents (for example, acetonitrile and propionitrile), ester-based solvents (for example, methyl acetate and ethyl acetate), carbonate-based solvent (for example, dimethyl carbonate and diethyl carbonate), ether-based solvents, halogen-based solvents, and the like. These solvents may be used in a mixture of two or more of these.

[Method of Manufacturing a Wiring Board (2)]

As a preferred embodiment of the method of manufacturing a wiring board other than the above-mentioned method of manufacturing a wiring board (1), there is exemplified a method of forming a wiring layer in which a conductive paste (composition for manufacturing a wiring layer) containing at least one migration inhibitor (hereinafter, collectively referred to as "fluorine atom-containing migration inhibitor") selected from the group consisting of the compounds represented by the General Formulae (1) to (5), the compound represented by the General Formula (22), the compound represented by the General Formula (23), and the compound having the group represented by the General Formula (24) and the group represented by the General Formula (25), and metal particles is used.

The fluorine atom-containing migration inhibitor contains a fluorine atom. Therefore, when the wiring layer is formed using the above conductive paste, since the surface energy of the fluorine atom-containing migration inhibitor is low, the fluorine atom-containing migration inhibitor is moved to the vicinity of the surface of the wiring layer, thereby forming a wiring layer having the above-mentioned specific concentration distribution of migration inhibitor. In other words, only by applying the conductive paste onto the insulating substrate and, if necessary, performing a cure treatment, a desired wiring layer can be formed.

The content of the fluorine atom-containing migration inhibitor in the conductive paste is not particularly limited, but, in terms of balance between the conductive characteristics and ion migration inhibiting function of the wiring layer to be formed, the content is preferably 0.05 mass % to 5 mass %, and more preferably 0.1 mass % to 3 mass %, based on the total mass of metal particles.

Definition of the metal particles contained in the conductive paste is as described above.

In addition, the conductive paste may contain the above-mentioned solvent or resin binder.

The method of applying the conductive paste onto the insulating substrate is not particularly limited, and, for example, the application methods described in the above mentioned method of manufacturing a wiring board (1) can be employed.

In addition, the method of curing a coating film obtained by applying the conductive paste is not particularly limited, and, for example, the heat treatment method described in the above mentioned method of manufacturing a wiring board (1) can be employed.

EXAMPLES

Hereinafter, the present invention will be described in more detail by Examples, but the present invention is not limited thereto.

Synthesis Example 1

Synthesis of Conductive Paste A-1 Containing No Migration Inhibitor 2.04 g (20.0 mmol) of N,N-dimethyl-1,3-diaminopropane (Tokyo Chemical Industry Co., Ltd., special grade), 1.94 g (15.0 mmol) of n-octylamine (Kao Corporation, purity 98%), and 0.93 g (5.0 mmol) of n-dodecylamine (Kanto Chemical Co., Inc., special grade) were mixed to obtain a mixed solution. Then to the mixed solution, 6.08 g (20.0 mmol) of silver oxalate [synthesized from silver nitrate (Kanto Chemical Co., Inc., first grade) and ammonium oxalate monohydrate or oxalic acid dihydrate (Kanto Chemical Co., Inc., special grade)] was added and the resultant was stirred for 3 minutes to prepare an oxalic acid ion-alkylamine-alkyldiamine-silver complex compound. When the complex compound was heated and stirred at 95° C. for 20 to 30 minutes, it was changed to a suspension exhibiting a blue luster due to the completion of a reaction accompanying with foaming of carbon dioxide. 10 mL of methanol (Kanto Chemical Co., Inc., first grade) was added to the suspension, the resultant was centrifugally separated to obtain a precipitate, and then the precipitate was naturally dried to obtain 4.62 g (silver-based yield 97.0%) of a solid of coated silver ultrafine particles exhibiting a blue luster. The solid was dispersed in 6.93 g of mixed solvent (4/1:v/v) of n-butanol (Kanto Chemical Co., Inc., special grade) and n-octane (Kanto Chemical Co., Inc., special grade) to obtain a conductive paste A-1 containing no migration inhibitor.

Synthesis Example 2

Synthesis of Conductive Paste B-1 Containing Migration Inhibitor

To the conductive paste A-1 (11.55 g) obtained in Synthesis Example 1, 0.3 g of DL-α-tocopherol (manufactured by Tokyo Chemical Industry Co., Ltd.) was added and the resultant was stirred to obtain a conductive paste B-1 containing a migration inhibitor.

Synthesis Example 3

Synthesis of Conductive Paste B-2 Containing Migration Inhibitor

To the conductive paste A-1 (11.55 g) obtained in Synthesis Example 1, 0.15 g of IRGANOX 245 (manufactured by BASF Corporation) was added and the resultant was stirred to obtain a conductive paste B-2 containing a migration inhibitor.

Synthesis Example 4

Synthesis of Conductive Paste B-3 Containing Migration Inhibitor

To the conductive paste A-1 (11.55 g) obtained in Synthesis Example 1, 0.15 g of IRGANOX 1135 (manufactured by BASF Corporation) was added and the resultant was stirred to obtain a conductive paste B-3 containing a migration inhibitor.

Synthesis Example 5

Synthesis of Conductive Paste B-4 Containing Migration Inhibitor

To the conductive paste A-1 (11.55 g) obtained in Synthesis Example 1, 0.15 g of 5-mercapto-1-phenyl-1H-tetrazole (manufactured by Tokyo Chemical Industry Co., Ltd.) was added and the resultant was stirred to obtain a conductive paste B-4 containing a migration inhibitor.

<Conductive Paste A-2 Containing No Migration Inhibitor>

As a conductive paste A-2 containing no migration inhibitor, a polymer-type conductive paste LS-450-7H (manufactured by Asahi Chemical Research Laboratory Co., Ltd.) was used.

Synthesis Example 6

Synthesis of Conductive Paste B-5 Containing Migration Inhibitor

To the above-mentioned conductive paste A-2 (10 g), 0.8 g of DL-α-tocopherol (manufactured by Tokyo Chemical Industry Co., Ltd.) was added and the resultant was stirred to obtain a conductive paste B-5 containing a migration inhibitor.

Synthesis Example 7

Synthesis of Conductive Paste B-6 Containing Migration Inhibitor

To the above-mentioned conductive paste A-2 (10 g), 0.4 g of IRGANOX 245 (manufactured by BASF Corporation) was added and the resultant was stirred to obtain a conductive paste B-6 containing a migration inhibitor.

Synthesis Example 8

Synthesis of Conductive Paste B-7 Containing Migration Inhibitor

To the above-mentioned conductive paste A-2 (10 g), 0.4 g of IXEPLAS B1 (manufactured by Toagosei Co., Ltd.)

was added and the resultant was stirred to obtain a conductive paste B-7 containing a migration inhibitor.

<Conductive Paste A-3 Containing No Migration Inhibitor>

As a conductive paste A-3 containing no migration inhibitor, nanopaste NPS (manufactured by Harima Chemicals Group, Inc.) was used.

Synthesis Example 9

Synthesis of Conductive Paste B-8 Containing Migration Inhibitor

To the above-mentioned conductive paste A-3 (10 g), 0.4 g of DL-α-tocopherol (manufactured by Tokyo Chemical Industry Co., Ltd.) was added and the resultant was stirred to obtain a conductive paste B-8 containing a migration inhibitor.

Synthesis Example 10

Compound M-1

3-(3,5-di-tert-butyl-4-hydroxyphenyl)propionic acid (3.5 g, 12.6 mmol), dichloromethane (20 ml), 2,2,3,3,4,4,5,5,6,6,7,7,8,8,9,9,10,10,10-nonadecafluorodecane-1-ol (6.3 g, 12.6 mmol), tetrahydrofuran (10 ml), 1-ethyl-3-(3-dimethylaminopropyl) carbodiimide hydrochloride (2.4 g, 12.6 mmol), and 4-dimethylaminopyridine (0.05 g, 0.4 mmol) were put into a reaction container in this order to obtain a reaction solution.

The reaction solution was stirred at room temperature for 3 hours, 1N hydrochloric acid (50 ml) was added thereto, and then the resultant was extracted with 100 ml of ethyl acetate to obtain an organic layer. The organic layer was washed with saturated saline and dried with magnesium sulfate. After solid content was separated by filtration, the organic layer was concentrated under reduced pressure to obtain white crude crystals. The white crude crystals were recrystallized with methanol to obtain 6.0 g of the compound M-1 (yield 63%).

$^1$H-NMR spectrum of the obtained compound M-1 is as follows.

$^1$H-NMR (solvent: deuterated chloroform, reference: tetramethylsilane)

6.98 (2H, s), 5.09 (1H, s), 4.59 (2H, t), 2.90 (2H, t), 2.71 (2H, t), 1.43 (9H, s)

In the $^1$H-NMR data, the peak of each proton was observed at the characteristic position, and thus the resulting product was identified as the compound M-1.

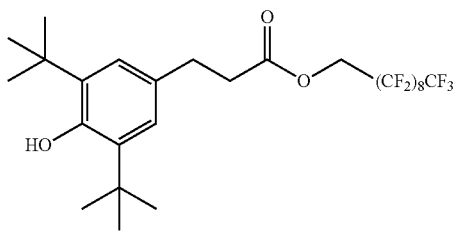

(M-1)

Synthesis Example 11

Compound M-2

1,3,4-thiadiazole-2,5-dithiol (manufactured by Wako Pure Chemical Industries, Ltd.) (4.0 g, 26.6 mmol) and tetrahydrofuran (80 ml) were put into a reaction container, and completely dissolved to obtain a reaction solution. Then, 3,3,4,4,5,5,6,6,7,8,8,8-dodecafluoro-7-(trifluoromethyl)octyl acrylate (12.5 g, 26.6 mmol) was dropped into the reaction solution over 0.5 hours by a dropping funnel. The reaction solution was stirred at 65° C. for 6 hours, cooled to room temperature, and then concentrated under reduced pressure. To the reaction solution, 200 mL of hexane was added, and the resultant was cooled in an ice bath to obtain 16 g of crude crystals. 8 g of the crude crystals were purified by silica gel column chromatography (mobile phase: hexane/ethyl acetate=2/1 to 1/1) to obtain 6 g of the compound M-2 of the present invention (yield 72%).

$^1$H-NMR spectrum of the obtained compound M-2 is as follows.

$^1$H-NMR (solvent: deuterated chloroform, reference: tetramethylsilane)

11.1 (1H, br), 4.44 (2H, t), 3.40 (2H, t), 2.85 (2H, t), 2.49 (2H, t), 2.49 (2H, m)

In the $^1$H-NMR data, the peak of each proton was observed at the characteristic position, and thus the resulting product was identified as the compound M-2.

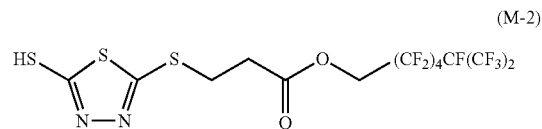

(M-2)

Synthesis Example 12

Compound M-3

1H-benzotriazole-5-carboxylic acid (1.5 g, 9.19 mmol), tetrahydrofuran (27 ml), dimethylformamide (3 ml), 3,3,4,4,5,5,6,6,7,7,8,8,8-tridecafluoro-1-octanol (3.35 g, 9.19 mmol), 1-ethyl-3-(3-dimethylaminopropyl)carbodiimide hydrochloride (1.76 g, 9.19 mmol), and 4-dimethylaminopyridine (0.11 g, 0.91 mmol) were put into a reaction container in this order to obtain a reaction solution. After the reaction solution was stirred at 70° C. for 24 hours, 50 ml of water was added thereto, and then the reaction solution was extracted with 100 ml of ethyl acetate to obtain an organic layer. The organic layer was washed with saturated saline and dried with magnesium sulfate to obtain solids. After solid content was separated by filtration, the organic layer was concentrated under reduced pressure. The resultant was purified by silica gel column chromatography (mobile phase: hexane/ethyl acetate=2/1) to obtain 3.1 g of the compound M-3 (yield 66%).

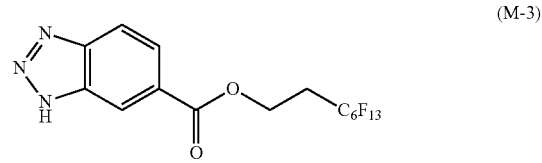

(M-3)

Synthesis Example 13

Compound M-4

Compound M-4A was synthesized according to the following scheme.

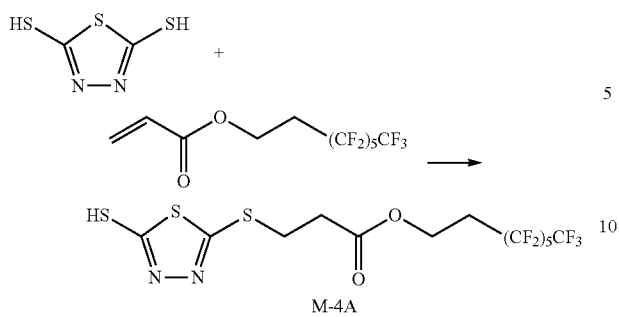

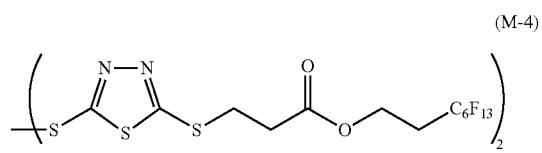

Synthesis Example 14

Compound M-5

1,3,4-thiadiazole-2,5-dithiol (manufactured by Wako Pure Chemical Industries, Ltd.) (4.0 g, 26.6 mmol) and tetrahydrofuran (80 ml) were put into a reaction container, and completely dissolved to obtain a reaction solution. Then, 3,3,4,4,5,5,6,6,7,7,8,8,8-tridecafluorooctyl acrylate (11.13 g, 26.6 mmol) was dropped into the reaction solution over 0.5 hours by a dropping funnel. The reaction solution was stirred at 65° C. for 6 hours, cooled to room temperature, and then concentrated under reduced pressure. To the resulting reaction mixture, 200 mL of hexane was added, and the resultant was cooled in an ice bath to obtain 15 g of crude crystals. 7.5 g of the crude crystals were purified by silica gel column chromatography (mobile phase: hexane/ethyl acetate=2/1 to 1/1) to obtain 6 g of the compound M-4A (yield 79%).

Next, compound M-4 was synthesized using the obtained compound M-4A according to the following scheme.

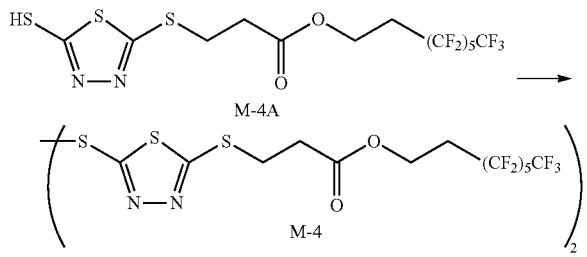

The compound M-4A (3.0 g, 5.28 mmol) and ethyl acetate (20 ml) were put into a reaction container, and completely dissolved to obtain a reaction solution. To the reaction solution, sodium iodide (79.1 mg, 0.528 mmol) and 30% hydrogen peroxide (22.11 mmol, 2.39 g) were added in this order, and the reaction solution was stirred at room temperature for 1 hour to precipitate crystals. The crystals precipitated were washed with 100 ml of water to obtain crude crystals, and 2.7 g of the crude crystals were purified by silica gel column chromatography (mobile phase: hexane/ethyl acetate=2/1 to 1/1) to obtain 2.4 g of the compound M-4 (yield 80%).

$^1$H-NMR spectrum of the obtained compound M-4 of the present invention is as follows.

$^1$H-NMR (solvent: deuterated chloroform, reference: tetramethylsilane): 4.43 (2H, t), 3.60 (2H, t), 2.95 (2H, t), 2.49 (2H, m)

In the $^1$H-NMR data, the peak of each proton was observed at the characteristic position, and thus the resulting product was identified as the compound M-4.

27.3 g of 4-methyl-2-pentanone (manufactured by Wako Pure Chemical Industries, Ltd.) was put into a 300 ml three-neck flask, and heated to 80° C. under a nitrogen stream. Then, a solution of 37.6 g of 3,3,4,4,5,5,6,6,7,7,8,8-tridecafluoro-octyl acrylate, 1.42 g of glycidyl methacrylate (manufactured by Tokyo Chemical Industry Co., Ltd.), 0.92 g of V-601 (manufactured by Wako Pure Chemical Industries, Ltd.), and 63.8 g of 4-methyl-2-pentanone (manufactured by Wako Pure Chemical Industries, Ltd.) was dropped thereinto over 4 hours. After the completion of the dropping, the resultant was stirred for 2 hours, heated to 90° C., and further stirred for 2 hours. To the resulting reaction solution, 3.34 g of 3-(3,5-di-tert-butyl-4-hydroxyphenyl) propionic acid and 0.21 g of dimethyldodecylamine (manufactured by Wako Pure Chemical Industries, Ltd.) were added, and the reaction solution was heated to 120° C. and reacted for 24 hours. After the completion of the reaction, to the resultant, 500 ml of hexane and 500 ml of ethyl acetate were added to obtain an organic layer. The organic layer was washed with 300 ml of a 5% aqueous citric acid solution, and then washed with 300 ml of a 5% aqueous ammonia solution. The organic layer was further washed with 300 ml of a 5% aqueous citric acid solution, and then washed with 300 ml of water. The organic layer was concentrated under reduced pressure, and then reprecipitated with hexane and dried under reduced pressure to obtain 30 g of the compound M-5 (Mw=7,000). Here, a weight average molecular weight refers to a value in terms of polystyrene measured by a gel permeation chromatography (GPC) method. The measurement of the weight average molecular weight of the compound M-5 by the GPC method was performed by dissolving the polymer in tetrahydrofuran, using a high-speed GPC (HLC-8220GPC, manufactured by Tosoh Corporation), using TSKgel SuperHZ4000 (manufactured by Tosoh Corporation, 4.6 mmI.D.×15 cm) as a column, and using THF (tetrahydrofuran) as an eluent.

The compound M-5 corresponds to the compound having the group represented by the General Formula (24) and the group represented by the General Formula (25).

Synthesis Example 15

Compound M-6

14.3 g of 1-methoxy-2-propanol (manufactured by Wako Pure Chemical Industries, Ltd.) was put into a 300 ml three-neck flask, and heated to 80° C. under a nitrogen stream. Then, a solution of 4.81 g of 3,3,4,4,5,5,6,6,7,7,8,8-tridecafluoro-octyl acrylate, 1.56 g of glycidyl methacrylate (manufactured by Tokyo Chemical Industry Co., Ltd.), 14.09 g of Blemmer AE-400 (manufactured by NOF Corporation), 0.46 g of V-601 (manufactured by Wako Pure Chemical Industries, Ltd.), and 33.4 g of 1-methoxy-2-propanol (manufactured by Wako Pure Chemical Industries, Ltd.) was dropped thereinto over 4 hours to obtain a reaction solution. After the completion of the dropping, the resultant was stirred for 2 hours, heated to 90° C., and further stirred for 2 hours. To the resulting reaction solution, 3.67 g of 3-(3,5-di-tert-butyl-4-hydroxyphenyl)propionic acid and 0.23 g of dimethyldodecylamine (manufactured by Wako Pure Chemical Industries, Ltd.) were added, and the reaction solution was heated to 120° C. and reacted for 24 hours. After the completion of the reaction, the reaction solution was concentrated under reduced pressure and diluted with 200 g of water. The reaction solution was filtrated by a filter, and then heated to 60° C. to separate and extract a polymer solution, thereby obtaining 45 g of a 35 wt % aqueous solution of the compound M-6 (Mw=8,000).

Here, a weight average molecular weight refers to a value in terms of polystyrene measured by a gel permeation chromatography (GPC) method. The measurement of the weight average molecular weight of the compound M-6 by the GPC method was performed by dissolving the polymer in tetrahydrofuran, using a high-speed GPC (HLC-8220GPC, manufactured by Tosoh Corporation), using TSKgel SuperHZ4000 (manufactured by Tosoh Corporation, 4.6 mmI.D.×15 cm) as a column, and using THF (tetrahydrofuran) as an eluent.

The compound M-6 corresponds to the compound having the group represented by the General Formula (24), the group represented by the General Formula (25), and the group represented by the General Formula (28).

Synthesis Example 16

Synthesis of Conductive Paste B-9 Containing Migration Inhibitor

To the conductive paste A-1 (11.55 g) obtained in Synthesis Example 1, the compound M-1 (0.12 g) obtained in Synthesis Example 10 was added and the resultant was stirred to obtain a conductive paste B-9 containing a migration inhibitor.

Synthesis Example 17

Synthesis of Conductive Paste B-10 Containing Migration Inhibitor

To the conductive paste A-1 (11.55 g) obtained in Synthesis Example 1, the compound M-2 (0.12 g) obtained in Synthesis Example 11 was added and the resultant was stirred to obtain a conductive paste B-10 containing a migration inhibitor.

Synthesis Example 18

Synthesis of Conductive Paste B-11 Containing Migration Inhibitor

To the conductive paste A-1 (11.55 g) obtained in Synthesis Example 1, the compound M-3 (0.12 g) obtained in Synthesis Example 12 was added and the resultant was stirred to obtain a conductive paste B-11 containing a migration inhibitor.

Synthesis Example 19

Synthesis of Conductive Paste B-12 Containing Migration Inhibitor

To the conductive paste A-1 (11.55 g) obtained in Synthesis Example 1, the compound M-4 (0.12 g) obtained in Synthesis Example 13 was added and the resultant was stirred to obtain a conductive paste B-12 containing a migration inhibitor.

Synthesis Example 20

Synthesis of Conductive Paste B-13 Containing Migration Inhibitor

To the conductive paste A-1 (11.55 g) obtained in Synthesis Example 1, the compound M-5 (polymer type) (0.12 g) obtained in Synthesis Example 14 was added and the resultant was stirred to obtain a conductive paste B-13 containing a migration inhibitor.

Synthesis Example 21

Synthesis of Conductive Paste B-14 Containing Migration Inhibitor

To Flow metal SW-1020 (conductive paste A-4 (11.55 g), manufactured by Bando Chemical Industries, Ltd.), the compound M-6 (polymer type) (0.12 g) obtained in Synthesis Example 15 was added and the resultant was stirred to obtain a conductive paste B-14 containing a migration inhibitor.

Synthesis Example 22

Synthesis of Conductive Paste B-15 Containing Migration Inhibitor

To the above-mentioned conductive paste A-2 (10 g), the compound M-1 (0.12 g) obtained in Synthesis Example 10 was added and the resultant was stirred to obtain a conductive paste B-15 containing a migration inhibitor.

Synthesis Example 23

Synthesis of Conductive Paste B-16 Containing Migration Inhibitor

To the above-mentioned conductive paste A-2 (10 g), the compound M-3 (0.12 g) obtained in Synthesis Example 12 was added and the resultant was stirred to obtain a conductive paste B-16 containing a migration inhibitor.

Examples 1 to 4 and Comparative Examples 1 to 2

Wiring Formation by Ink Jet

A drawing was performed by ejecting the conductive paste A containing no migration inhibitor onto a glass substrate in the shape of a comb of L/S=75/75 μm using a material printer DMP-2831 (manufactured by FUJIFILM Dimatix Co., Ltd.) under the conditions of an ejection rate of 10 pL and an ejection interval of 50 μm, and this drawing was performed by forming the paste into three layers. Next, a drawing was further performed by ejecting the conductive paste B containing a migration inhibitor at the same position in the same pattern, and the drawing was performed by forming the paste into a single layer. Thereafter, the resultant was subjected to baking in an oven at 230° C. for 1 hour to prepare a test wiring board.

As the conductive paste A and the conductive paste B in the respective Examples and Comparative Examples, the conductive pastes described in Table 1 below were respectively used. Further, this method is denoted by "IJ" in the "wiring forming method" column of Table 1.

Example 5

Wiring Formation by Ink Jet 2

A drawing was performed by ejecting the conductive paste A-1 containing no migration inhibitor onto a glass substrate in the shape of a comb of L/S=75/75 μm using a material printer DMP-2831 (manufactured by FUJIFILM Dimatix Co., Ltd.) under the conditions of an ejection rate of 10 pL and an ejection interval of 50 μm, and this drawing was performed by forming the paste into three layers. Next, the ejection interval was changed to 100 μm, and then a drawing was further performed by ejecting the conductive paste A-1 onto the layers to form one layer. Then, a drawing was further performed by ejecting the conductive paste B-1 containing a migration inhibitor at the same position under the conditions of the same pattern and an ejection interval of 100 μm. Thereafter, the resultant was subjected to baking in an oven at 230° C. for 1 hour to prepare a test wiring board.

Here, this method is denoted by "IJ2" in the "wiring forming method" column of Table 1.

Examples 6 to 9 and Comparative Examples 3 to 6

Wiring Formation by Screen Printing

The conductive paste A containing no migration inhibitor was printed onto a glass substrate in the shape of a comb of L/S=75/75 μm using a DP-320 type screen printing machine (manufactured by Newlong Seimitsu Kogyo Co., Ltd.) (a 300 mesh screen was used), and the conductive paste B containing a migration inhibitor was printed at the same position in the same pattern (a 500 mesh screen was used). Thereafter, the resultant was subjected to baking in an oven at 230° C. for 1 hour to prepare a test wiring board.

As the conductive paste A and the conductive paste B in the respective Examples and Comparative Examples, the conductive pastes described in Table 1 below were respectively used. Further, this method is denoted by "screen" in the "wiring forming method" column of Table 1.

<Measurement Method of Test Wiring Film Thickness>

The prepared test wiring board was embedded in epoxy resin, and the section of the embedded test wiring board was exposed by means of polishing, and then the exposed section was observed and the thickness of the wiring layer was measured, using S-3000N (SEM, manufactured by Hitachi Ltd.) The results thereof are summarized in Table 1.

Here, in each test wiring board, the region from the exposed surface of the wiring layer to the depth corresponding to 1/10 of the total thickness of the wiring layer was set to the second metal layer, and the residual portion was set to the first metal layer.

<Method of Measuring the Ratio (X/Y) of the Mass X of the Migration Inhibitor Contained in the First Metal Layer to the Mass Y of the Migration Inhibitor Contained in the Second Metal Layer>

The portion in which the migration inhibitor exists was detected using the above-mentioned SEM photograph and INCA PentaFETx3 (EDX, manufactured by Oxford Instruments Inc.) to calculate the ratio (X/Y) of the mass X to the mass Y from the detection intensity and the area ratio in the first metal layer and the second metal layer. The results thereof are summarized in Table 1.

<Conductivity Evaluation Method>

The conductivity evaluation of the obtained test wiring board was performed using the resistivity meter Loresta EP MCP-T360 (manufactured by Mitsubishi Chemical Analytech Co., Ltd.).

In the evaluation method, the measured resistance value of the prepared test wiring board was set to R1, the measured resistance value of the comparative wiring board prepared by only using the conductive paste A containing no migration inhibitor (the portion in which the conductive paste B is used is replaced with the conductive paste A) was set to R2, and the change rate thereof R1/R2 was calculated. The evaluation was performed according to the following criteria. The results thereof are summarized in Table 1. A wiring board of which the rank is C or higher (B and A) is practically usable, and a wiring board of which the rank is B or higher (A) is preferable.

| | |
|---|---|
| $R1/R2 \leq 1.1$ | A |
| $1.1 < R1/R2 \leq 1.25$ | B |
| $1.25 < R1/R2 \leq 2.0$ | C |
| $2.0 < R1/R2$ | D |

Here, in Examples 1 to 5 and Comparative Example 1 in which the conductive paste A-1 was used as the conductive paste A, the evaluation was performed using the comparative wiring board prepared by only using the conductive paste A-1.

In Examples 6 to 8 and Comparative Example 3 in which the conductive paste A-2 was used as the conductive paste A, the evaluation was performed using the comparative wiring board prepared by only using the conductive paste A-2.

In Example 9 and Comparative Example 5 in which the conductive paste A-3 was used as the conductive paste A, the evaluation thereof was performed using the comparative wiring board prepared by only using the conductive paste A-3.

Further, in Comparative Example 2, the evaluation was performed using the comparative wiring board prepared by only using the conductive paste A-1.

In Comparative Example 4, the evaluation was performed using the comparative wiring board prepared by only using the conductive paste A-2.

In Comparative Example 6, the evaluation was performed using the comparative wiring board prepared by only using the conductive paste A-3.

<Insulation Reliability Evaluation Method>

Lifetime measurement was performed using the obtained test wiring board under the conditions of a humidity of 85%, a temperature of 85° C., a pressure of 1.0 atm, and a voltage of 80 V (measuring equipment: EHS-221MD, manufactured by ESPEC Corporation).

In the evaluation method, first, lifetime measurement was performed under the above conditions by using an insulation reliability test board prepared by attaching high transparent adhesive transfer tape 8146-2 (manufactured by 3M Corporation) onto the test wiring board and attaching a glass substrate to the opposite side of the tape, and by measuring the time T1 until the resistance value between the wiring layers becomes $1 \times 10^5 \Omega$.

Next, another insulation reliability test board was prepared in the above-mentioned manner using the comparative test wiring board (the portion in which the conductive paste B is used is replaced with the conductive paste A) prepared by only using the conductive paste A containing no migration inhibitor. The lifetime measurement was performed under the above conditions by using the above insulation reliability test board including the comparative test wiring board, and by measuring the time T2 until the resistance value between the wiring layers becomes $1\times10^5 \Omega$.

The lifetime improvement effect (T1/T2) was calculated using the time T1 and the time T2 obtained. The evaluation was performed according to the following criteria. The results thereof are summarized in Table 1. A wiring board of which the rank is C or higher (B and A) is practically usable, and a wiring board of which the rank is B or higher (A) is preferable.

$T1/T2 \geq 5$    A $5 > T1/T2 \geq 2$    B $2 > T1/T2 > 1$    C $1 \leq T1/T2$    D Here, in Examples 1 to 5 and Comparative Example 1 in which the conductive paste A-1 was used as the conductive paste A, the evaluation was performed using the comparative wiring board prepared by only using the conductive paste A-1.

In Examples 6 to 8 and Comparative Example 3 in which the conductive paste A-2 was used as the conductive paste A, the evaluation was performed using the comparative wiring board prepared by only using the conductive paste A-2.

In Example 9 and Comparative Example 5 in which the conductive paste A-3 was used as the conductive paste A, the evaluation was performed using the comparative wiring board prepared by only using the conductive paste A-3.

Further, in Comparative Example 2, the evaluation was performed using the comparative wiring board prepared by only using the conductive paste A-1.

In Comparative Example 4, the evaluation was performed using the comparative wiring board prepared by only using the conductive paste A-2.

In Comparative Example 6, the evaluation was performed using the comparative wiring board prepared by only using the conductive paste A-3.

As shown in Table 1 above, in Examples 1 to 9 in which the mass Y of the migration inhibitor contained in the second metal layer is greater than the mass X of the migration inhibitor contained in the first metal layer, conductivity was excellent and ion migration inhibiting ability was also excellent. Further, from the comparison between Examples 1 to 9, it was found that, when X/Y was less than 0.30, there was no C in the conductivity evaluation and the insulation reliability evaluation, and thus the balance of the conductivity and the insulation reliability was more excellent.

In contrast, in Comparative Examples 1, 3, and 5 in which the migration inhibitor is not used, although the conductivity was excellent, the insulation reliability was deteriorated.

Further, in Comparative Examples 2, 4, and 6 in which the mass Y of the migration inhibitor contained in the second metal layer is less than the mass X of the migration inhibitor contained in the first metal layer, although the insulation reliability was excellent, the conductivity was deteriorated.

Examples 10 to 15 and Comparative Examples 7 to 8

Wiring Formation by Ink Jet

The conductive paste A or B was ejected onto a glass substrate in the shape of a comb of L/S=75/75 μm using a material printer DMP-2831 (manufactured by FUJIFILM Dimatix Co., Ltd.) under the conditions of an ejection rate of 10 pL and an ejection interval of 50 μm, and this drawing was performed by forming the paste into two layers. Thereafter, the resultant was subjected to baking in an oven at 230° C. for 1 hour to prepare a test wiring board.

As the conductive paste A and the conductive paste B in the respective Examples and Comparative Examples, the conductive pastes described in Table 2 below were respectively used. Further, this method is denoted by "IJ3" in the "wiring forming method" column of Table 2.

Examples 16 and 17 and Comparative Example 9

Wiring Formation by Screen Printing

The conductive paste A or B was printed onto a glass substrate in the shape of a comb of L/S=75/75 μm using a

TABLE 1

|  | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|
| Conductive paste A | A-1 | A-1 | A-1 | A-1 | A-1 | A-2 | A-2 | A-2 | A-3 |
| Conductive paste B | B-1 | B-2 | B-3 | B-4 | B-1 | B-5 | B-6 | B-7 | B-8 |
| Wiring formation method | IJ | IJ | IJ | IJ | IJ2 | screen | screen | screen | screen |
| Total thickness of wiring layer (μm) | 2.6 | 2.4 | 2.4 | 2.2 | 2.6 | 7.6 | 7.2 | 7.2 | 5.8 |
| Mass X/mass Y | 0.19 | 0.16 | 0.16 | 0.14 | 0.11 | 0.23 | 0.25 | 0.26 | 0.30 |
| Conductivity evaluation | B | B | B | B | A | A | A | A | C |
| Insulation reliability evaluation | A | A | A | B | A | A | B | B | A |

|  | Comp. Ex. 1 | Comp. Ex. 2 | Comp. Ex. 3 | Comp. Ex. 4 | Comp. Ex. 5 | Comp. Ex. 6 |
|---|---|---|---|---|---|---|
| Conductive paste A | A-1 | B-1 | A-2 | B-5 | A-3 | B-8 |
| Conductive paste B | A-1 | B-1 | A-2 | B-5 | A-3 | B-8 |
| Wiring formation method | IJ | IJ | screen | screen | screen | screen |
| Total thickness of wiring layer (μm) | 2.5 | 2.8 | 7.3 | 7.6 | 5.7 | 6.1 |
| Mass X/mass Y | — | 9 | — | 9 | — | 9 |
| Conductivity evaluation | A | D | A | D | A | D |
| Insulation reliability evaluation | D | A | D | A | D | A |

DP-320 type screen printing machine (manufactured by Newlong Seimitsu Kogyo Co., Ltd.) (a 300 mesh screen was used). Thereafter, the resultant was subjected to baking in an oven at 230° C. for 1 hour to prepare a test wiring board.

As the conductive paste A and the conductive paste B in the respective Examples and Comparative Examples, the conductive pastes described in Table 2 below were respectively used. Further, this method is denoted by "screen 2" in the "wiring forming method" column of Table 2.

The above-mentioned conductivity evaluation method and insulation reliability evaluation method were performed on the test wiring boards obtained in Examples 10 to 17 and Comparative Example 7 to 9.

As the comparative wiring boards used in the conductivity evaluation method and the insulation reliability evaluation method, in Examples 10 to 14, comparative wiring boards prepared in the same procedure as in IJ3 using the conductive paste A-1 were used.

In Example 15, comparative wiring board prepared in the same procedure as in IJ3 using the conductive paste A-4 was used.

In Examples 16 and 17, comparative wiring boards prepared in the same procedure as in screen 2 using the conductive paste A-2 were used.

TABLE 2

|  | Ex. 10 | Ex. 11 | Ex. 12 | Ex. 13 | Ex. 14 | Ex. 15 | Ex. 16 | Ex. 17 |
|---|---|---|---|---|---|---|---|---|
| Conductive paste A | — | — | — | — | — | — | — | — |
| Conductive paste B | B-9 | B-10 | B-11 | B-12 | B-13 | B-14 | B-15 | B-16 |
| Wiring formation method | IJ3 | IJ3 | IJ3 | IJ3 | IJ3 | IJ3 | Screen 2 | Screen 2 |
| Total thickness of wiring layer (μm) | 1.6 | 1.7 | 1.6 | 1.6 | 2.1 | 1.7 | 4.1 | 4.0 |
| Mass X/mass Y | 0.07 | 0.08 | 0.05 | 0.07 | 0.03 | 0.04 | 0.04 | 0.03 |
| Conductivity evaluation | B | B | B | B | B | B | A | A |
| Insulation reliability evaluation | A | A | A | A | A | A | A | A |

|  | Comp. Ex. 7 | Comp. Ex. 8 | Comp. Ex. 9 |
|---|---|---|---|
| Conductive paste A | A-1 | A-4 | A-2 |
| Conductive paste B | — | — | — |
| Wiring formation method | IJ3 | IJ3 | Screen 2 |
| Total thickness of wiring layer (μm) | 1.6 | 1.6 | 4.0 |
| Mass X/mass Y | — | — | — |
| Conductivity evaluation | A | A | A |
| Insulation reliability evaluation | D | D | D |

As shown in Table 2 above, in Examples 10 to 17 in which a fluorine atom-containing migration inhibitor is used, it was found that the fluorine atom-containing migration inhibitor was unevenly distributed and a large amount thereof was distributed on the surface side of the wiring layer, and that the wiring layer was excellent in both conductivity and ion migration inhibiting ability.

In contrast, as shown in Comparative Examples 7 to 9, when the fluorine atom-containing migration inhibitor was not contained in the wiring layer, although the conductivity was excellent, the insulation reliability was deteriorated.

What is claimed is:

1. A wiring board, comprising:
   an insulating substrate; and
   a wiring layer disposed on the insulating substrate,
   wherein the wiring layer including a second metal layer which is a region from the exposed surface of the wiring layer to a depth position corresponding to 1/10 of the total thickness of the wiring layer and a first metal layer which is a region other than the second metal layer,
   the wiring layer contains a migration inhibitor which contains at least one selected from the group consisting of compounds represented by General Formulae (1A) to (3A), compounds represented by General Formulae (6A) and (7A), a bismuth compound, a zirconium compound, a magnesium compound, an antimony oxide, compounds represented by General Formulae (1) to (5), a compound represented by General Formula (22), a compound represented by General Formula (23), and a compound having a group represented by General Formula (24) and a group represented by General Formula (25):

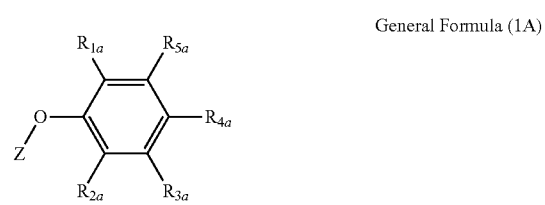

General Formula (1A)

-continued

General Formula (2A)

General Formula (3A)

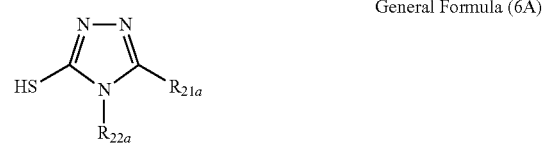

General Formula (6A)

-continued

General Formula (7A)

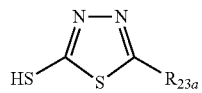

(in the General Formula (1A), each of $R_{1a}$ to $R_{5a}$ independently represents a hydrogen atom, a hydroxyl group, an aliphatic hydrocarbon group which may have an oxygen atom, an aromatic hydrocarbon group which may have an oxygen atom, or a group composed of any combination of these, Z represents a hydrogen atom, an acyl group, or a $R_zOC(=O)$ group, Rz represents an aliphatic hydrocarbon group or an aromatic hydrocarbon group, the total number of carbon atoms contained in each group of $R_{1a}$ to $R_{5a}$ is 4 or more, and $R_{1a}$ to $R_{5a}$ may be bonded to each other to form a ring;

in the General Formula (2A), each of $R_{6a}$ to $R_{8a}$ independently represents an aliphatic hydrocarbon group, an aromatic hydrocarbon group, or a group composed of the combination thereof, and the total number of carbon atoms contained in each group of $R_{6a}$ to $R_{8a}$ is 6 or more;

in the General Formula (3A), each of $R_{9a}$ to $R_{12a}$ independently represents an alkyl group which may contain a hetero atom, an aryl group which may contain a hetero atom, or a group composed of the combination thereof, and the total number of carbon atoms contained in each group $R_{9a}$ to $R_{12a}$ is 6 or more;

in the General Formula (6A), each of $R_{21a}$ and $R_{22a}$ independently represents a hydrogen atom or a hydrocarbon group which may contain a hetero atom, at least one of $R_{21a}$ and $R_{22a}$ represents the hydrocarbon group, and the total number of carbon atoms contained in each group of $R_{21a}$ and $R_{22a}$ is 5 or more;

in the General Formula (7A), $R_{23a}$ represents a hydrocarbon group which may contain a hetero atom, and the number of carbon atoms contained in $R_{23a}$ is 5 or more; and

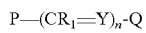 General Formula (1)

(in the General Formula (1), each of P and Q independently represents OH, $NR_2R_3$, or $CHR_4R_5$; each of $R_2$ and $R_3$ independently represents a hydrogen atom or a group which can be substituted with a nitrogen atom; each of $R_4$ and $R_5$ independently represents a hydrogen atom or a substituent; Y represents $CR_6$ or a nitrogen atom; each of $R_1$ and $R_6$ independently represents a hydrogen atom or a substituent; at least two groups of groups represented by $R_1$, $R_2$, $R_3$, $R_4$, $R_5$, and $R_6$ may be bonded to each other to form a ring; n represents a integer of 0 to 5; when n is 0, neither both P and Q are OH, nor both P and Q are $CHR_4R_5$; when n is 2 or more, a plurality of atomic groups represented b $(CR_1=Y)$ may be the same as or different from each other; and at least one group of $R_1$ to $R_6$ contains a fluorine atom),

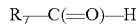 General Formula (2)

(in the General Formula (2), $R_7$ represents an alkyl group, an alkenyl group, an alkynyl group, an aryl group, a heterocyclic group, or a group composed of any combination of these; some or all hydrogen atoms of the group represented by $R_7$ are substituted with fluorine atoms; and the group represented by $R_7$ may contain a hydroxyl group or a group represented by —COO—),

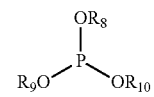 General Formula (3)

in the General Formula (3), each of $R_8$, $R_9$, and $R_{10}$ independently represents an alkyl group, an alkenyl group, an alkynyl group, an aryl group, a heterocyclic group, or a group composed of any combination of these; and some or all hydrogen atoms of at least one group of $R_8$ to $R_{10}$ are substituted with fluorine atoms), General Formula (4)

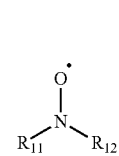

(in the General Formula (4), each of $R_{11}$ and $R_{12}$ independently represents an alkyl group, an alkenyl group, an alkynyl group, an aryl group, a heterocyclic group, or a group composed of any combination of these; and some or all hydrogen atoms of at least one group of $R_{11}$ and $R_{12}$ are substituted with fluorine atoms),

 General Formula (5)

(in the General Formula (5), Z represents an alkyl group, an alkenyl group, an alkynyl group, an aryl group, a heterocyclic group, or a group composed of any combination of these; some or all hydrogen atoms of the group represented by Z are substituted with fluorine atoms; and the group represented by Z may contain a substituent), General Formula (22)

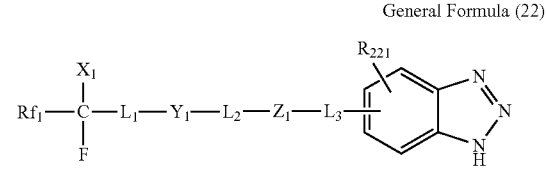

(in the General Formula (22), $Rf_1$ represents a fluoroalkyl group having 22 or less carbon atoms, which may have an ethereal oxygen atom and in which at least one of hydrogen atoms is substituted with a fluorine atom, or represents a fluorine atom; $X_1$ represents a hydrogen atom, a fluorine atom, or a trifluoromethyl group; $L_1$ represents a single bond or an alkylene group having 1 to 6 carbon atoms; $L_2$ represents a single bond or an alkylene group having 1 to 6 carbon atoms which may be substituted with a hydroxyl group or a fluorine atom; $L_3$ represents a single bond or an alkylene group having 1 to 6 carbon atoms; $Y_1$ and $Z_1$ represent a single bond, —$CO_2$—, —CO—, —OC(=O)O—, —$SO_3$—, —$CONR_{222}$—, —NHCOO—, —O—, —S—, —$SO_2NR_{222}$—, or —$NR_{222}$—; $R_{222}$ represents a hydrogen atom or an alkyl group having 1 to 5 carbon atoms; $R_{221}$ represents a hydrogen atom, a linear or branched alkyl group having 1 to 8 carbon atoms, or $Rf_1$-$CFX_1$-$L_1$-$Y_1$-$L_2$-$Z_1$-$L_3$-; and when both $Y_1$ and $Z_1$ are other than a single bond, $L_2$ represents an alkylene group having 1 to 6 carbon atoms which may be substituted with a fluorine atom), General Formula (23)

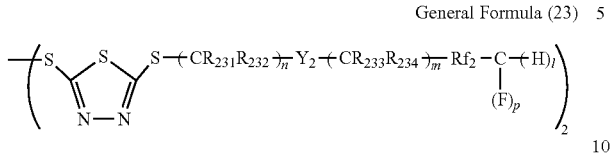

(in the General Formula (23), each of $R_{231}$ and $R_{232}$ independently represents a hydrogen atom or an alkyl group; each of $R_{233}$ and $R_{234}$ independently represents a hydrogen atom or a substituent; $Y_2$ represents a single bond, —CO—, or —COO—; $Rf_2$ represents a linear or branched perfluoroalkylene group having 1 to 20 carbon atoms, or a linear or branched perfluoroether group having 1 to 20 carbon atoms; when $Y_2$ is a single bond or —CO—, n represents 0, and m represents an integer of 0 to 6; when $Y_2$ is —COO—, n represents 1 or 2, and m represents an integer of 1 to 6; p represents an integer of 2 to 3; l represents an integer of 0 to 1; and p+l=3), and General Formula (24)

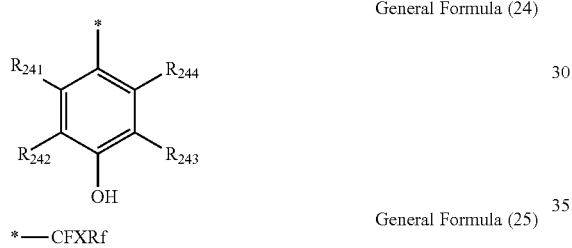

General Formula (25)

*—CFXRf (in the General Formula (24), each of $R_{241}$, $R_{242}$, $R_{243}$, and $R_{244}$ independently represents a hydrogen atom or a substituent; and * represents a bonding position; and in the General Formula (25), X represents a hydrogen atom, a fluorine atom, or a trifluoromethyl group; Rf represents a fluoroalkyl group having 20 or less carbon atoms, which may have an ethereal oxygen atom and in which at least one of hydrogen atoms is substituted with a fluorine atom, or represents a fluorine atom; and * represents a bonding position), and the mass Y of the migration inhibitor contained in the second metal layer is greater than the mass X of the migration inhibitor contained in the first metal layer.

2. The wiring board according to claim 1, wherein the compound represented by the General Formula (1) is at least one selected from the group consisting of compounds represented by General Formulae (6) to (21):

General Formula (6)

General Formula (7)

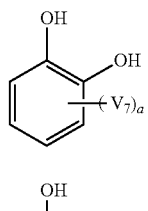

General Formula (8)

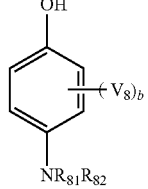

General Formula (9)

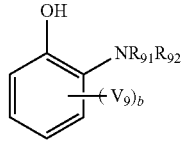

General Formula (10)

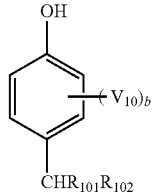

General Formula (11)

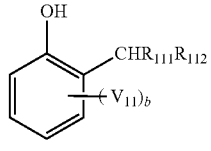

General Formula (12)

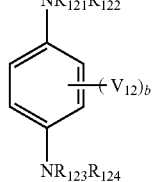

General Formula (13)

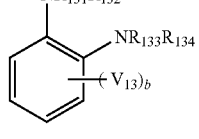

General Formula (14)

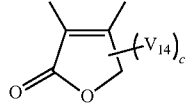

General Formula (15)

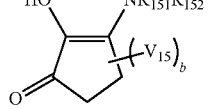

-continued

General Formula (16)

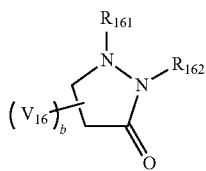

General Formula (17)

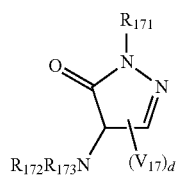

General Formula (18)

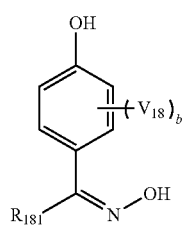

General Formula (19)

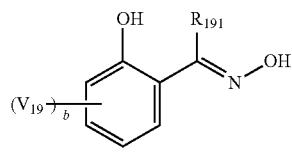

General Formula (20)

$R_{201}R_{202}N—NR_{203}R_{204}$

General Formula (21)

$R_{211}R_{212}N—OH$ (in the General Formula (6), $V_6$ represents a substituent, a represents an integer of 1 to 4, and at least one of $V_6$ contains a fluorine atom;

in the General Formula (7), $V_7$ represents a substituent, a represents an integer of 1 to 4, and at least one of $V_7$ contains a fluorine atom;

in the General Formula (8), $V_8$ represents a substituent, each of $R_{81}$ and $R_{82}$ independently represents a hydrogen atom or a group which can be substituted with a nitrogen atom, b represents an integer of 0 to 4, and at least one of $V_8$, $R_{81}$, and $R_{82}$ contains a fluorine atom;

in the General Formula (9), $V_9$ represents a substituent, each of $R_{91}$ and $R_{92}$ independently represents a hydrogen atom or a group which can be substituted with a nitrogen atom, b represents an integer of 0 to 4, and at least one of $V_9$, $R_{91}$, and $R_{92}$ contains a fluorine atom;

in the General Formula (10), $V_{10}$ represents a substituent, each of $R_{101}$ and $R_{102}$ independently represents a hydrogen atom or a substituent, b represents an integer of 0 to 4, and at least one of $V_{10}$, $R_{101}$, and $R_{102}$ contains a fluorine atom;

in the General Formula (11), $V_{11}$ represents a substituent, each of $R_{111}$ and $R_{112}$ independently represents a hydrogen atom or a substituent, b represents an integer of 0 to 4, and at least one of $V_{11}$, $R_{111}$, and $R_{112}$ contains a fluorine atom;

in the General Formula (12), $V_{12}$ represents a substituent, each of $R_{121}$, $R_{122}$, $R_{123}$, and $R_{124}$ independently represents a hydrogen atom or a group which can be substituted with a nitrogen atom, b represents an integer of 0 to 4, and at least one of $V_{12}$, $R_{121}$, $R_{122}$, $R_{123}$, and $R_{124}$ contains a fluorine atom;

in the General Formula (13), $V_{13}$ represents a substituent, each of $R_{131}$, $R_{132}$, $R_{133}$, and $R_{134}$ independently represents a hydrogen atom or a group which can be substituted with a nitrogen atom, b represents an integer of 0 to 4, and at least one of $V_{13}$, $R_{131}$, $R_{132}$, $R_{133}$, and $R_{134}$ contains a fluorine atom;

in the General Formula (14), $V_{14}$ represents a substituent, c represents an integer of 1 to 2, and at least one of $V_{14}$ contains a fluorine atom;

in the General Formula (15), $V_{15}$ represents a substituent, each of $R_{151}$ and $R_{152}$ independently represents a hydrogen atom or a group which can be substituted with a nitrogen atom, b represents an integer of 0 to 4, and at least one of $V_{15}$, $R_{151}$, and $R_{152}$ contains a fluorine atom;

in the General Formula (16), $V_{16}$ represents a substituent, each of $R_{161}$ and $R_{162}$ independently represents a hydrogen atom or a group which can be substituted with a nitrogen atom, b represents an integer of 0 to 4, and at least one of $V_{16}$, $R_{161}$, and $R_{162}$ contains a fluorine atom;

in the General Formula (17), $V_{17}$ represents a substituent, each of $R_{171}$, $R_{172}$, and $R_{173}$ independently represents a hydrogen atom or a group which can be substituted with a nitrogen atom, d represents an integer of 0 or 1, and at least one of $V_{17}$, $R_{171}$, $R_{172}$, and $R_{173}$ contains a fluorine atom;

in the General Formula (18), $V_{18}$ represents a substituent, $R_{181}$ represents a hydrogen atom or a substituent, b represents an integer of 0 to 4, and at least one of $V_{18}$ and $R_{181}$ contains a fluorine atom;

in the General Formula (19), $V_{19}$ represents a substituent, $R_{191}$ represents a hydrogen atom or a substituent, b represents an integer of 0 to 4, and at least one of $V_{19}$ and $R_{191}$ contains a fluorine atom;

in the General Formula (20), each of $R_{201}$, $R_{202}$, $R_{203}$, and $R_{204}$ independently represents a hydrogen atom or a group which can be substituted with a nitrogen atom, and at least one of $R_{201}$, $R_{202}$, $R_{203}$, and $R_{204}$ contains a fluorine atom; and in the General Formula (21), each of $R_{211}$ and $R_{212}$ independently represents a hydrogen atom or a group which can be substituted with a nitrogen atom, and at least one of $R_{211}$ and $R_{212}$ contains a fluorine atom).

3. The wiring board according to claim 2, wherein the metal in the wiring layer is selected from the group consisting of gold, silver, copper, and aluminum.

4. The wiring board according to claim 2, wherein a first thin wire-shaped metal layer of which side faces are exposed is disposed on the insulating substrate, and a second metal layer is disposed so as to cover a surface of the first thin wire-shaped metal layer, the surface not being in contact with the insulating substrate and including the side faces.

5. A wiring board with insulating layer, comprising:
the wiring board according to claim 2; and
an insulating layer disposed on the wiring layer of the wiring board.

6. The wiring board according to claim 2, wherein the wiring board is used in a printed wiring board.

7. The wiring board according to claim 1, wherein the metal in the wiring layer is selected from the group consisting of gold, silver, copper, and aluminum.

8. The wiring board according to claim 7, wherein a first thin wire-shaped metal layer of which side faces are exposed is disposed on the insulating substrate, and a second metal layer is disposed so as to cover a surface of the first thin wire-shaped metal layer, the surface not being in contact with the insulating substrate and including the side faces.

9. A wiring board with insulating layer, comprising:
the wiring board according to claim 7; and
an insulating layer disposed on the wiring layer of the wiring board.

10. The wiring board according to claim 7, wherein the wiring board is used in a printed wiring board.

11. The wiring board according to claim 1, wherein a first thin wire-shaped metal layer of which side faces are exposed is disposed on the insulating substrate, and a second metal layer is disposed so as to cover a surface of the first thin wire-shaped metal layer, the surface not being in contact with the insulating substrate and including the side faces.

12. A wiring board with insulating layer, comprising:
the wiring board according to claim 11; and
an insulating layer disposed on the wiring layer of the wiring board.

13. The wiring board according to claim 11, wherein the wiring board is used in a printed wiring board.

14. A wiring board with insulating layer, comprising:
the wiring board according to claim 1; and
an insulating layer disposed on the wiring layer of the wiring board.

15. The wiring board according to claim 1, wherein the wiring board is used in a printed wiring board.

* * * * *